US012345060B2

(12) United States Patent
Fugallo, III et al.

(10) Patent No.: US 12,345,060 B2
(45) Date of Patent: Jul. 1, 2025

(54) CONSTRUCTION ANCHOR APPARATUS AND SYSTEM AND METHODOLOGY OF USE

(71) Applicant: Anchor Ring Solutions, LLC, Pen Argyl, PA (US)

(72) Inventors: Joseph A. Fugallo, III, East Meadow, NY (US); John P Marra, Jr., Bangor, PA (US); James R. Walsh, Westport, CT (US); Joseph Fugallo, IV, East Meadow, NY (US)

(73) Assignee: Anchor Ring Solutions, LLC, Pen Argyl, PA (US)

( * ) Notice: Subject to any disclaimer, the term of this patent is extended or adjusted under 35 U.S.C. 154(b) by 834 days.

(21) Appl. No.: 17/314,969

(22) Filed: May 7, 2021

(65) Prior Publication Data

US 2021/0271787 A1   Sep. 2, 2021
US 2022/0180015 A9   Jun. 9, 2022

Related U.S. Application Data

(63) Continuation-in-part of application No. PCT/US2019/060653, filed on Nov. 9, 2019, which is
(Continued)

(51) Int. Cl.
*E04G 21/32* (2006.01)
*G06F 30/13* (2020.01)

(52) U.S. Cl.
CPC .......... *E04G 21/3276* (2013.01); *G06F 30/13* (2020.01)

(58) Field of Classification Search
CPC .................................................. E04G 21/3276
See application file for complete search history.

(56) References Cited

U.S. PATENT DOCUMENTS 2,952,947 A    9/1960  White
3,854,371 A *  12/1974 Lamothe ............... F16B 37/145
                                                  138/96 T
(Continued)

FOREIGN PATENT DOCUMENTS

DE   1759484 A1   9/1971
DE   2022595 A1   11/1971
(Continued)

OTHER PUBLICATIONS

Application No. PCT/US2021/032045 filed May 12, 2021—International Search Report and Written Opinion dated Oct. 1, 2021.
(Continued)

*Primary Examiner* — Joshua K Ihezie
(74) *Attorney, Agent, or Firm* — RowanTree Law Group, PLLC; Joseph W. Schmidt

(57) ABSTRACT

A system, method and apparatus include generating a building model of a building to be constructed at a construction site, identifying within the building model positional locations for installation of one or more anchor apparatuses within structural elements of the building model, transmitting the building model to a portable computing device at the construction site and identifying the location of the portable computing device to a given positional location. At least the generating, identifying, transmitting and identifying steps are implemented via at least one processing device comprising a processor and a memory.

18 Claims, 51 Drawing Sheets

Related U.S. Application Data a continuation-in-part of application No. 16/186,247, filed on Nov. 9, 2018, now Pat. No. 10,689,841.

(60) Provisional application No. 63/055,037, filed on Jul. 22, 2020, provisional application No. 63/023,465, filed on May 12, 2020, provisional application No. 62/841,217, filed on Apr. 30, 2019, provisional application No. 62/794,905, filed on Jan. 21, 2019.

(56) References Cited

U.S. PATENT DOCUMENTS

| | | | |
|---|---|---|---|
| 4,139,023 | A | 2/1979 | Turley |
| 4,739,596 | A | 4/1988 | Cunningham et al. |
| 4,932,818 | A | 6/1990 | Garwood |
| 5,497,592 | A | 3/1996 | Boeshart |
| 5,518,351 | A * | 5/1996 | Peil ................. F16B 35/06 248/62 |
| 5,895,188 | A | 4/1999 | Cheng |
| 6,079,179 | A | 6/2000 | Shoemaker, Jr. |
| 6,250,044 | B1 | 6/2001 | Funk et al. |
| 6,718,710 | B2 | 4/2004 | Platt |
| 7,082,664 | B2 | 8/2006 | Powers et al. |
| 7,124,547 | B2 | 10/2006 | Bravinski |
| 7,621,080 | B2 | 11/2009 | Stanfield |
| 8,011,149 | B2 | 9/2011 | Knudsen |
| RE46,831 | E * | 5/2018 | Francies, III ........ E04G 15/04 |
| 10,036,158 | B2 | 7/2018 | Espinosa |
| 10,384,085 | B1 | 8/2019 | Aleksovski |
| 10,393,159 | B2 | 8/2019 | Frost et al. |
| 2005/0188559 | A1 | 9/2005 | Kastberg |
| 2007/0280786 | A1 | 12/2007 | Booth |
| 2007/0280788 | A1 | 12/2007 | Booth |
| 2011/0107699 | A1 | 5/2011 | Kawai et al. |
| 2013/0067849 | A1* | 3/2013 | Espinosa ............ E04B 1/4121 52/699 |
| 2013/0138606 | A1 | 5/2013 | Kahle |
| 2014/0026515 | A1* | 1/2014 | Espinosa ............ E04B 1/4121 52/700 |
| 2014/0157717 | A1* | 6/2014 | Espinosa ............ E04B 1/4121 52/700 |
| 2015/0284967 | A1* | 10/2015 | Kim .................. E04B 1/4121 52/125.4 |
| 2016/0224927 | A1 | 8/2016 | Pettersson |
| 2017/0096816 | A1 | 4/2017 | Keshet |
| 2017/0101771 | A1 | 4/2017 | Espinosa |
| 2018/0322225 | A1 | 11/2018 | Schwartz |
| 2018/0363291 | A1 | 12/2018 | Espinosa |
| 2019/0285105 | A1 | 9/2019 | Wiley et al. |
| 2020/0040580 | A1 | 2/2020 | Kim et al. |

FOREIGN PATENT DOCUMENTS

| | | |
|---|---|---|
| DE | 4341329 A1 | 6/1995 |
| DE | 19959858 A1 | 6/2001 |
| EP | 2648119 A1 | 10/2013 |
| EP | 2792804 A1 | 10/2014 |
| EP | 19791799.0 | 12/2021 |
| JP | Y-S42-3091 | 2/1942 |
| JP | U-S62-103942 | 7/1987 |
| JP | U-S63-158609 | 10/1988 |
| JP | A-2001-269916 | 10/2001 |
| JP | 2017-31584 A | 2/2017 |
| WO | WO2005/060421 A2 | 7/2005 |
| WO | WO2012/129177 A1 | 9/2012 |
| WO | WO2016/011259 A1 | 1/2016 |
| WO | 2016/148428 A1 | 9/2016 |
| WO | 2017093779 A1 | 6/2017 |
| WO | PCT/US2019/060653 | 3/2020 |

OTHER PUBLICATIONS

Examination Report from India Patent Office Application No/ 202147023269 dated Oct. 1, 2023, 7 pages.
International Search Report and Written Opinion PCT Appln. No. 21/32045 dated Oct. 1, 2021, 5 pages.
Extended European Search Report For EP19883168, dated Sep. 19, 2022, 11 pages.
Israel Examination Report for Israel Patent Application No. 283001, Dated Aug. 7, 2023, 5 Pages.
https://www.youtube.com/watch?v=0h0033sRm78&ab_channel= ClimbTechGear. indicated date of video as Jun. 20, 2016.
Office Action issued in related/counterpart Japanese Patent Application No. 2021-525125 Mailing Date: Nov. 30, 2023; With English translation.

* cited by examiner

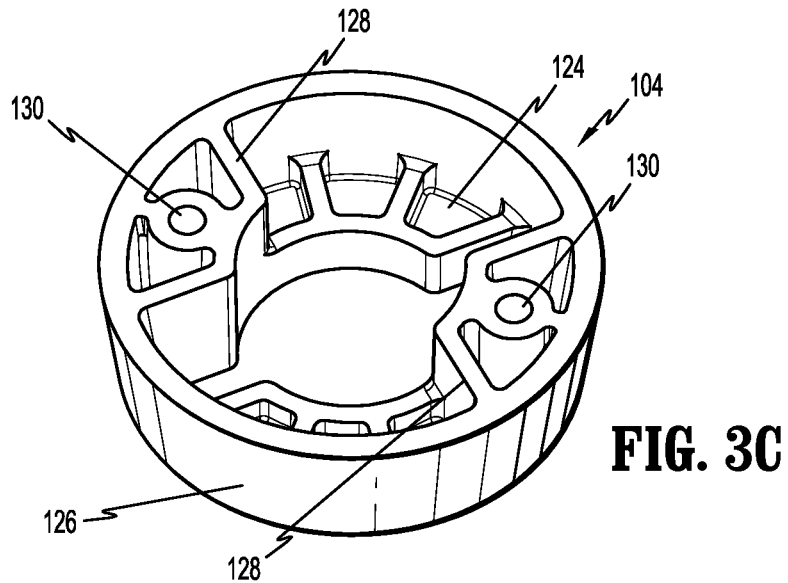
FIG. 3C
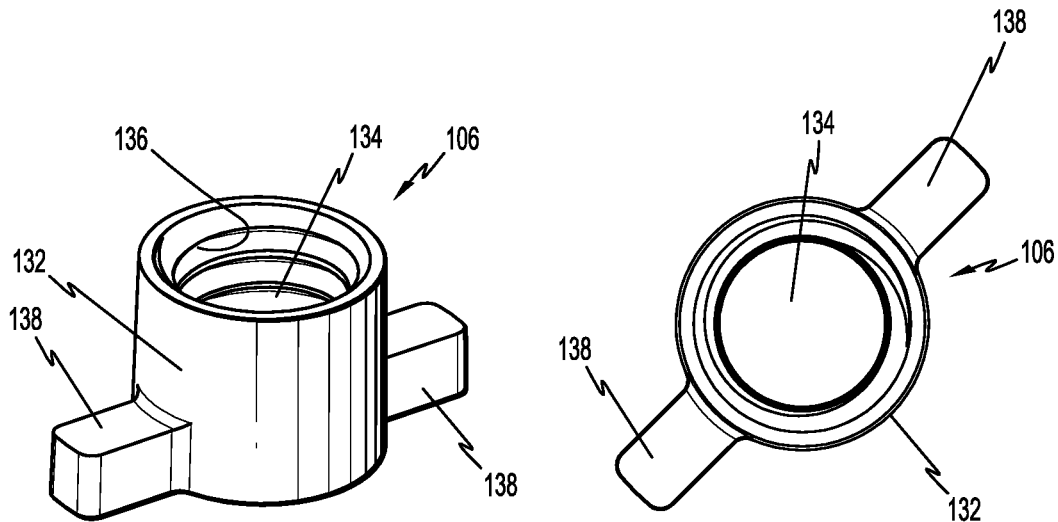
FIG. 4A        FIG. 4B

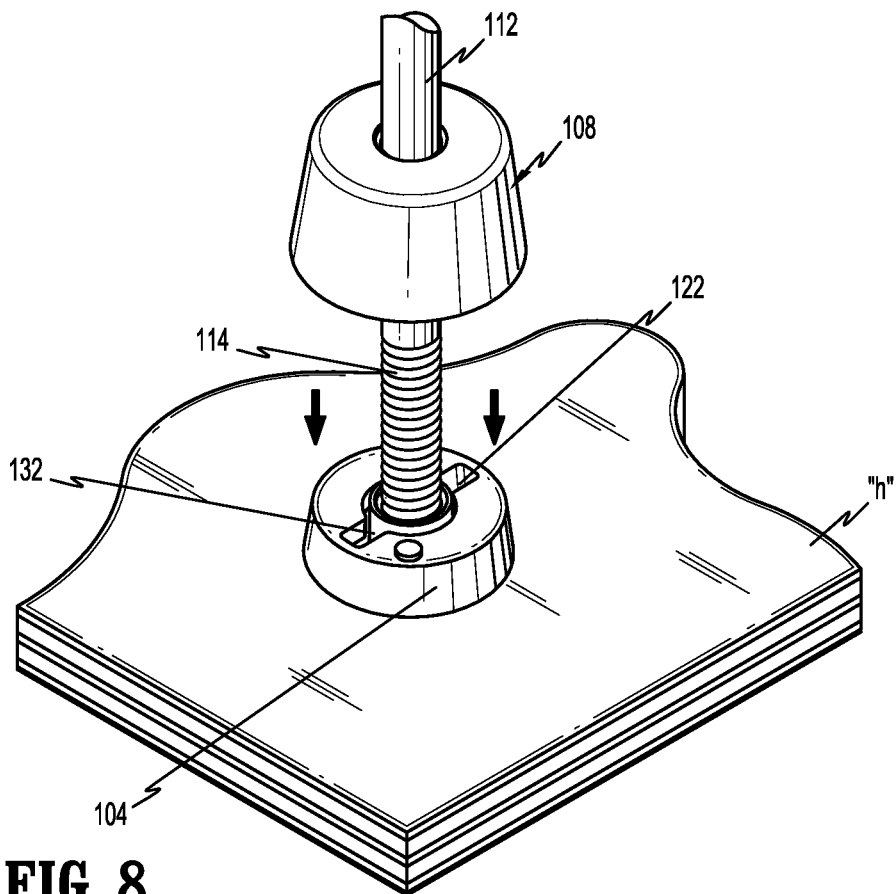
FIG. 8
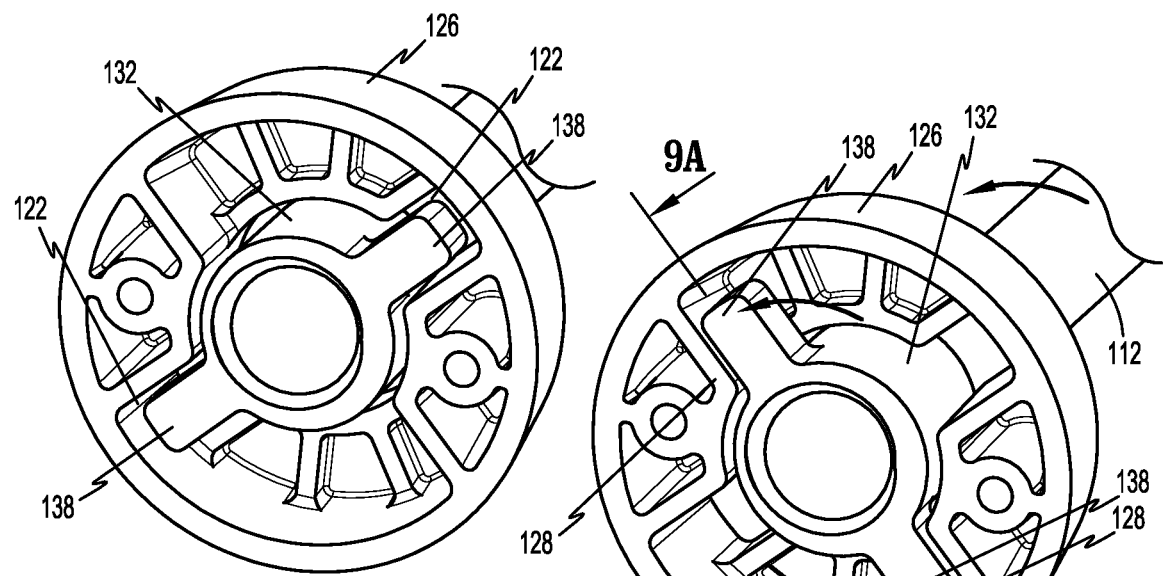
FIG. 8A
FIG. 9

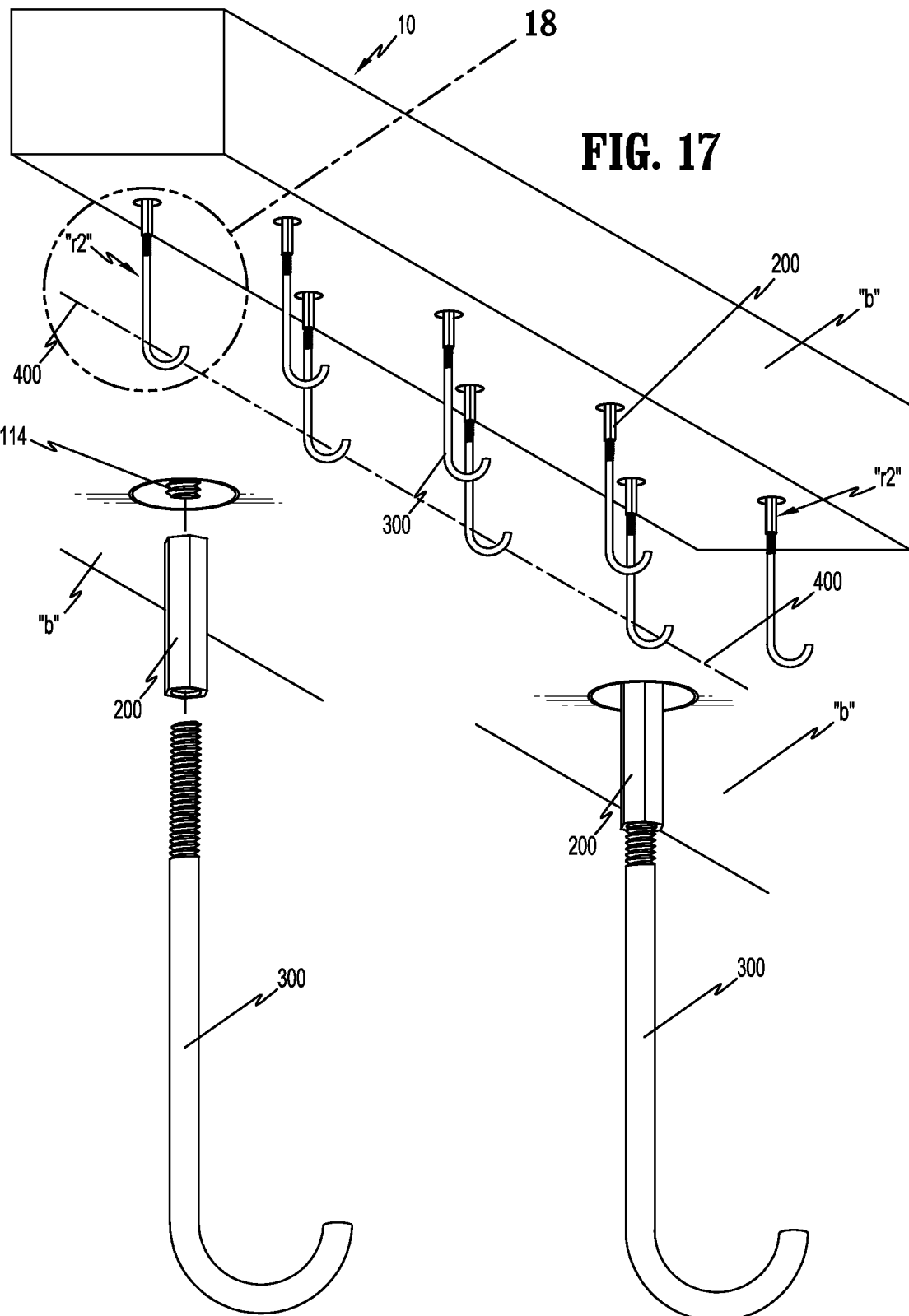

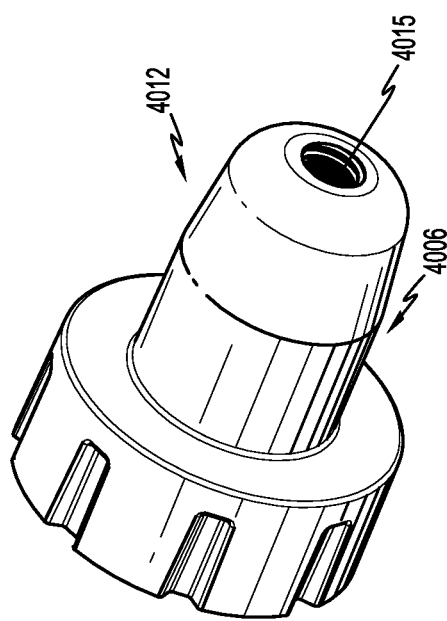
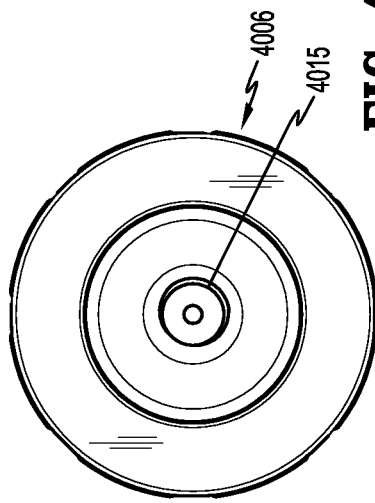
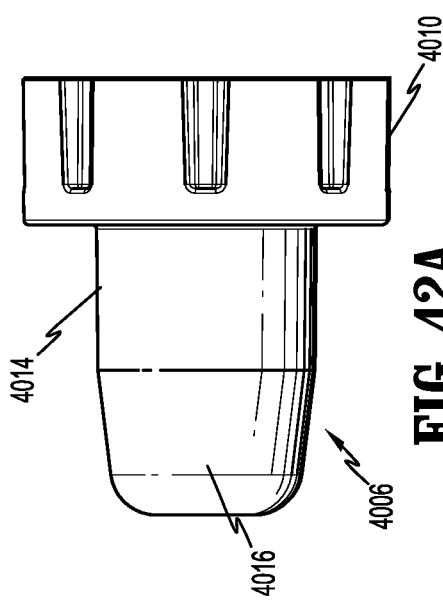
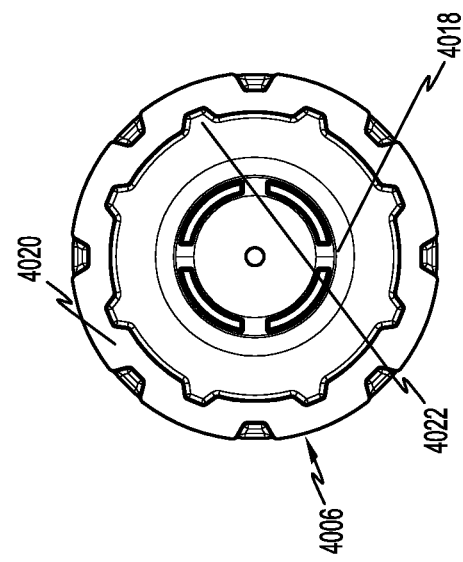
FIG. 42B
FIG. 42D
FIG. 42A
FIG. 42C

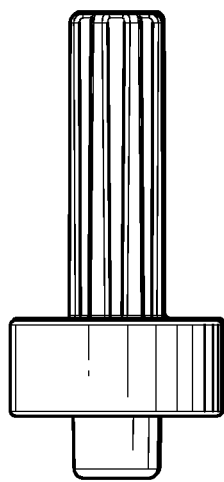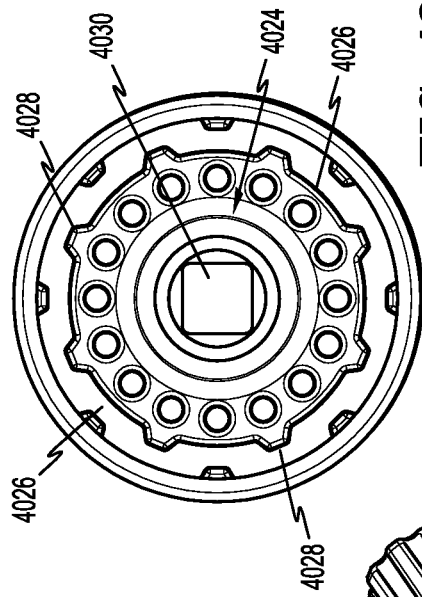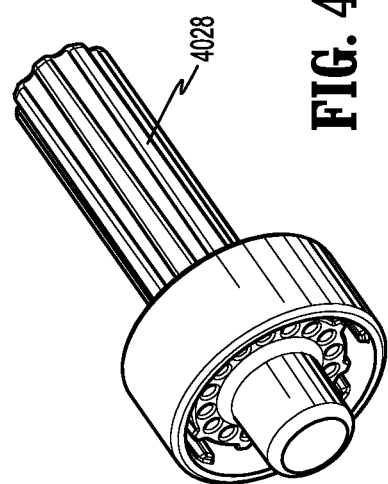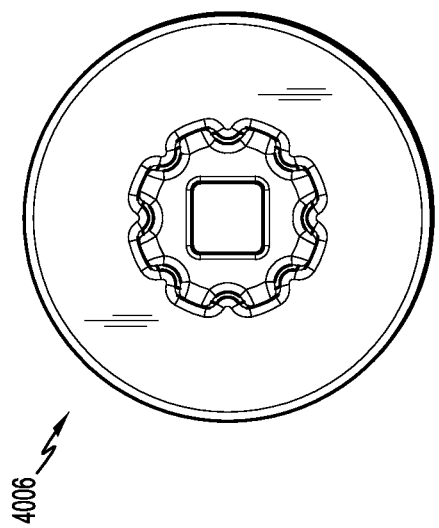

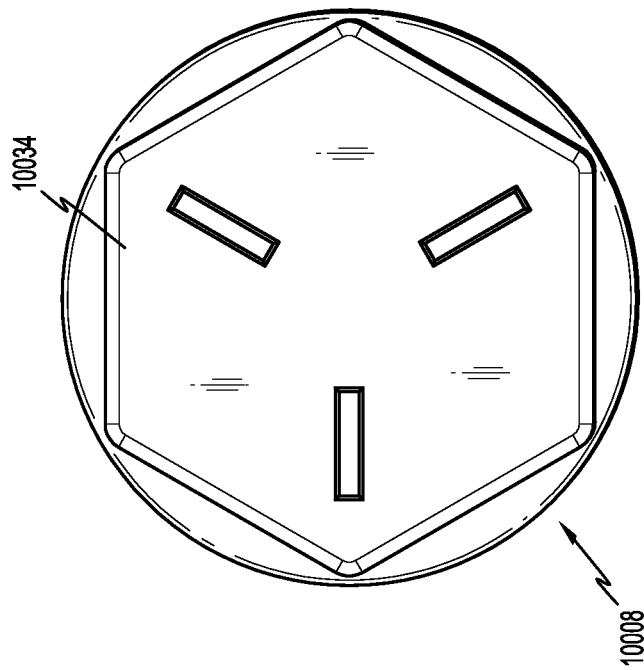
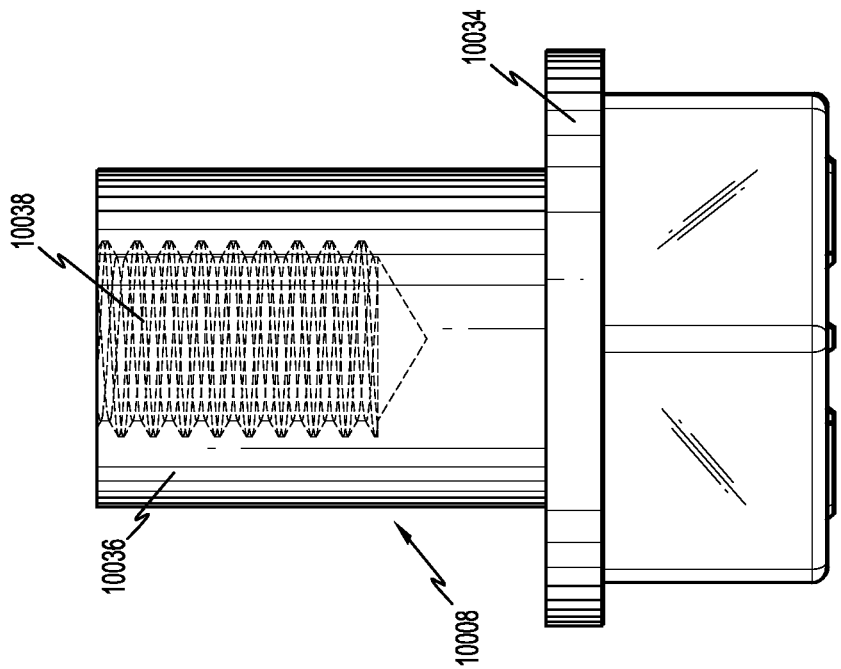
FIG. 60B
FIG. 60A

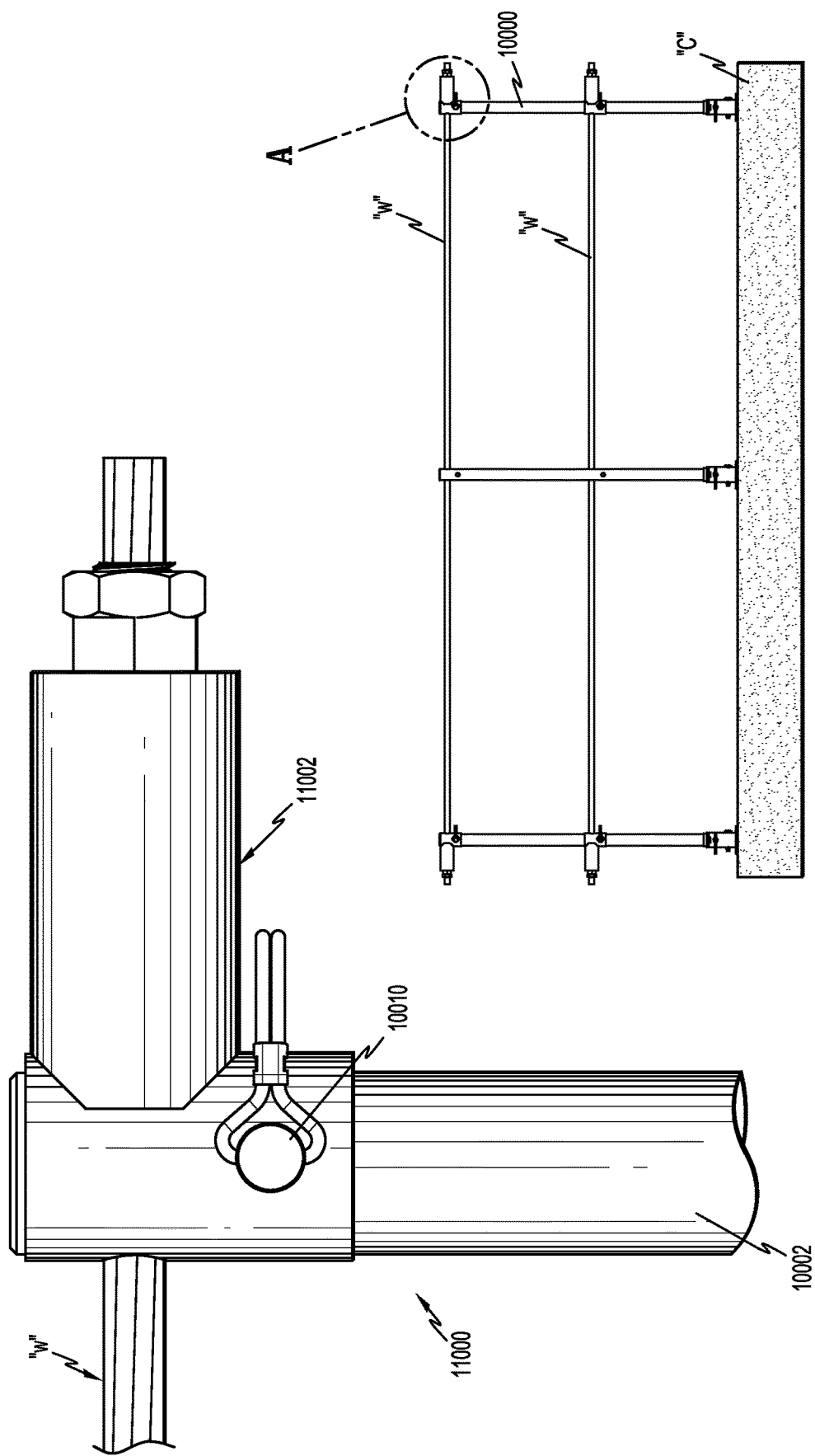

CONSTRUCTION ANCHOR APPARATUS AND SYSTEM AND METHODOLOGY OF USE

CROSS REFERENCE TO RELATED APPLICATIONS

The present application is a continuation in-part application of PCT International Application No. PCT/US2019/060653, having an International Filing Date of Nov. 9, 2019, which, claims the benefit of, and priority to, U.S. patent application Ser. No. 16/186,247, filed Nov. 9, 2018, now U.S. Pat. No. 10,689,841, U.S. Provisional Application Ser. No. 62/794,905, filed Jan. 21, 2019, and U.S. Provisional Application Ser. No. 62/794,905, filed Apr. 30, 2019. The present application further claims the benefit of, and priority to, U.S. Provisional Application Ser. No. 63/023,465, filed May 12, 2020 and U.S. Provisional Application Ser. No. 63/055,037, filed Jul. 22, 2020. The entire contents of each disclosure listed hereinabove is incorporated by reference herein.

BACKGROUND

1. Technical Field

The present disclosure relates to a construction system, and, in particular, relates to a system for installation of building equipment via a Building Information Modeling (BIM). The present disclosure further relates to a system for installation of one or more anchor apparatuses utilizing BIM software in conjunction with one or more positioning systems. The one or more positioning systems enable precise installation of the anchoring apparatuses at selected positions within the building structure in accordance with the BIM software. Moreover, the present disclosure further permits gathering of data pertaining to each anchoring apparatus either before or after installation. The data includes, but is not limited to lot number, manufacturer, installer, date installed and any other data or metadata which may be tracked for current or historical purposes.

The present disclosure further relates to an anchor apparatus. The anchor apparatus is mountable relative to a form used to create a concrete support structure. The concrete is deposited in the form and cures whereby the one or more anchor apparatuses becomes embedded with the concrete support structure. The embedded anchor apparatus is readily accessible to be coupled with, or to support, construction supplies or equipment such as ductwork, electrical cables, plumbing, sprinklers, safety lines or fences, etc. within a construction site. A plurality of anchor apparatuses may be mounted relative to the concrete form to create a system for organizing the construction materials in a manner which facilitates all phases of construction, enhances efficiency and organization, and substantially reduces costs and work hours. Moreover, the anchoring system, apparatus, and methodology for implementation will substantially impact current commercial and residential construction practices which incorporate concrete support structures in the form of beams, flooring, ceilings, roofing, etc.

2. Background of Related Art

Currently, during construction of residential and/or commercial building structures, provisions are made to accommodate the various electrical, plumbing, sprinkler, ductwork supplies, etc. to be incorporated in the final completed unit. With construction involving concrete or concrete structural elements, contractors are usually required to drill into the cured concrete to embed a fastener, hook, rod or the like to couple and run, e.g., electrical lines along a horizontal beam, vertical beam or a ceiling. Embedding a fastener or hook within cured concrete is an arduous and time-consuming process, and may affect the structural integrity of the concrete and/or structure. In addition, multiple contractors, e.g., electricians, plumbers, HVAC personnel, may require access to the beam structures for installation of additional fasteners, bolts, etc. which not only may further potentially affect the integrity of the concrete, but also presents logistical issues for the various contractors who need access to the support structure before the finishing work is performed at the site.

SUMMARY

Accordingly, the present disclosure is directed to a novel system, apparatus and methodology to assist contractors in residential and commercial construction. The system and associated methodology will substantially impact the current construction industry. More specifically, the system and methodology employ one or more anchor apparatuses which are positioned within the form, a wood, plywood or any material form, used to create the support structure before, e.g., depositing the concrete within the form. Upon curing of the concrete support structure, the form is removed and the anchor apparatuses, which are now embedded in the support structure, are readily exposed to be utilized in a plurality of ways, including, but not limited to, supporting electrical lines, plumbing, sprinklers, ductwork, safety straps, safety nets etc. A number of anchor apparatuses may be positioned within the form to accommodate the contractor's needs, and may be strategically positioned within the forms prior to pouring concrete to assist the contractor in organizing the layout of the particular equipment or supplies. Each anchor apparatus may be coupled through, e.g., an additional coupling, to an unlimited number of construction materials with relative ease to "run", e.g., the electrical, plumbing or safety equipment (e.g., safety straps, hooks, perimeter cable systems) as desired. Each contractor, e.g., an electrician or a plumber, may install their own system of anchor apparatuses on a single concrete form without any risk of interference with the other contractors.

In one exemplary embodiment, a method includes generating a building model of a building to be constructed at a construction site, identifying within the building model positional locations for installation of one or more anchor apparatuses within structural elements of the building model, transmitting the building model to a portable computing device at the construction site and identifying the location of the portable computing device relative to a given positional location. The generating, identifying, transmitting and identifying steps are implemented via at least one processing device comprising a processor and a memory.

The method may further include installing one anchor apparatus at the given positional location. The method may include identifying the location of a second given positional location and further include installing one anchor apparatus at the second given positional location.

The structural elements may include at least one of beams, columns, girders, floors and ceilings, and may be formed of concrete or cement.

In embodiments, generating a model includes utilizing a building information modeling module of a server.

In some embodiments, identifying within the building model positional locations includes utilizing a positional indicator module within the portable computing device to indicate a location of the portable computing device relative to a given positional location on the model.

In certain embodiments, utilizing the positional indicator includes utilizing at least one component or sensor of the portable computing device to assist in identifying the location of the portable computing device relative to the given positional location. For example, utilizing at least one component or sensor of the portable computing device includes receiving feedback from one or more of WIFI, Bluetooth, a camera, a GPS sensor, a gyroscope, a magnetometer, an accelerometer, a proximity sensor or an RFID sensor of the personal computing device.

The method may further include scanning visual indicia data on the one or more anchoring apparatuses to ascertain information pertaining to an attribute of manufacture of the one or more anchoring apparatuses or an attribute of installation of the one or more anchoring apparatuses.

In some embodiments, the method further includes transmitting the visual indicia data to one of the portable computing device or a server associated with the portable computing device. The attribute of manufacture may include at least one of manufacture, distributer, lot or model of the one or more anchoring apparatuses. The attribute of manufacture includes at least one of installer, installation date or supervisor.

Scanning visual indicia data may include utilizing the RFID sensor of the personal computing device to scan RFID tags on components of the one or more anchor apparatuses.

A computer program product including a non-transitory computer-readable storage medium encoded with computer program code that, when executed on a processor of a computer, causes the computer to implement various steps is also envisioned.

A system is also provided. The system includes one or more processors operatively coupled to one or more memories configured to generate a building model of a building to be constructed at a construction site, identify within the building model positional locations for installation of one or more anchor apparatuses within structural elements of the building model, transmitting the building model to a portable computing device at the construction site and identify the location of the portable computing device to a given positional location.

In one exemplary embodiment, an anchoring system for installation within support structure includes at least one anchoring apparatus having a locking plate configured for securement relative to a form board a form board used to form the concrete support, an elongate anchor with a connector segment at one end for connecting with a construction tool, a coupler mounted to the elongate anchor and a cover mounted about the elongate anchor and movable for positioning over the coupler and the locking plate. The coupler is manipulable to be coupled to the locking plate to at least partially secure the elongate anchor to the locking plate. The coupler defines a central opening configured to at least partially receive the connector segment of the elongate anchor, and wherein the coupler and the connecting segment include cooperating structure to releasably secure the coupler and the elongate anchor. In embodiments, the coupler defines an internal thread at least partially circumscribing the opening and wherein the connector segment of the anchor includes an external thread configured to threadably engage with the internal thread of the couple to releasably secure the coupler and the elongate anchor.

The locking plate and the coupler include cooperating structure configured to secure the coupler to the locking plate. The locking plate may define a plate aperture and at least one keyed slot adjacent the plate aperture. The coupler includes a central segment defining the coupler opening and at least one wing depending from the central segment. The central segment and the at least one wing are respectively receivable within the plate aperture and the at least one keyed slots of the locking plate when in a first rotational orientation of the coupler and the locking plate, whereby relative rotational movement of the coupler and the locking plate to a second rotational orientation thereof at least partially secures the coupler to the locking plate. The locking plate may define two opposed keyed slots and wherein the coupler includes two opposed wings correspondingly dimensioned to be received within the two opposed keyed slots when in the first rotational orientation of the coupler and the locking plate.

The cover defines a cover passage for reception of the connector segment of the elongate anchor. In embodiments, the cover defines an inner thread circumscribing the cover passage with the inner thread configured to cooperate with the threaded segment of the elongate anchor to advance the cover relative to the elongate anchor.

The locking plate may include at least one fastener opening configured to receive a fastener for securing the locking plate to the form board.

The system may include a plurality of anchor apparatuses.

In one exemplary embodiment, a method of construction is disclosed. The method includes anchoring at least one anchor apparatus to a form utilized to create a concrete support structure, by:

securing a locking plate of the at least one anchor apparatus to a board of the form;

coupling an elongate anchor of the at least one anchor apparatus to the locking plate, the elongate anchor including an external thread;

advancing a cover of the at least one anchor apparatus along the elongate anchor for positioning against the board;

depositing concrete within the form to create the concrete support structure whereby the cover isolates at least a portion of the external thread of the elongate anchor from the concrete; and removing the board to at least partially expose the cover and the at least the portion of the external thread of the elongate anchor.

Depositing concrete may include establishing an isolated internal cavity within the cover with the at least the portion of the external thread of the anchor extending within the internal cavity. Coupling the elongate anchor may include mounting a coupler of the at least one anchor apparatus about the external thread of the elongate anchor and connecting the coupler to the locking plate. In embodiments, the coupler includes an internal thread and wherein mounting the coupler includes threadably engaging the coupler with the external thread of the anchor. In certain embodiments, the locking plate defines a plate aperture and at least one keyed slot adjacent the plate aperture and the coupler includes a central segment defining the coupler opening and at least one wing depending from the central segment, where the method further includes positioning the central segment and the at least one wing respectively within the plate aperture and the at least one keyed slot of the locking plate and rotating the coupler to secure the coupler and the anchor relative to the locking plate.

The cover may define a cover passage with an internal thread and wherein advancing the cover includes threadably coupling the internal thread of the cover with the external thread of the elongate anchor. The method may further includes attaching a tool relative to the at least a portion of the external thread of the anchor subsequent to removing the board. The tool may include a threaded segment and wherein attaching the tool includes threadably coupling the tool with the portion of the external thread of the anchor. The method may further include supporting construction equipment, materials, supplies, safety hooks, perimeter fall cables with the tool. The tool may be an anchor clamp. The method may also include anchoring a plurality of anchor apparatuses to the form.

In another illustrative embodiment, an anchoring system for installation in a concrete support comprises at least one anchoring apparatus, including a locking plate configured for securement relative to a form board used to form a concrete support, an elongate anchor including a connector segment at one end for connecting with a construction tool, a coupler mounted to the elongate anchor and being manipulable to be coupled to the locking plate to at least partially secure the elongate anchor to the locking plate, a cover mounted about the elongate anchor and movable for positioning over the coupler and the locking plate and an anchor clamp engageable with the connector segment of the elongate anchor.

Other advantages of the construction anchoring system will be appreciated from the following description.

BRIEF DESCRIPTION OF THE DRAWINGS

Various aspects and features of the present disclosure are described hereinbelow with references to the drawings, wherein:

FIGS. 3A, 3B and 3C are perspective, top plan and bottom plan views, respectively, of the locking plate;

FIGS. 4A and 4B are perspective and top plan views, respectively, of the coupler;

FIG. 8 is a perspective view illustrating the coupler mounted within the locking plate in accordance with one exemplary methodology of use of the system;

FIG. 8A is a perspective view illustrating the central segment and the wings of the coupler received within the plate aperture and the keyed slots of the plate segment of the locking plate in accordance with one exemplary methodology of use of the system;

FIG. 9 is a view similar to the view of FIG. 8A illustrating the coupler rotated within the locking plate to secure the wings beneath the locking plate thereby securing the coupler to the locking plate in accordance with one exemplary methodology of use of the system;

FIG. 16 is a perspective view illustrating the coupling tool and support hook being secured to one elongate anchor in accordance with one exemplary methodology of use of the system;

FIG. 17 is a perspective view illustrating a plurality of anchor apparatuses of the system within the concrete structure and further illustrating a coupling tool and a support hook mounted to each elongate anchor in accordance with one exemplary methodology of use of the system;

FIG. 18 is an enlarged view of the area of isolation depicted in FIG. 17 illustrating the coupling tool and the support hook secured to a single elongate anchor of the anchor apparatus in accordance with one exemplary methodology of use of the system;

FIGS. 42A-D illustrates the column anchor of the anchor apparatus of FIGS. 40A-40C; and FIGS. 43A-D illustrates the anchor tool of the anchor apparatus of FIGS. 40A-40C.

FIGS. 60A-60B are side elevation and top plan views of the collar nut of the safety post apparatus of FIGS. 56-59C.

FIGS. 61A-61B illustrates use of a plurality of the safety post apparatuses of FIGS. 56-60B as a component of a safety fence.

FIG. 62 is a side elevation view of a cable tensioner of use with the safety anchor apparatus and safety fence.

DETAILED DESCRIPTION

Particular embodiments of the present disclosure are described hereinbelow with reference to the accompanying drawings. However, it is to be understood that the disclosed embodiments are merely examples of the disclosure and may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to employ the present disclosure in virtually any appropriately detailed structure.

Figure 1:
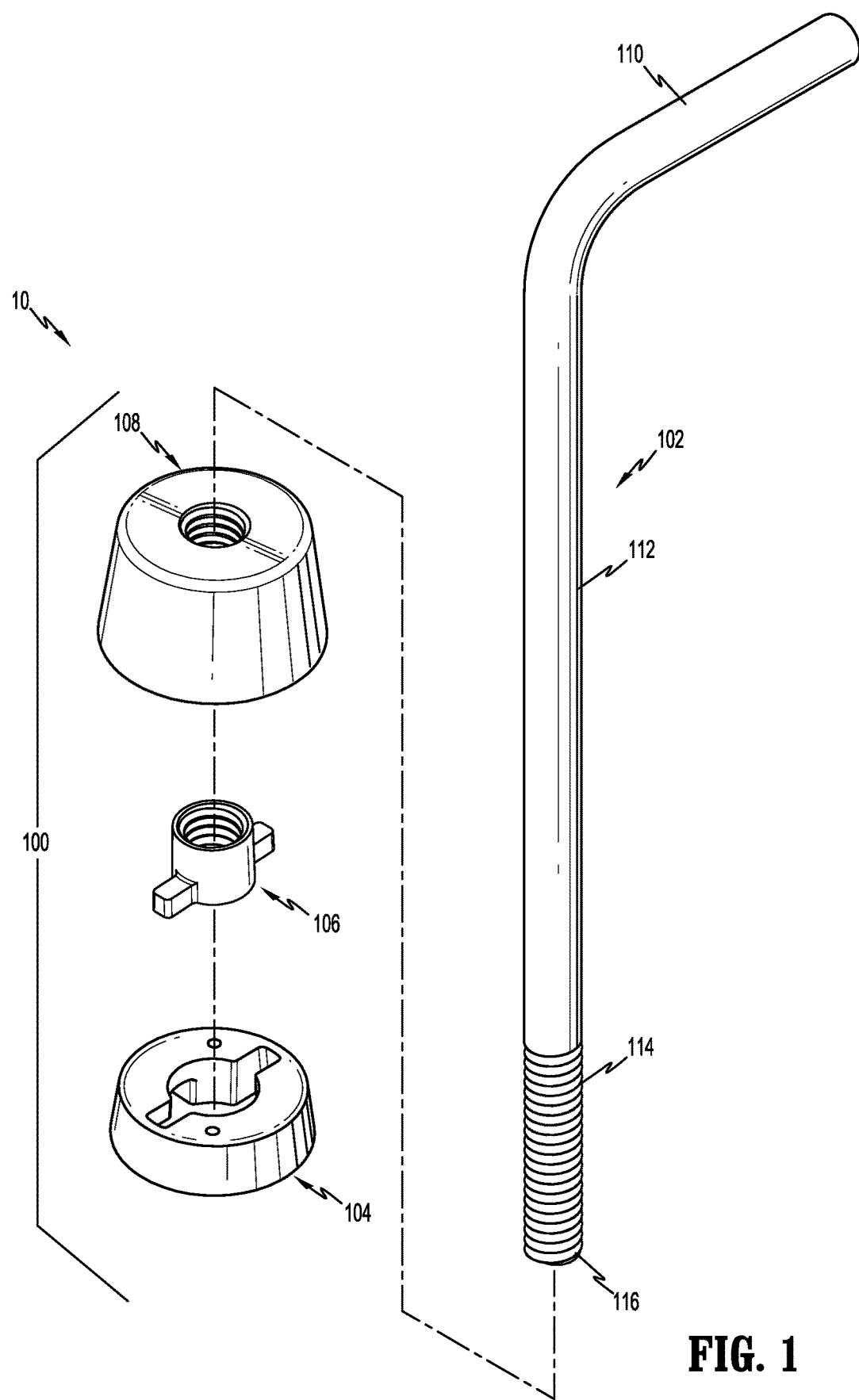
FIG. 1 is an exploded perspective view of the construction anchoring system in accordance with the principles of the present disclosure illustrating one anchor apparatus including an elongate anchor, a cover, a coupler and a locking plate.
Figure 2:
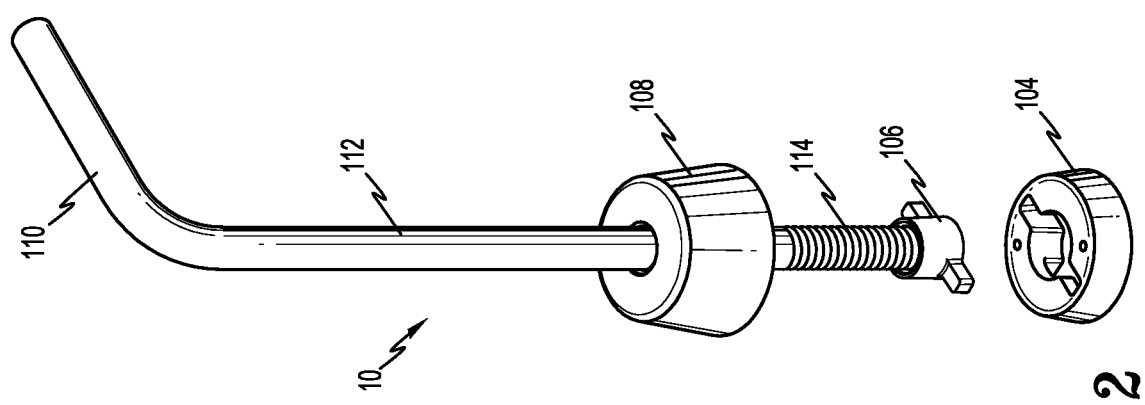
FIG. 2 is a perspective view illustrating the cover and the coupler mounted relative to the elongate anchor with the locking plate separated from the other components.

Referring now to FIG. 1, there is illustrated an exploded perspective view of one construction anchor apparatus 100 of the anchoring system 10 in accordance with the principles of the present disclosure. The anchoring system 10 includes one or more, e.g., a plurality of anchor apparatuses 100, depending on the needs of construction personnel. Each anchor apparatus 100 includes four components, namely, an anchor 102, a locking plate 104, a coupler 106 and a cover 108. The anchor 102 may take a variety of shapes or configurations. In one embodiment, the anchor 102 is monolithically formed including a L-shaped rod, e.g., having a handle 110 and an elongate anchor rod 112 depending from the handle 110. The elongate anchor rod 112 includes a connector segment, e.g., in the form of an external thread 114 extending to the end 116 of the elongate anchor rod 112 remote from the handle 110. As best depicted in FIG. 2, when assembled, the elongate anchor rod 112 is positionable within the cover 108 and has the coupler 106 disposed on the external thread 114 adjacent the remote end 116. The mounted coupler 106 is thereafter introduced and secured within the locking plate 104 as will be discussed in greater detail hereinbelow.

Figure 3A:
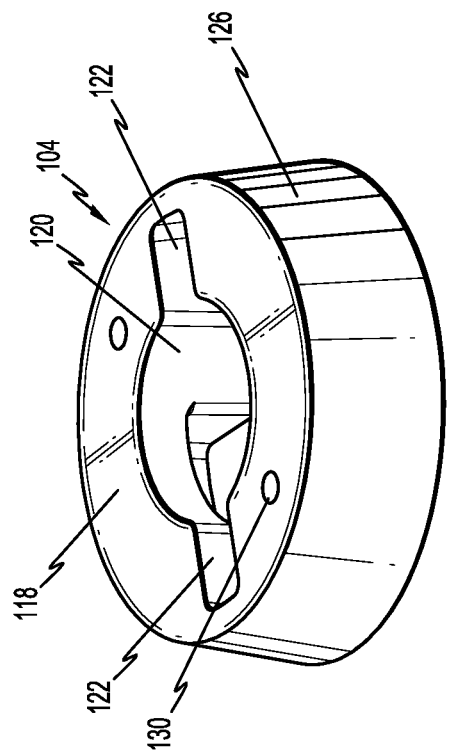
Figure 3B:
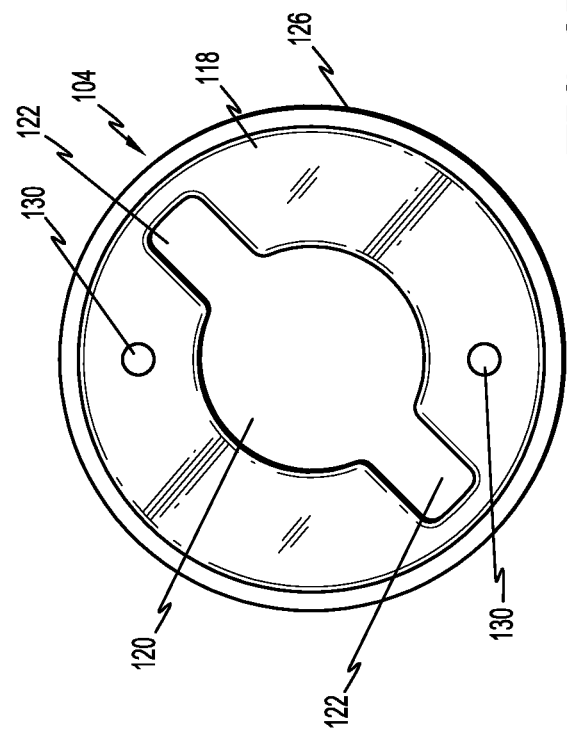

Referring now to FIGS. 3A-3C, in conjunction with FIGS. 1-2, the locking plate 104 will be discussed. The locking plate 104 may assume a variety of shapes or configurations. Although referred to as a "plate", the locking plate 104 does not necessarily require a plate like appearance, but could be any three-dimensional unit including a box, a dome, a bowl etc. The locking plate 104 defines a plate segment 118 having a central plate aperture 120 and at least one keyed slot 122, e.g., two diametrically opposed keyed slots 122, each communicating with the central plate aperture 120. As best depicted in FIG. 3C, the locking plate 104 defines an interior space 124 at least partially confined within the outer wall 126 or boundary of the locking plate 104 beneath the plate segment 118. The outer wall 126 may be tapered as shown. Opposed vertical walls or stops 128 at least partially define the interior space 124. The vertical stops 128 limit rotational movement of the coupler 106 within the locking plate 104. At least one fastener opening 130, e.g., two fastener openings 130, extend(s) through the locking plate 104 for reception of a fastener such as a screw or nail utilized to secure the locking plate 104 relative to a form board of a concrete or concrete form.

Referring now to FIGS. 4A-4B, in conjunction with FIGS. 1-2, the coupler 106 includes a central coupler segment 132 defining a coupler opening 134 and an internal coupler thread 136 circumscribing the coupler opening 134. The internal coupler thread 136 of the coupler 106 threadably engages the external thread 114 of the elongate anchor rod 112 to mount the coupler 106 to the anchor 102. The coupler 106 further includes at least one, e.g., two, diametrically opposed wings 138 depending from the central coupler segment 132. The central coupler segment 132 and the wings 138 are cooperatively dimensioned to be respectively received within the central plate aperture 120 and the keyed slots 122 of the locking plate 104.

Figure 5A:
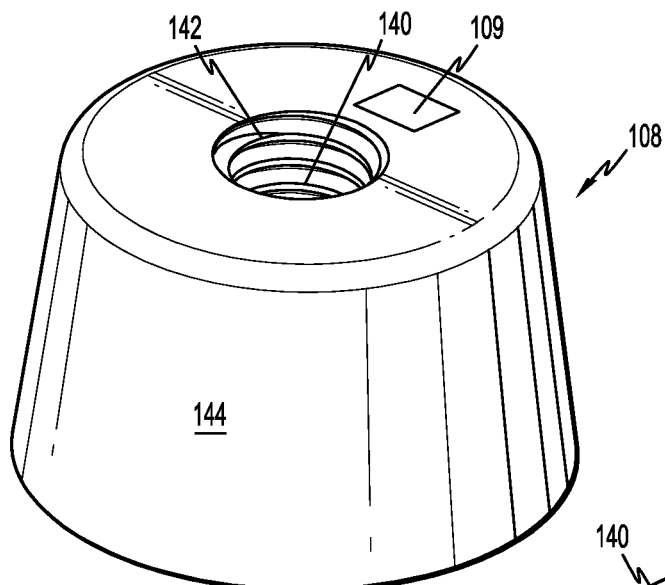
FIGS. 5A, 5B and 5C are top perspective, bottom plan and bottom perspective views, respectively, of the cover.
Figure 5B:
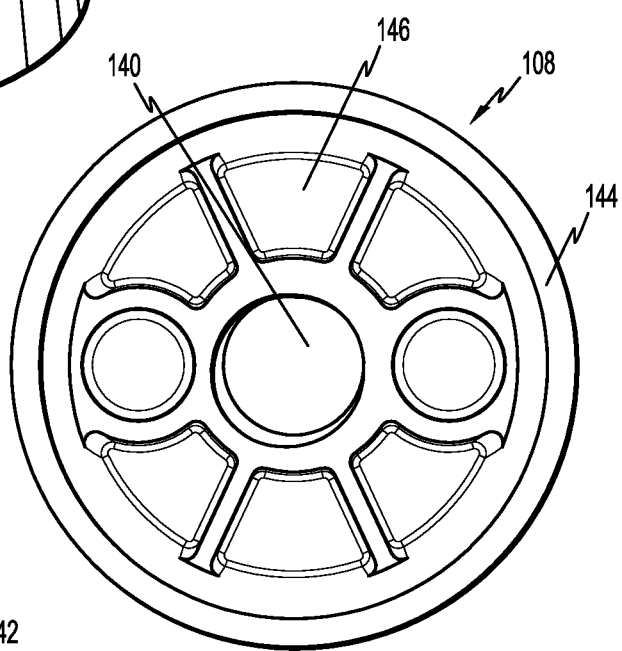
Figure 5C:
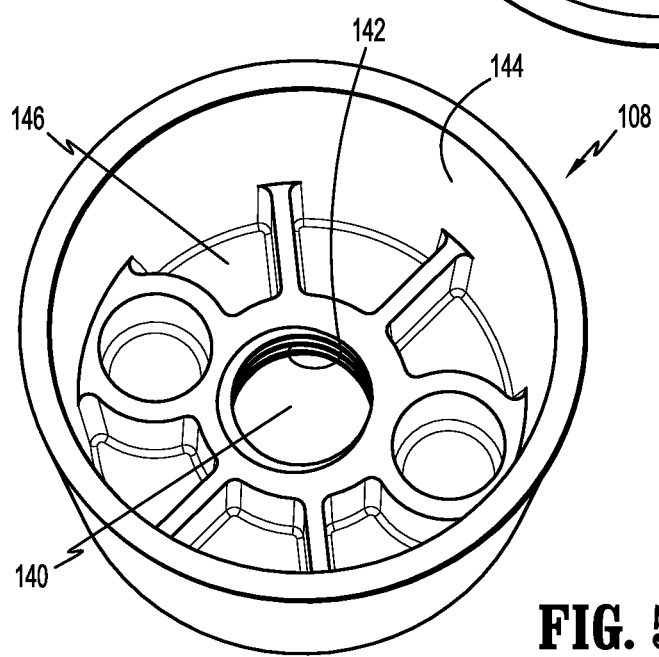

With reference to FIGS. 5A-5C, the cover 108 will be discussed. The cover 108 may be in the shape of a frustum; however, other shapes are also envisioned. The cover 108 includes a central cover passage 140 for reception and passage of the elongate anchor rod 112 of the anchor 102. The cover 108 further defines an internal cover thread 142 for threadably engaging the external thread 114 of the anchor 102. The cover 108 includes an outer cover wall 144 defining an internal cavity 146 dimensioned for positioning over the locking plate 104 and the coupler 106. The cover 108 may include supports in the form of internal ribs 148 or the like to increase the stability of the cover 108. The outer cover wall 144 of the cover 108 is dimensioned to form a tight tolerance relative to the outer wall 126 of the locking plate 104 to establish a fluid tight fit or seal with the outer wall 126 of the locking plate 104—the significance of which will be discussed in greater detail hereinbelow. In embodiments, the outer wall 126 of the locking plate 104 and the outer cover wall 144 of the cover 108 have similar tapered arrangements. The cover 108 also may include an RFID tag or bar code schematically depicted as reference numeral 109. The cover 108 defines an external surface taper of the outer cover wall 144 relative to the longitudinal axis of the cover ranging from about 3° to about 11°, or about 7°. This tapered arrangement establishes an effective shoulder fit with the concrete upon its curing. The tapered arrangement of the cover 108 also mat create a Morse taper effect between the outer cover wall 144 and the cured concrete further enhancing retention of the cover 108 within the cured concrete until such time the cover 108 is removed.

Each of the components of the anchor apparatus 100 may be formed of a suitable rigid polymeric material or a metallic material. In embodiments, at least the anchor 102 is formed of a suitable metal such as stainless steel or the like. At least some or potentially all of the components include an RFID tag or bar-code or other machine-readable indicia to be scanned via a scanning device, for example an RFID scanner or bar code reader to provide information of the product installed or the installation parameters as discussed hereinbelow. At least the cover 108 may be made in a variety of colors, e.g., color-coded, to correspond to the tradesman or construction personnel who intend to use the particular anchor apparatus 100. More specifically, a particular color may be associated with specific construction personnel to assist said personnel in identifying the anchor apparatuses 100 which will be associated with his/her equipment.

As previously addressed, the anchoring system 10 is intended for use with concrete or concrete support structures in connection with residential or commercial building construction. The anchoring system 10 may be embedded within horizontal or vertical beams, flooring or ceilings. The following discussion will focus on use of the anchoring system 10 in its application with a horizontal beam constructed during a phase of a construction. However, it is appreciated that the anchoring system 10 has many applications inclusive of those mentioned above and in many other applications.

Figure 6:
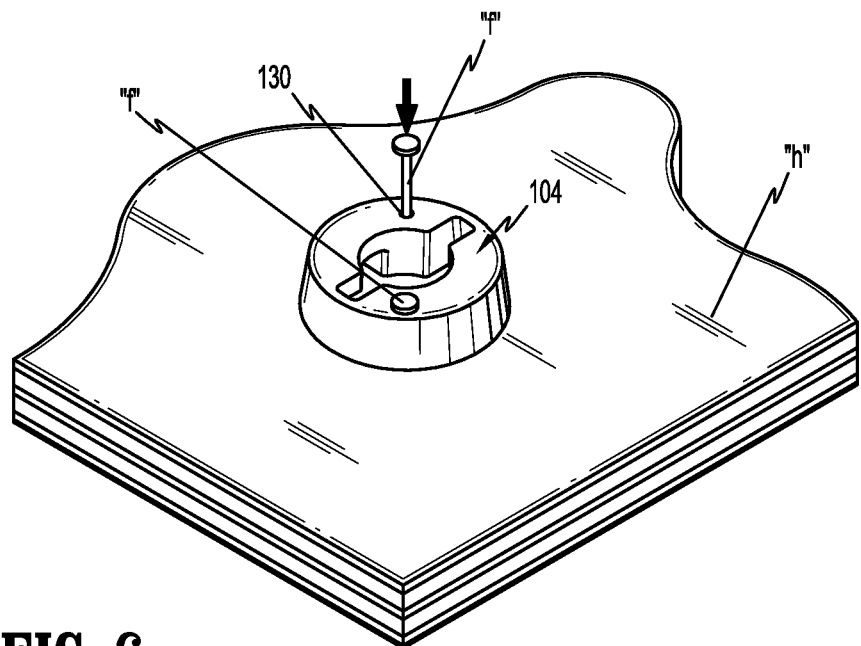
FIG. 6 is a perspective view illustrating securing of the locking plate to a form board of a concrete form in accordance with one exemplary use of the system of FIGS. 1-5C.
Figure 7:
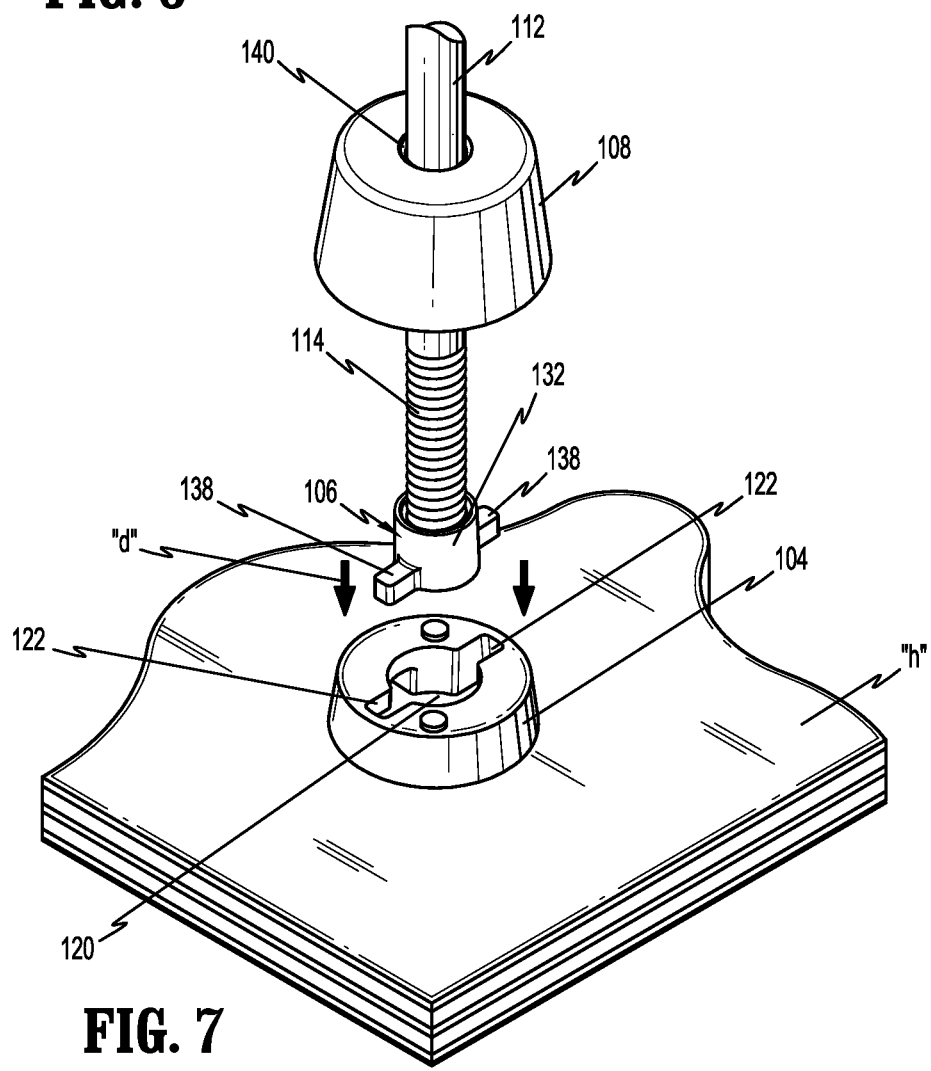
FIG. 7 is a perspective view illustrating the elongate anchor with mounted coupler being introduced within the locking plate in accordance with one exemplary methodology of use of the system.

During formation of a horizontal beam, a form for the concrete beam is constructed with the use of, e.g., plywood, or any other suitable materials. Generally, the form includes a lower horizontal form board and two vertical form boards depending upwardly from the horizontal form board. With reference to FIG. 6, only the horizontal form board "h" is shown for illustrative purposes. In accordance with one exemplary methodology of use of the anchoring system of the present disclosure, the locking plate 104 is secured to the inside surface of the horizontal form board "h", i.e., the surface which will be in contact with and support the poured concrete. The locking plate 104 is secured to the horizontal form board "h" with the use of nails, fasteners or screws "f" which are introduced within the fastener openings 130 of the locking plate 104 and secured to the horizontal form board "h" as depicted in FIG. 6. With reference to FIG. 7, the coupler 106 is threaded onto the remote end 116 of the anchor rod 112 and the cover passage 140 of the cover 108 is positioned over the handle 110 of the anchor 102 and slid down the anchor rod 112 as shown. The anchor 102 and the coupler 106 are advanced toward the locking plate 104 as shown by the directional arrows "d" in FIG. 7.

With reference now to FIGS. 7, 8 and 8A, the coupler 106 is introduced within the plate segment 118 of the locking plate 104 by aligning the central coupler segment 132 and the coupler wings 138 with the central plate aperture 120 and keyed slots 122 respectively of the plate segment 118 of the locking plate 104 corresponding to a first relative rotational orientation of the coupler 106 and the locking plate 104. FIG. 8A illustrates the central coupler segment 132 and the wings 138 received within the central plate aperture 120 and the keyed slots 122, and disposed within the interior space 124 of the locking plate 104 beneath the plate segment 118. Thereafter, with reference to FIG. 9, the coupler 106 is rotated through a predetermined angular sector of rotation via rotation of the handle 110 of the anchor 102 in the direction of directional arrows "r" to a second relative rotational orientation of the coupler 106 and the locking plate 104 whereby the wings 138 of the coupler 106 are displaced from the keyed slots 122 and are disposed beneath the plate segment 118 of the locking plate 104 engaging the vertical stops 128 within the interior space 124 of the locking plate 104 thereby coupling the coupler 106 and the anchor 102 to the locking plate 104.

Figure 10:
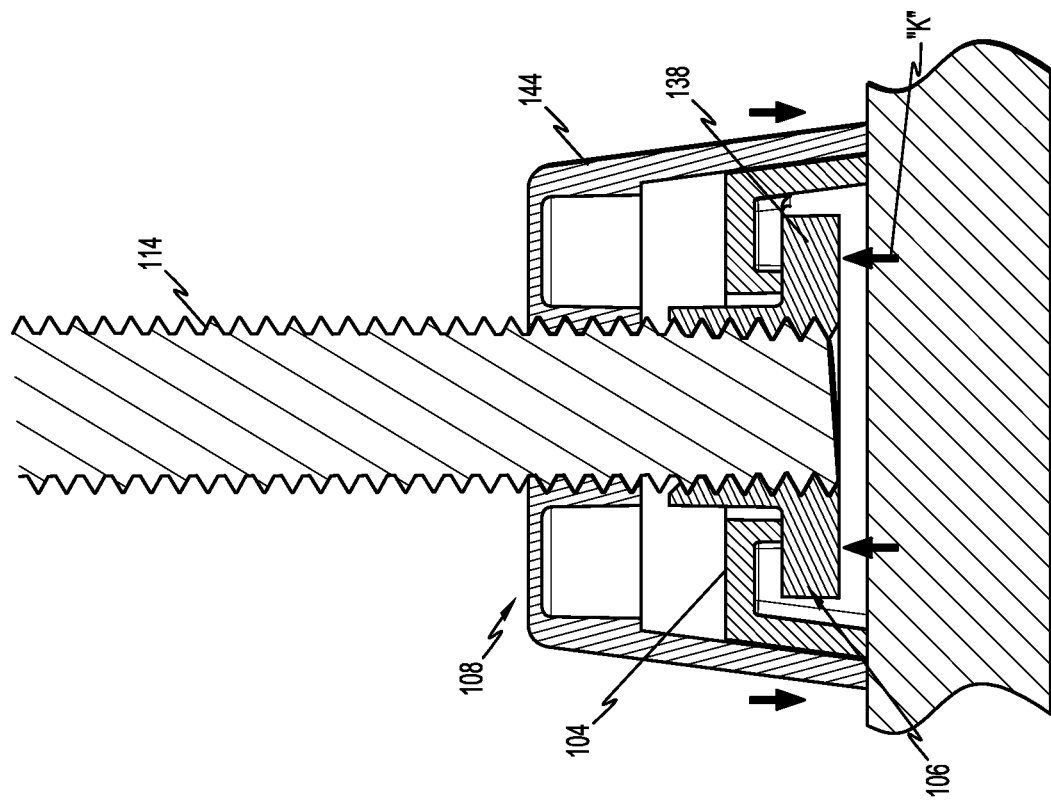
FIG. 10 is a cross-sectional view illustrating the cover secured against the locking plate through rotation of the cover about the elongate anchor in accordance with one exemplary methodology of use of the system.
Figure 9A:
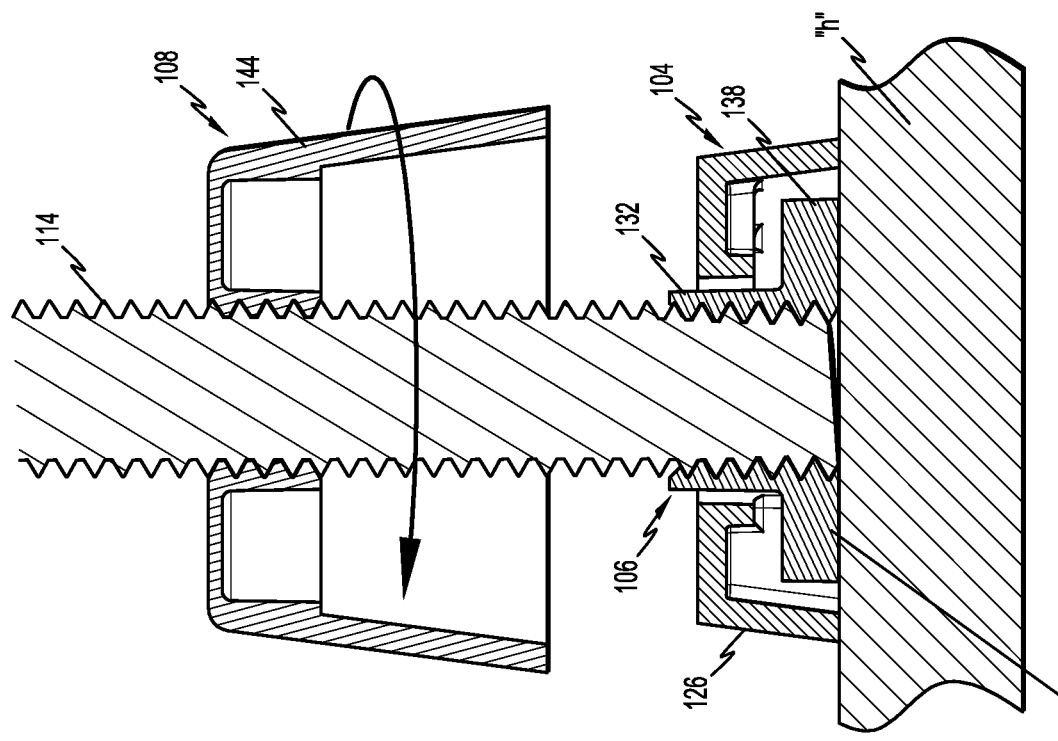
FIG. 9A is a cross-sectional view taken along the lines 9A-9A of FIG. 9 illustrating the coupler secured relative to the locking plate and the cover being advanced along the elongate anchor in accordance with one exemplary methodology of use of the system.

With reference now to FIGS. 9A-10, the cover 108 is threaded along the external thread 114 (through the threaded engagement of the internal cover thread 142 and the external thread 114 of the anchor rod 112) until it engages the horizontal form board "h" as depicted in FIG. 10. During advancement of the cover 108, the anchor 102 and the coupler 106 may also retract (in the direction of directional arrows "k") relative to the locking plate 104 whereby the wings 138 of the coupler engage the downwardly depending wall defining the central plate aperture 120 to further secure or lock the coupler 106, and thus, the anchor 102 relative to the locking plate 104.

Figure 11:
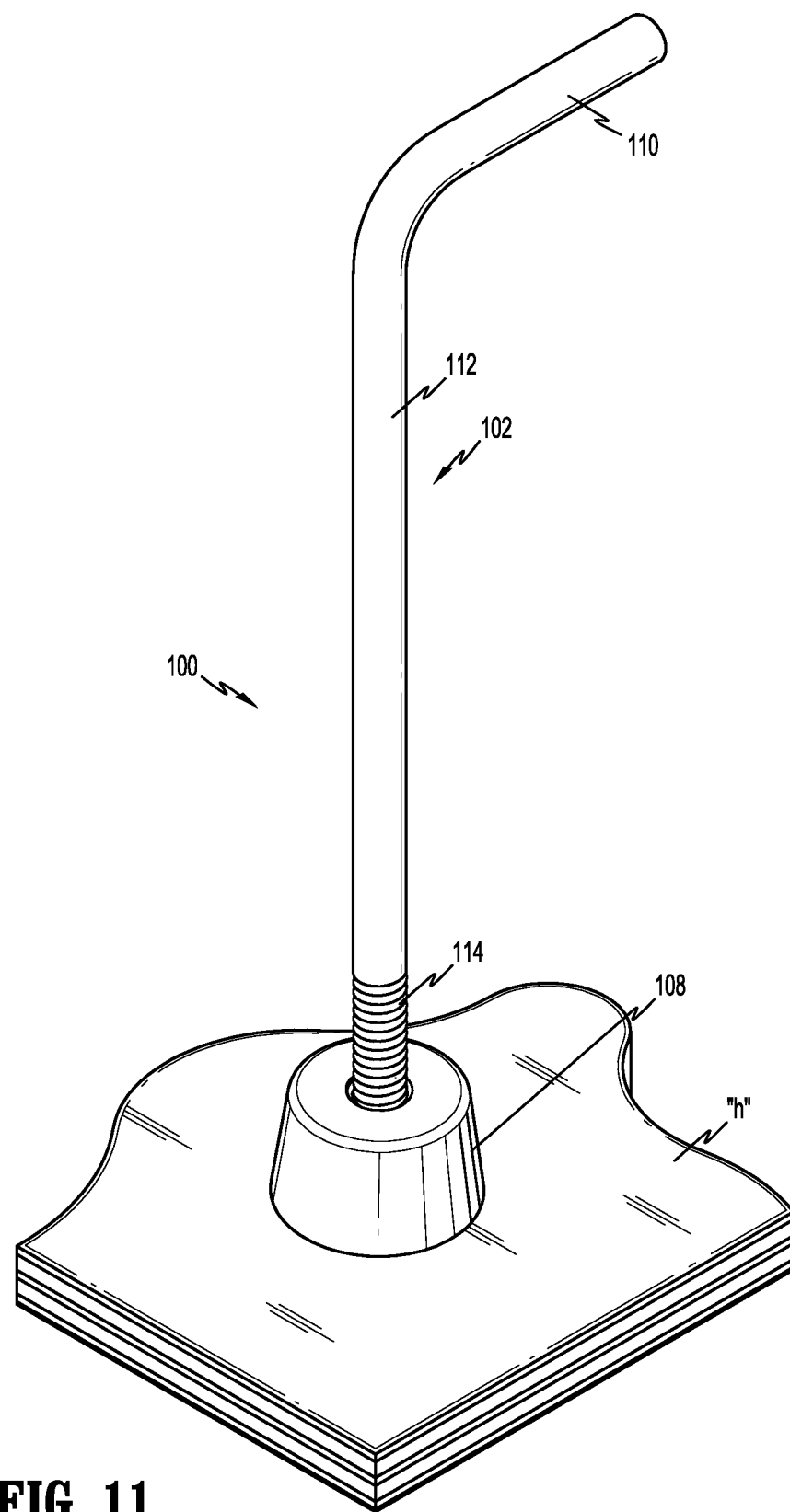
FIG. 11 is a view illustrating the anchor apparatus of the system secured to the form board of the concrete form in accordance with one exemplary methodology of use of the system.

As further depicted in FIG. 10, the outer cover wall 144 of the cover 108 fits precisely over the outer wall 126 of the locking plate 104, i.e., with a tight tolerance, and in embodiments, establishes a substantial fluid tight seal with the outer wall 126 of the locking plate 104. This will minimize or prevent any concrete from entering within the internal cavity 146 of the cover 108 when the concrete is poured and during curing of the concrete. FIG. 11 illustrates the anchor apparatus 100 mounted relative to the horizontal form board "h".

Figure 12:
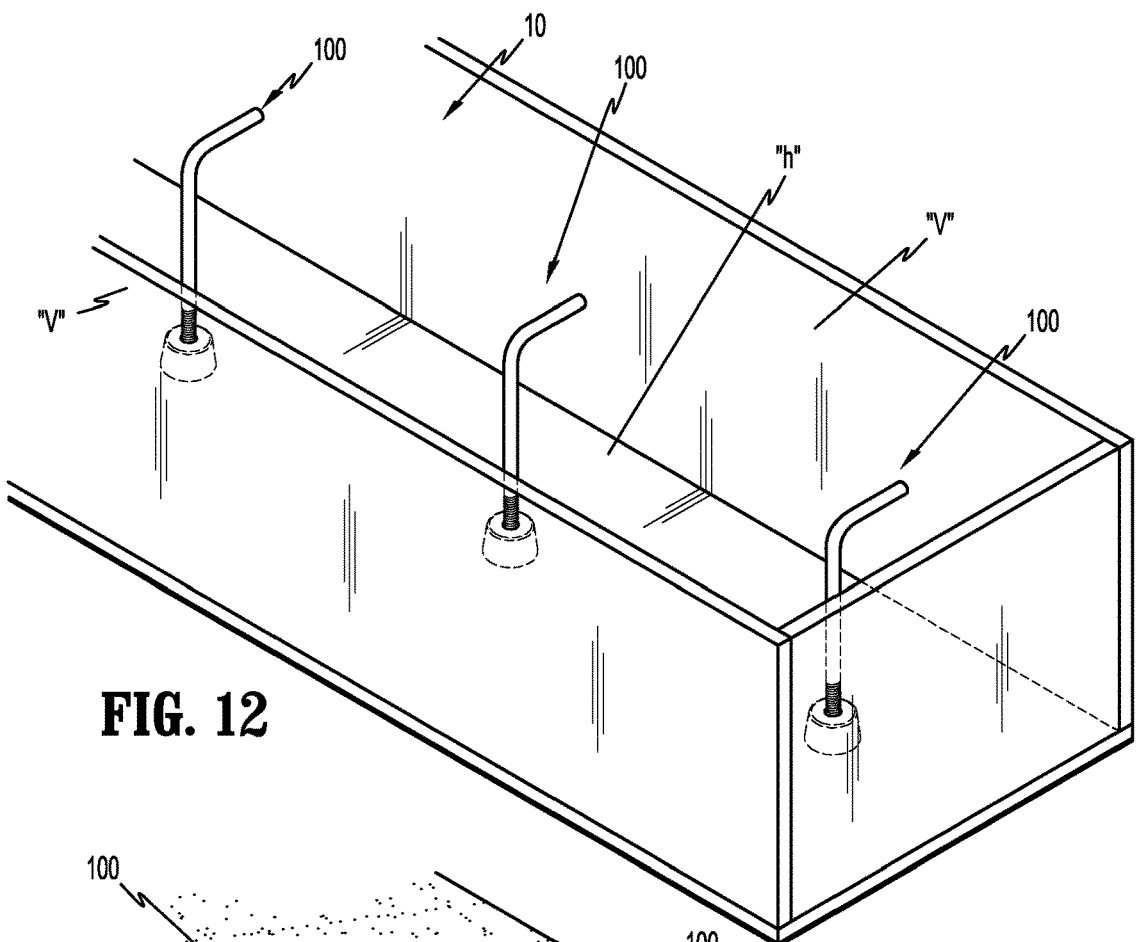
FIG. 12 is a perspective view illustrating a plurality of anchor apparatuses of the anchoring system secured to the form board of the concrete form in accordance with one exemplary methodology of use of the system.
Figure 13:
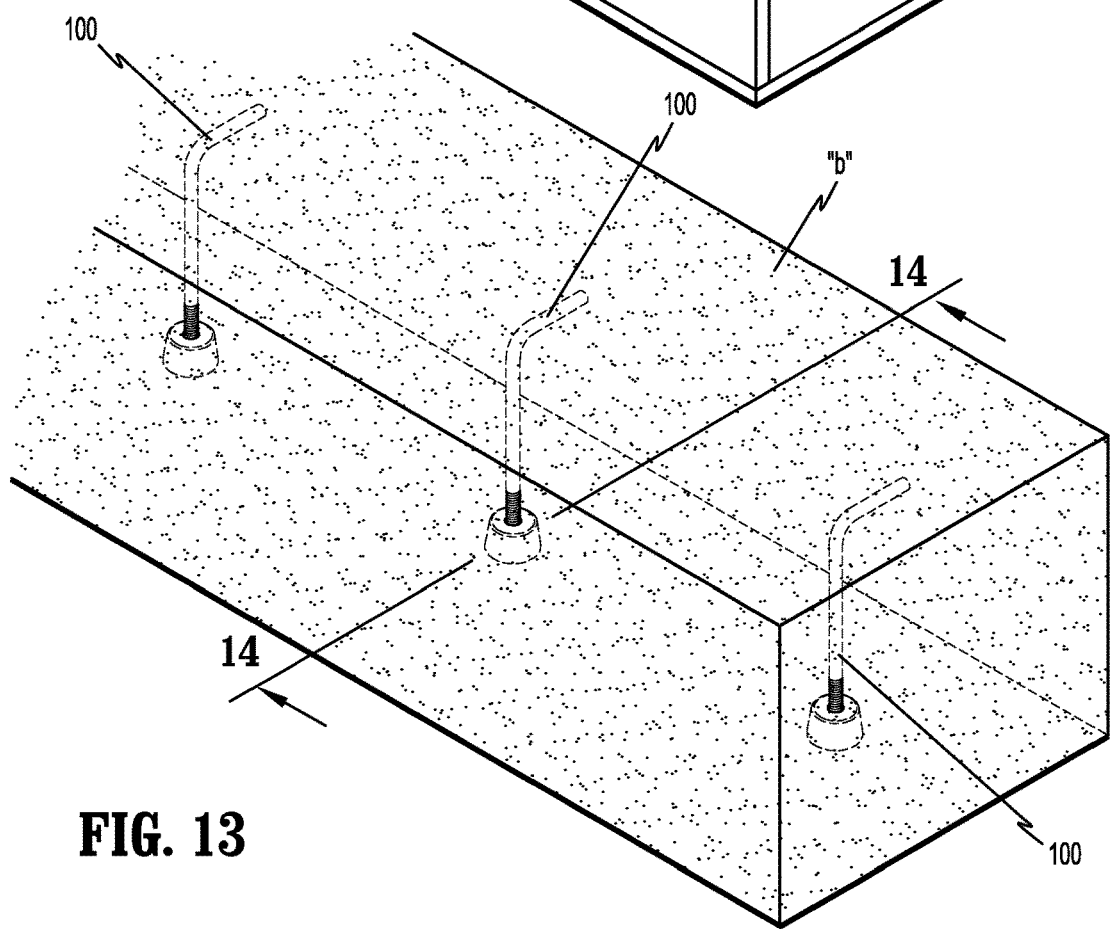
FIG. 13 is a view similar to the view of FIG. 12 illustrating concrete deposited in the concrete form with the anchor apparatuses embedded within the concrete in accordance with one exemplary methodology of use of the system.

Referring now to FIG. 12, a plurality of anchor apparatuses 100 as part of the anchoring system 10 is installed to the horizontal form board "h" at predetermined locations as selected by the contractor. As noted above, these locations preferably correspond to the locations where the equipment, e.g., electrical lines, plumbing, safety cables, safety hooks etc. are to "run" or to be positioned in the structure. In FIG. 12, the concrete form "m" is shown with the vertical form boards "v" and the horizontal form board "h", and further illustrates the anchor apparatuses 100 disposed within the interior of the concrete form "m". FIG. 13 illustrates the horizontal beam "b" formed upon curing of the concrete and depicts in phantom the anchor apparatuses 100 permanently embedded within the horizontal beam "b". In FIG. 13, the horizontal and vertical form boards "h", "v" are removed.

The locking plate 104 and the coupler 106 are removed relative to the external thread 114 of the anchor rod 112. The locking plate 104 and the coupler 106 may be removed simply by rotating the coupler 106 and the locking plate 104 simultaneously until the internal coupler thread 136 of the coupler 106 disengages from the external thread 114 of the anchor rod 112. (See, e.g., FIG. 9A). Alternatively, the locking plate 104 can be disengaged from the coupler 106 by rotating the locking plate 104 to align the keyed slots 122 of the locking plate 104 with the wings 138 of the coupler 106 (FIG. 8A), and then unscrewing the coupler 106 from the external thread 114 of the anchor rod 112.

Figure 15:
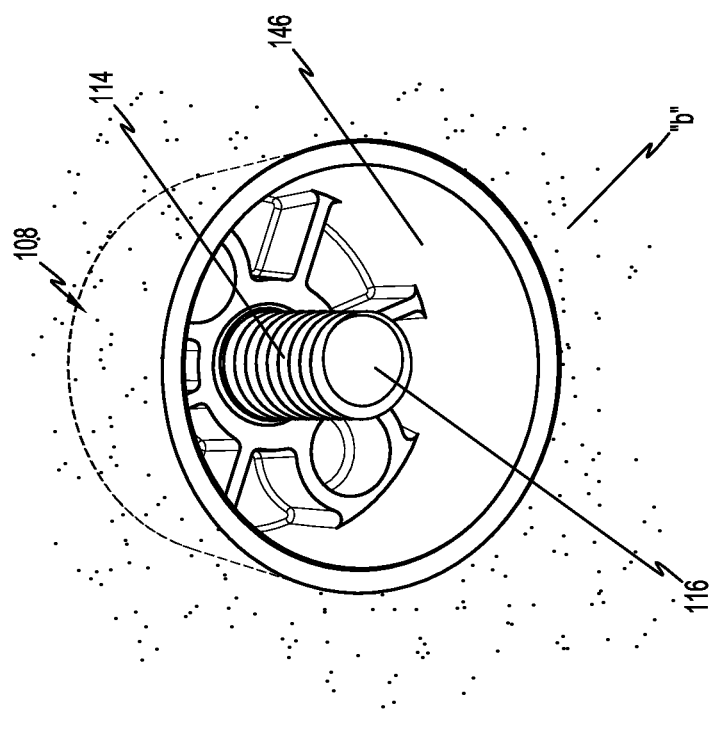
FIG. 15 is a perspective view further illustrating the cover and the external thread exposed upon removal of the form board from the concrete structure in accordance with one exemplary methodology of use of the system.
Figure 14:
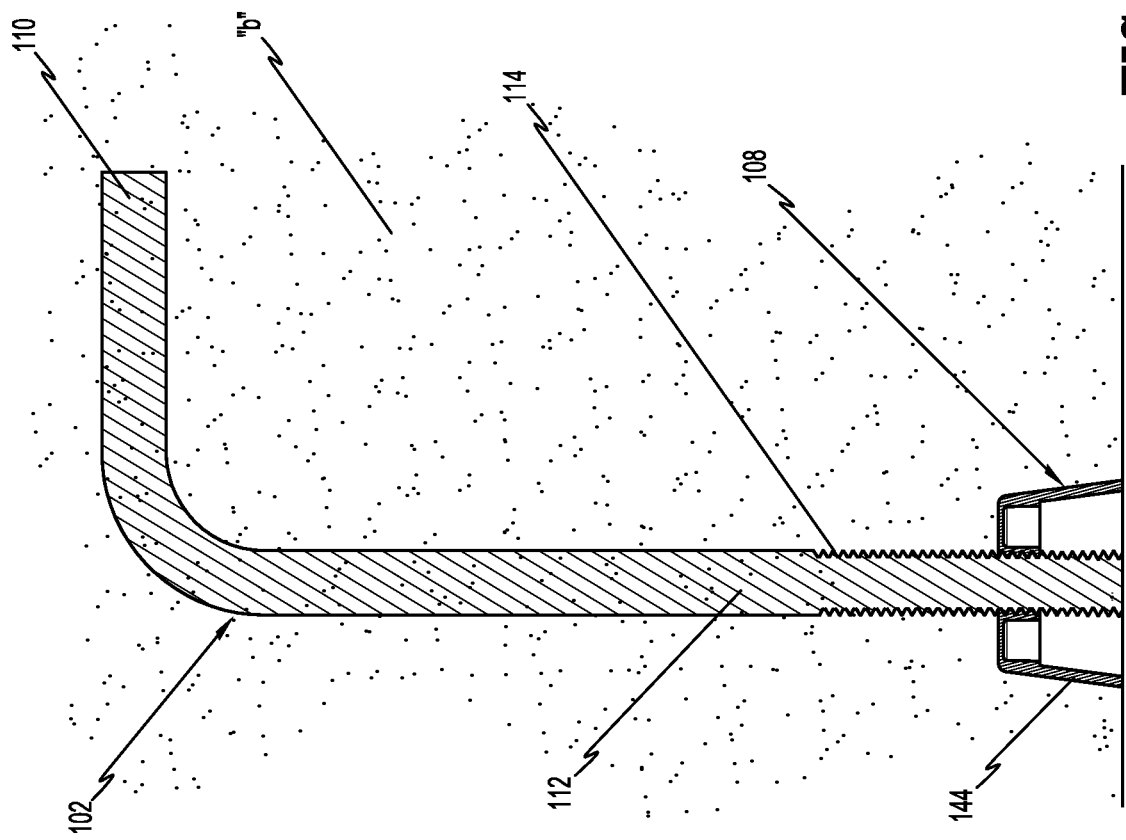
FIG. 14 is a cross-sectional view illustrating one anchor apparatus embedded within the concrete structure with the cover and the external thread of the elongate anchor exposed upon removal of the form board in accordance with one exemplary methodology of use of the system.

With reference to FIGS. 14 and 15, upon removal of the form boards "h", "v", the locking plate 104 and the coupler 106, the cover 108 remains within the horizontal beam "b". This is due to the shoulder fit of the cover 108 or the Morse taper created between the outer cover wall 144 and the cured concrete. As mentioned, the cover 108 prevents ingress of concrete within its internal cavity 146 during curing of the concrete thereby forming an accessible cavity in the horizontal beam "b" through which the end portion of the external thread 114 of the anchor rod 112 extends. Specifically, the external thread 114 is accessible to be coupled to an additional coupling tool, construction tool, mount, safety hook, safety cable or the like. In some embodiments, the cover 108 may be removed or pried from the horizontal beam "b" if desired. In other embodiments, the cover 108 may remain in the cured concrete. FIG. 16 illustrates an internal threaded coupling tool 200 being engaged with the external thread 114 of the anchor 102 and a support or safety hook 300 being threadably engaged with the coupling tool 200. FIGS. 17-18 illustrate the coupling tool 200 and the hook 300 secured relative to the anchor apparatus(es) 100. As shown in FIG. 17, a plurality of anchors 102 and hooks 300 may be secured along the horizontal support beam "b" to support materials, supplies, or safety equipment (e.g., perimeter cable) each identified schematically as reference numeral 400, which, again, is inclusive of electrical lines, plumbing, sprinklers, ductwork, safety cable, safety hooks or netting etc. It is also envisioned that separate rows of anchors 102 may be positioned for utilization by different construction personnel, e.g., row "r1" of the anchor apparatuses 100 may be used by the electrician, row "r2" of the anchor apparatuses 100 may be used by the plumber, etc. It is also further envisioned that the covers 108 could be color-coded, e.g., "red to identify electric, blue for plumbing, orange HVAC, etc." This also enhances usability and the organizational capabilities of the anchoring system.

Figure 21:
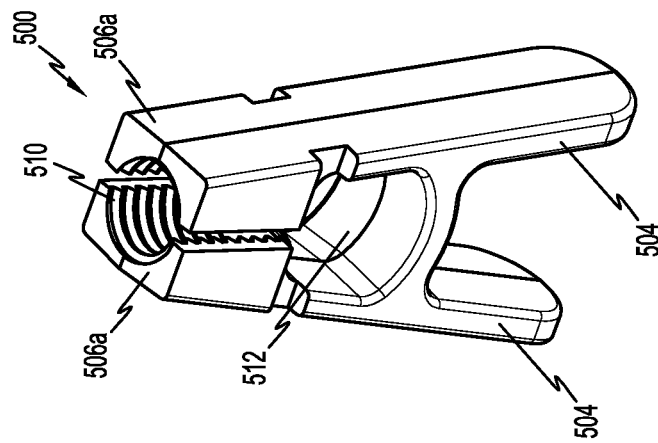
FIGS. 19-21 are front elevation, side and perspective views of an anchor clamp for use with illustrate one exemplary anchor clamp to be secured to the anchor in accordance with one exemplary apparatus and methodology of use of the system.
Figure 20:
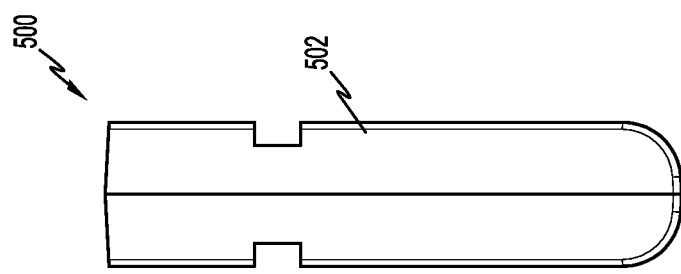
Figure 19:
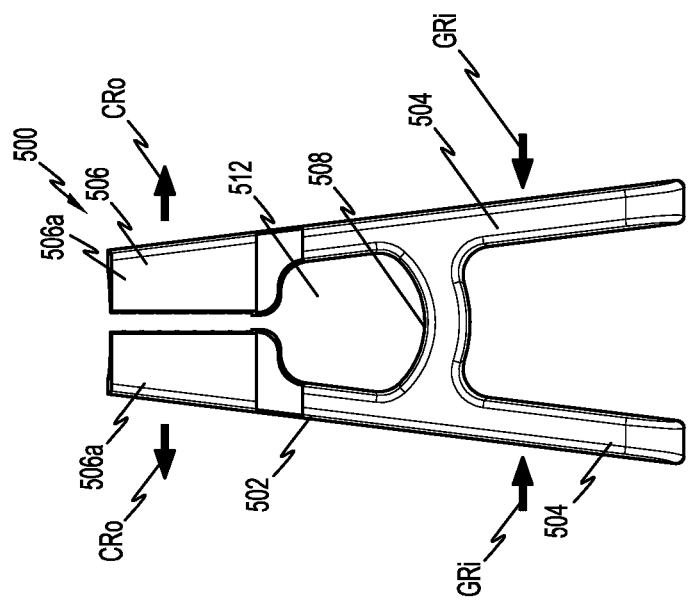

Referring now to FIGS. 19-21, there is illustrated an exemplary anchor clamp for use with the anchor apparatus 100 of the present disclosure. The anchor clamp 500 may be used in lieu of the coupler 200 described in connection with the discussion of FIG. 12-17. The anchor clamp 500 is dimensioned and adapted to support materials, supplies, or safety equipment (e.g., perimeter cable) including electrical lines, plumbing, sprinklers, ductwork, safety cable, safety hooks or netting etc. In one exemplary application, the anchor clamp 500 is utilized to support electrical cables or lines when one or more of the anchor clamps 500 are secured to respective ones or more of the construction apparatuses 100. The anchor clamp 500 includes a main body 502 having at one end a pair of levers or grips 504 at one end and, at its other end, an anchor coupler 506. The grips 504 are interconnected by a bridge 508. The anchor coupler 506 is segmented to define two opposed coupler segments 506a which may move in a radial direction towards and away from each other upon corresponding relative movement of the grips 504. For example, movement of the grips 504 in a radial inward direction (designated by directional arrows GRi) causes corresponding radial outward movement (designated by directional arrows CRo) of the coupler sections 506a in a similar manner to a clothes pin. In one exemplary embodiment, the grips 504 and coupler segments 506a pivot or articulate about the bridge 508 generally, e.g., at the junctures of the bridge 508 and the respective grips 504.

The anchor coupler 506 may include internal structure 510 such as ribs, threads, protrusions, bumps, knurling etc. to assist in engaging the external thread 114 of the elongate anchor rod 112 thereby securing the anchor coupler 506 to the anchor rod 112. In one exemplary embodiment, the internal structure 510 is in the form of alternating ribs and recesses as shown in FIG. 21. In another exemplary embodiment, the internal structure may include threading.

The anchor clamp 500 may be made of any suitable material. In one exemplary embodiment, the anchor clamp 500 is formed of two half sections secured to each other via conventional means including screws, adhesives, snap fit, etc. In the alternative, the anchor clamp 500 may be monolithically formed of a polymeric material. In its initial or at rest condition, the anchor clamp 500 assumes the condition depicted in FIGS. 19-21. In the initial condition, the anchor coupler 506 of the anchor clamp defines an internal dimension at least equal to or less than the diameter of the external thread 114 of the anchor apparatus 100 to establish a secured relation with the external thread 114 of the anchor apparatus 100. The secured relation is enhanced via engagement of the internal structure 510 (e.g., the ribs, recesses and/or threading) with the external thread 114 of the anchor apparatus 100. Upon movement of the grips 504 toward each other (directional arrows GRi), the coupler segments 506a are displaced (directional arrows CRo) to increase the internal dimension of the anchor coupler 506 for placement about the external thread 114 of the anchor rod 112. Release of the grips 504 causes the anchor clamp to move towards its initial condition with the internal structure 510 of the anchor coupler 506 locking onto the external thread 114 of the anchor 102.

In addition, the main body 502 of the anchor clamp 500 defines a passage 512 extending between the bridge 508 and the anchor coupler 506. The passage 512 may receive electrical cables or lines therethrough thereby securing the cables along the ceiling, wall or column to which the anchor apparatuses 100 are secured as discussed hereinabove.

Figure 22:
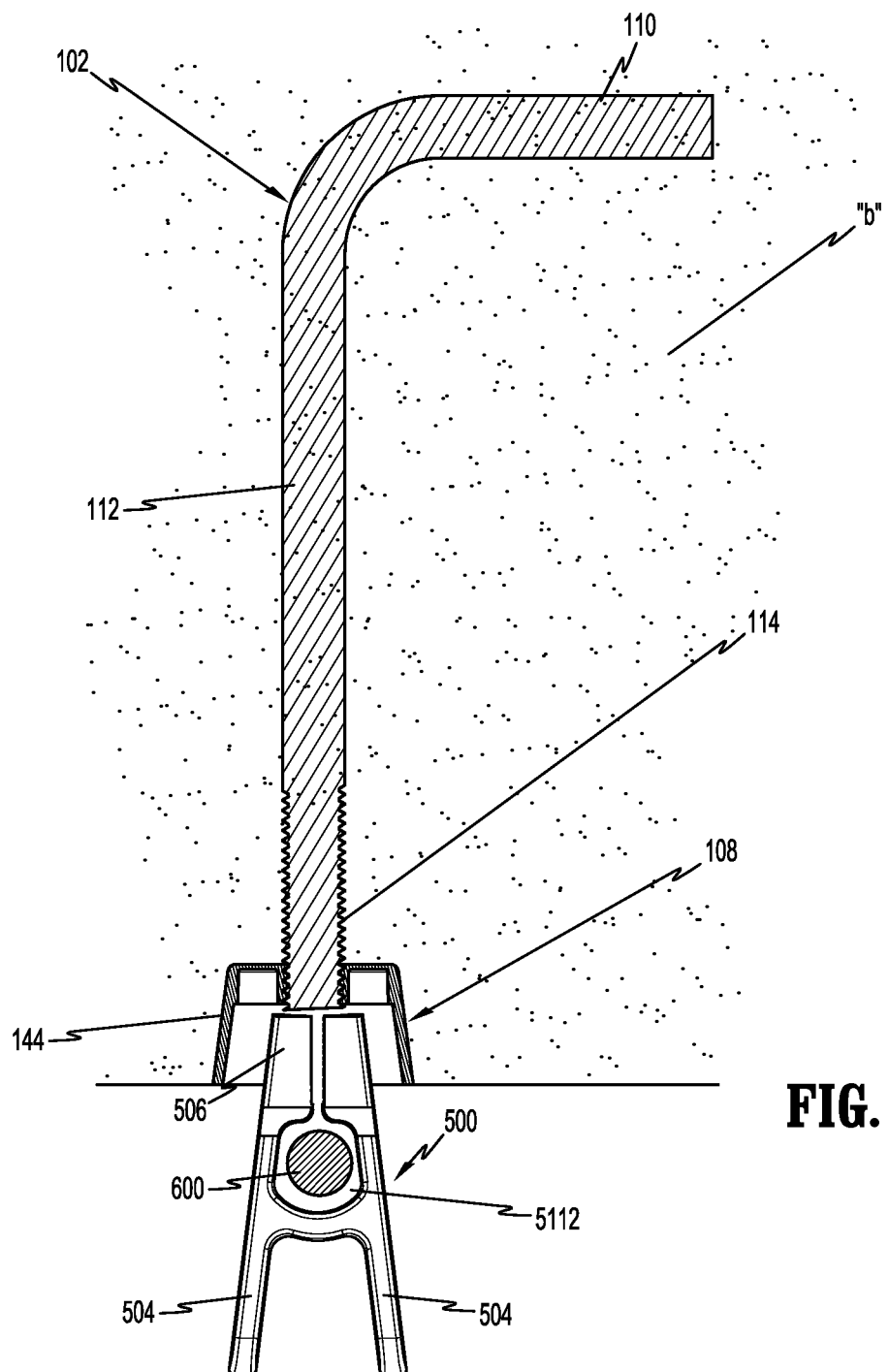
FIG. 22 is a view illustrating the anchor clamp of FIGS. 19-21 mounted to an anchor of an anchor apparatus in accordance with one exemplary methodology of use of the system.
Figure 25:
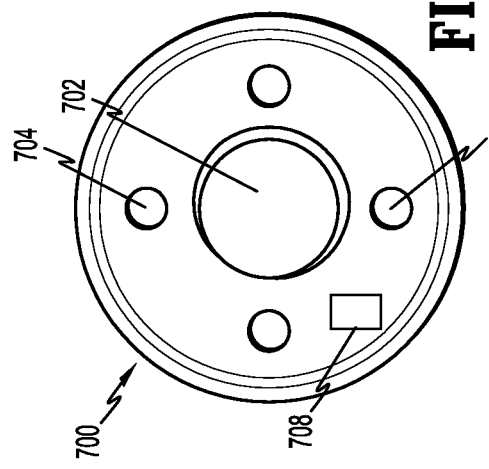
FIG. 25 is a top plan view of the locking plate of FIGS. 23-24.
Figure 26:
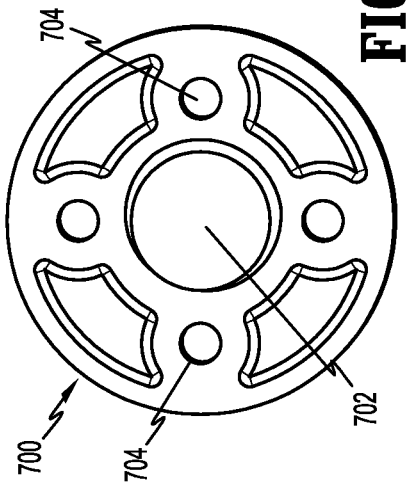
FIG. 26 is a bottom plan view of the locking plate of FIGS. 23-25.
Figure 23:
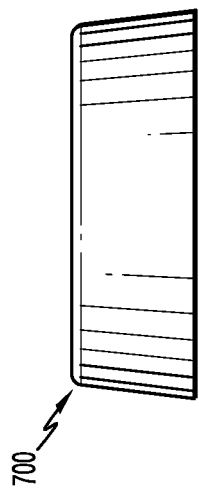
FIG. 23 is a side elevation view of another embodiment of a locking plate for use with the anchor apparatus of the present disclosure.
Figure 24:
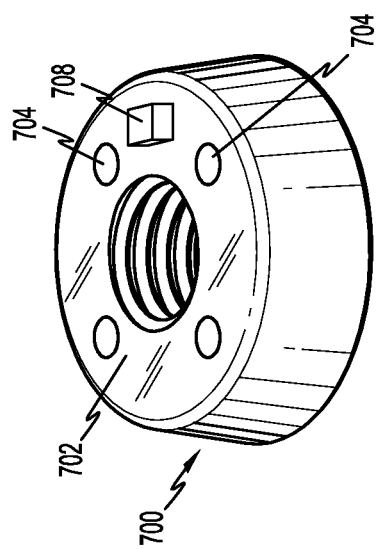
FIG. 24 is a perspective view of the locking plate of FIG. 23.

FIG. 22 illustrates the anchor clamp 500 secured to the external threading 114 of the anchor rod 102 of one anchor apparatus. Also shown schematically is an electrical cable/lines 600 extending through the passage of the anchor clamp 500. In use, the anchor clamp 500 initially may be secured to the external threading 114 of the anchor rod 102 and the cable 600 passed through the passage 512. In the alternative, the cable 600 may be passed through the passage 512 followed by mounting of the anchor clamp 500 to the anchor rod 102. It is envisioned that a multitude of anchor clamps 500 may be secured to an anchoring system such as that disclosed in connection with the discussion of FIGS. 12-17 to run electrical cables along columns, ceilings, walls, etc. The anchor clamp 500 obviates the need for the coupling tool 200. Specifically, as discussed hereinabove, the anchor clamp 500 may be secured directly to the anchor rod 102 of each anchor apparatus 100.

In an alternate embodiment, the anchor coupler 506 may include an internal thread as the internal structure, which is dimensioned to threadably engage, via relative rotation of the anchor clamp 500 about the external thread 114 of the anchor 102, to secure the anchor clamp 500 to the anchor 102.

Referring now to FIGS. 23-26, another embodiment of the locking plate of the anchor apparatus 100 is illustrated. The locking plate 700 is similar to the locking plate of FIGS. 3A-3C, but includes an internal threaded aperture 702. The internal threaded aperture 702 extends at least partially through the locking plate. In embodiments, the internal threaded aperture 702 extends completely through the locking plate 700 The internal threaded aperture 702 directly cooperates with the external thread 114 of the elongate anchor rod 112 to secure the elongate anchor rod 112 to the locking plate 700. Thus, in accordance with this exemplary embodiment, the keyed slots 122 present in the locking plate 104 of FIGS. 3A-3C are not required. In addition, there is also no need for the coupler 106 in that the anchor rod 112 is secured through the threaded cooperation of its external thread 114 with the threaded aperture 702 of the locking plate 700. In some methodologies, the elongate anchor rod 112 will screw down through the threaded aperture 702 to abut the form board. In certain embodiments, the elongate anchor rod 112 will be rotated such that the external thread 114 at least partially penetrates the form board. The locking plate 700 further includes four fastener openings 704 extending through the locking plate 700 for reception of respective fasteners such as screws or nails utilized to secure the locking plate 700 relative to a form board of a concrete or concrete form. The locking plate 700 may include an RFID tag, either active or passive, and identified schematically as reference numeral 708. The RFID tag 708 will assist in tracking information regarding the installed anchor apparatus 100 and other installation parameters as discussed hereinbelow. In the alternative, or additionally a bar code may be utilized. The locking plate 700 may be removed subsequent to curing of the concrete by rotating the locking plate 700 off the external thread 114 of the anchor rod 112 to permit access to the external thread 114 for subsequent mounting of a tool such as coupling tool 200 or anchor clamp 500 in the manner discussed hereinabove.

Figure 29:
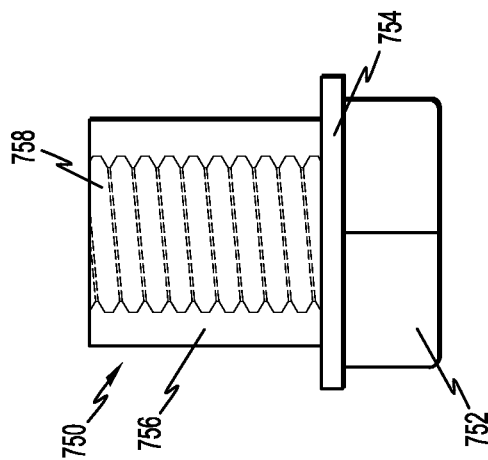
FIGS. 27-29 are first and second perspective views and a cross-sectional view, respectively, of an embodiment of a mount of the present disclosure.
Figure 28:
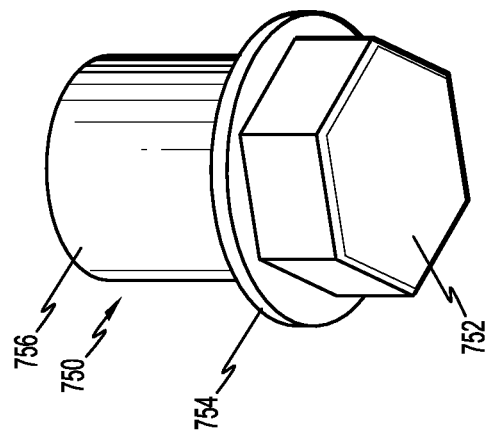
Figure 27:
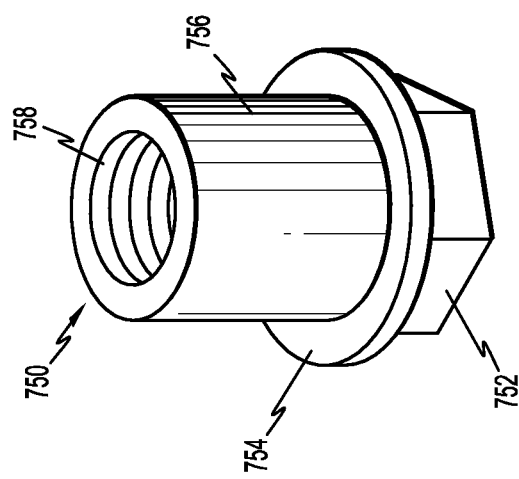
Figure 29A:
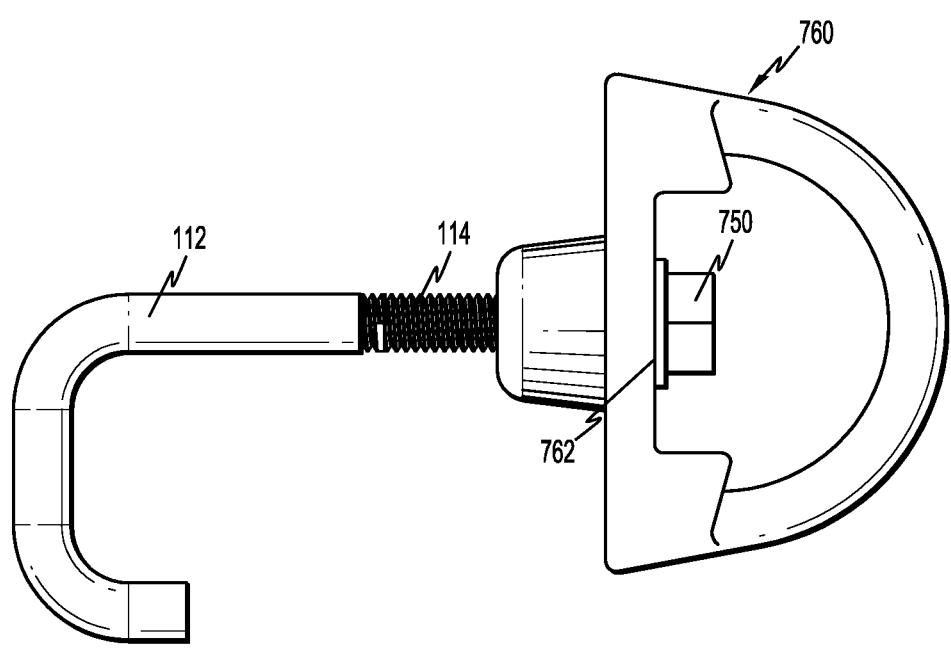
FIG. 29A illustrates a ring support mounted to the anchor apparatus.

Referring now to FIGS. 27-29, another embodiment of a device 750 for mounting to the exposed external thread 114 of the elongate anchor rod 112 subsequent to pouring and curing of the concrete column is illustrated. The device 750 will be used in lieu of, or prior to, use of the coupling tool 200 or the anchor clamp 500 discussed hereinabove. The device 750 includes a head 752 (for example, a hexagonal shaped head), a collar 754 and an internally threaded cylinder 756. The device is mounted to the external thread 114 of the elongate anchor rod 112 through threaded engagement of the internal thread 758 of the threaded cylinder 756. The device 750 may be color coded to identify the type of equipment (e.g., electrical, plumbing, ductwork, etc.), to be coupled to the anchor apparatus as discussed hereinabove. The device 750 may also protect the external thread 114 of the anchor rod 112 prior to mounting another coupling tool or an anchor clamp such as, for example, the coupling tool 200 or the anchor clamp 500 discussed hereinabove. The device 750 may be used to secure various coupling tools to the external thread 114 of the anchor rod 112. For example, with reference to FIG. 29A, the device 150 may be used to secure a ring support 760 to the anchor apparatus 100. A lock washer 762 may be utilized to facilitate securement of the ring support 760 relative to the external thread 114 of the anchor apparatus 100. The ring support 760 may assume various configurations including, but not limited to, semicircular, oval ring, etc. designs. It is envisioned that various cables, plumbing equipment, HVAC components may be passed through the openings of the ring support 760.

In other embodiments, the elongated anchor rod 112 may include an internal thread as opposed to an external thread. The internal thread may couple with external threaded coupling tool, anchors or devices much in the same manner as the prior embodiments. Alternatively, other connection mechanisms for the anchor rod 112 and a coupling tool are envisioned including, but not limited to, bayonet couplings, snap fit connections, friction tolerances etc. and as appreciated by one skilled in the art.

Figure 30:
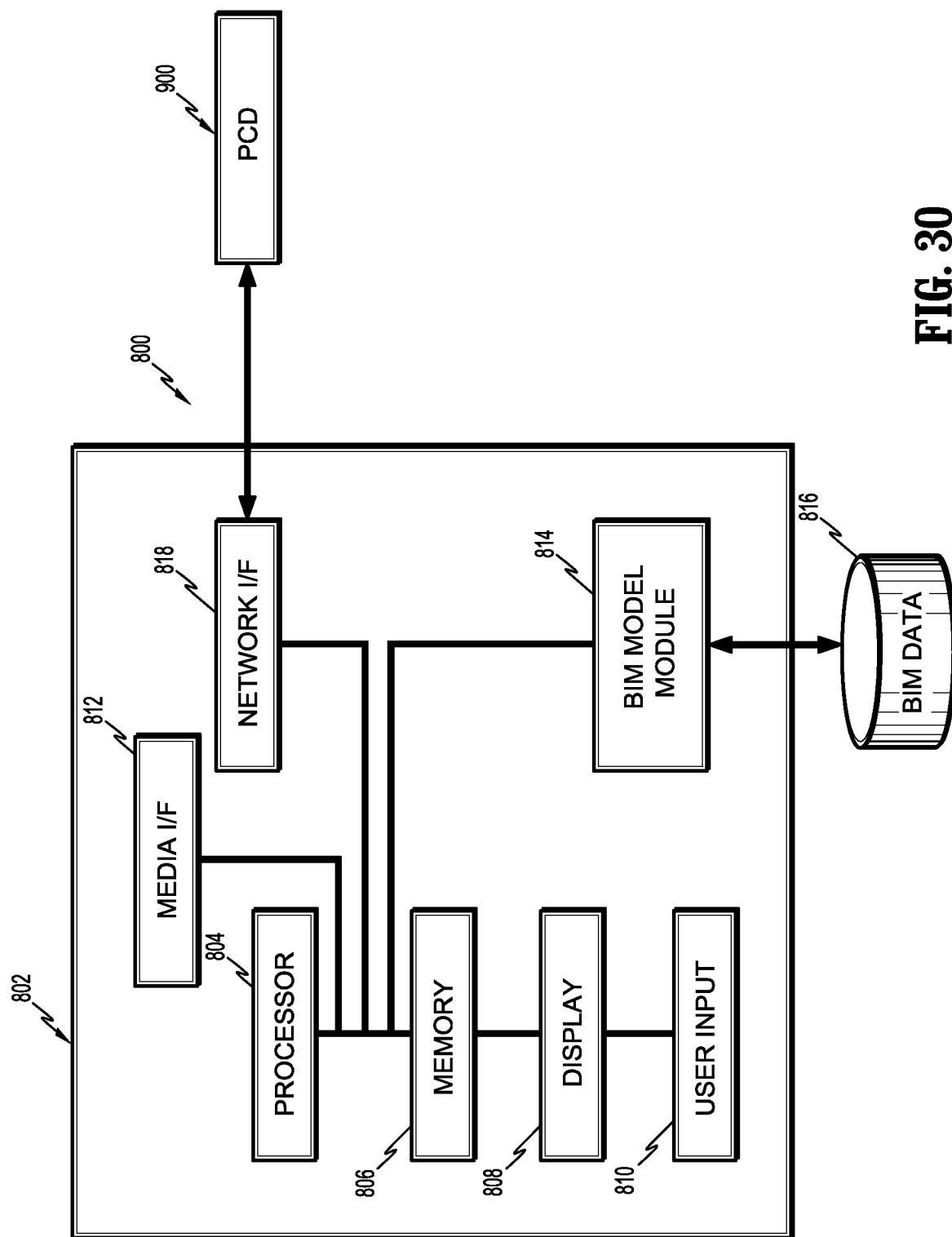
FIG. 30 illustrates a computer system for installation of the anchor apparatuses in accordance with which one or more embodiments of the invention can be implemented illustrating the server and the portable computing device in communication with the server.

Referring now to FIG. 30, there is illustrated framework of a comprehensive system and methodology for installation of equipment at a construction site in accordance with one or more embodiments of the present disclosure. In one exemplary embodiment, the system and methodology 800 will be discussed in conjunction with the installation of any of the anchor apparatuses 100 of the present disclosure described hereinabove. However, it is to be appreciated that the system and methodology 800 may have different applications, and can be implemented in the installation of any type of construction equipment. In general, the system and methodology include utilizing Building Information Modeling (BML) to develop a model, for example, a 2-D or 3-D model, of the building to be constructed or which is in a partial construction phase, as a template to assist construction personnel in the proper positional installation of the anchor apparatuses 100. In particular, the model will be utilized to ensure the accurate installation of a plurality of anchor apparatuses 100 at predetermined locations within the construction site as set forth in accordance with the plan, design, existing build codes, OSHA requirements, etc. In general, the model will be available through a wireless connection and/or the Internet to be accessed by a portable computing device including, for example, a smartphone, tablet, portable computer, iPhone, etc. (hereinafter, referred to as a PCD) carried by construction personnel, mounted to an actuator or mounted to a telerobot, to assist in identifying the proper location for installation of all anchor apparatuses 100 for any of the equipment installation applications mentioned hereinabove. The software for generating the model with positional indicators for the anchor apparatuses may be available as a downloaded application on a subscription basis. In certain applications, the positional indicators of the respective anchor apparatuses 100 to be installed will be incorporated into the model as input subsequent to the generation of the model as, for example, an overlay, or initially incorporated as data used to generate the original model. It is further envisioned that the model may be continuously updated in response to input from the field, for example, based on data obtained by the PCD at the construction site.

The system and methodology 800 comprise a main server 802 and the aforementioned PCD 900. The main server 800 including a controller or processor 804 having memory 806 with software or logic programmed to perform the various functions associated with the afore-described detection and positional processes. The server 802 includes a visual or graphical display 808, a user input 810 such as a computer keyboard and/or mouse and a media interface 812 (e.g., wireless or electrical/mechanical connection such as a USB port or a CD-ROM) to permit import of program instructions in accordance with embodiments of the present application. These components are well known in the art and require no further discussion.

The system further includes a Building Information Management (BIM) data management module 814 coupled to a BIM database 816. The BIM database 816 includes the data utilized in the development of the models or maps, including 2-D or 3-D modeling of the building, to be constructed or developed, or which may be in a partial construction phase. The model to be generated by the BIM module 814 is typically detailed with respect to the design, development and construction documentation of building assemblies, systems, equipment and components including heating, HVAC, plumbing, electrical, concrete construction columns, steel I-Beams, flooring, etc. Preferably, the constructed model or models are as complete as possible to include all building assemblies, systems, equipment and components. In exemplary embodiments, the model or models generated by the BIM module 814 include the locations of all the anchoring apparatuses 100 to be installed at the construction site for all equipment applications. The data pertaining to the positional indicators for anchor apparatus location may be available as data within the BIM database 816 when the model is first generated by the BIM module 814. Alternatively, or additionally, this data can be input via the user input and/or interface 810 and incorporated subsequently into the model. As a further alternative, feedback received from the PCD 900 may be incorporated into the model to update the model as the installation of the anchor apparatuses progresses.

The server 802 furthers include a network interface I/F 818 which enables communication, wireless or wired, between the server 802 and the PCD 900 at the construction site. Thus, the network I/F 818 will direct the data to be received and potentially displayed by the PCD 900, and will receive data from the PCD 900. The data may be inclusive of only certain portions of the model(s) of interest to construction personnel, e.g., the areas of the building requiring installation of the anchor apparatuses, or include model(s) of the entire building to be constructed. The network I/F (which can include, for example, modems, routers and Ethernet cards) enables the system to couple to other data processing systems or devices (such as remote displays or other computing and storage devices) through intervening private or public computer networks (wired and/or wireless).

As used herein, the term "processor" refers to one or more individual processing devices including, for example, a central processing unit (CPU), a microprocessor, a microcontroller, an application-specific integrated circuit (ASIC), a field programmable gate array (FPGA) or other type of processing circuitry, as well as portions or combinations of such circuitry elements.

Additionally, the term "memory" refers to memory associated with a processor, such as, for example, random access memory (RAM), read only memory (ROM), a removable memory device, a fixed memory device, and/or a flash memory. Media interface I/F 812 may be an example of removable memory, while the other types of memory mentioned may be examples of memory 806. Furthermore, the terms "memory" and "media" may be viewed as examples of what are more generally referred to as a "computer program product." A computer program product is configured to store computer program code (i.e., software, microcode, program instructions, etc.). For example, computer program code when loaded from memory 806 and/or media interface I/F 818 and executed by processor 804 causes the device to perform functions associated with one or more of the components and techniques of system 800. One skilled in the art would be readily able to implement such computer program code given the teachings provided herein. Similarly, the components and techniques described herein may be implemented via a computer program product that includes computer program code stored in a "computer readable storage medium." Other examples of computer program products embodying embodiments of the invention may include, for example, optical or magnetic disks. Further, computer program code may be downloaded from a network I/F 918 executed by the system.

Still further, the I/O interface formed by devices 1106 and 1108 may be used for inputting data to the processor 804 and for providing initial, intermediate and/or final results associated with the processor 804.

Figure 31:
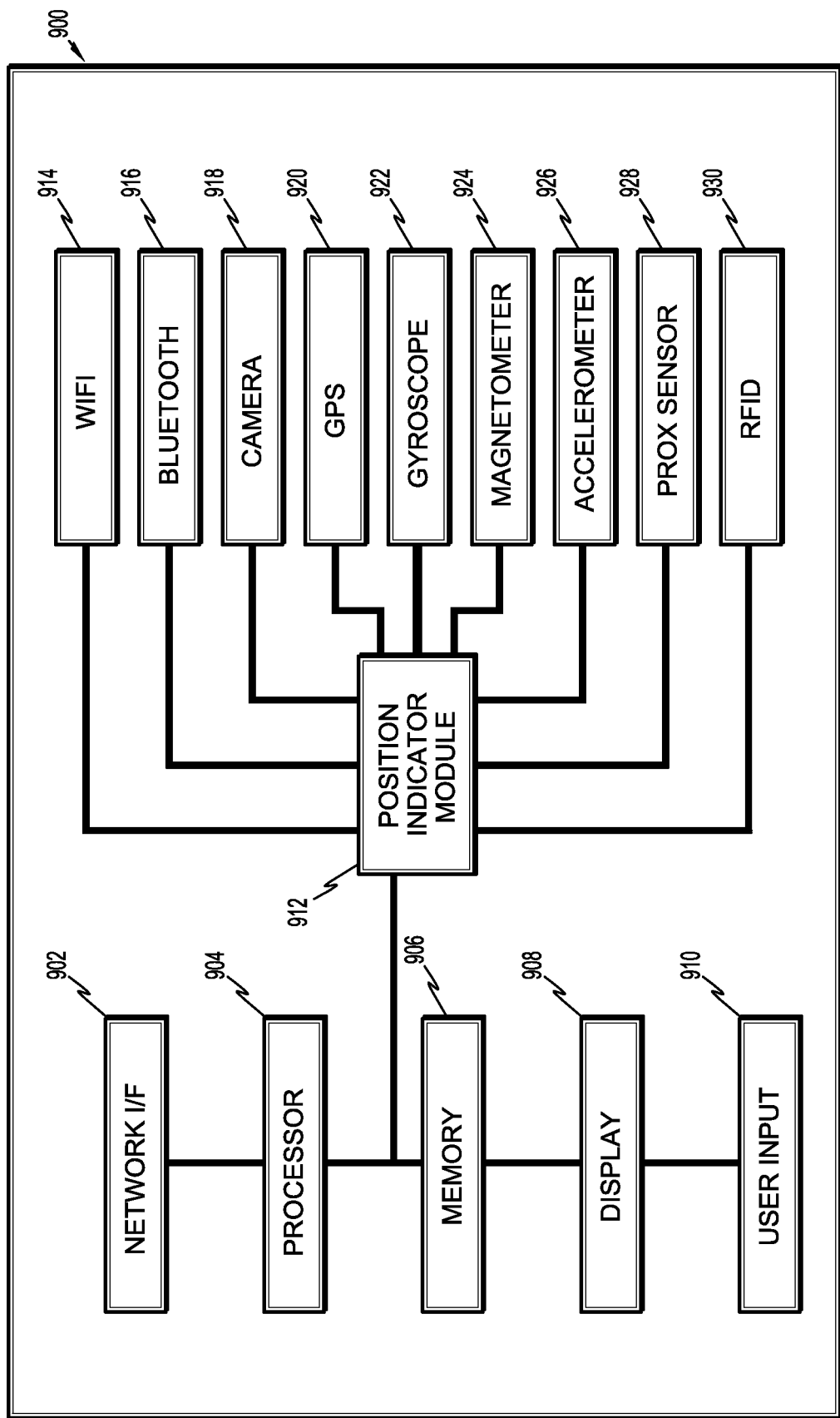
FIG. 31 illustrates the portable computing device of the system of FIG. 30.

Referring now to FIG. 31, the PCD 900 will be discussed. The PCD 900 will include the requisite hardware components to communicate or interact with the server 802. The PCD includes a network interface I/F 902 having wireless capabilities (e.g., 4G or 5G) to enable wireless communication with the network I/F 818 of the server 802 or any wireless systems installed at the construction site. Alternatively, the connection to the server 802 may be through a wired network utilizing Ethernet cables, multiple routers, switches etc. to transfer data. The PCD 900 includes a conventional processor 904 and a memory 906 which stores software instructions that are executable by the processor 904.

The PCD 900 further includes a display 908 such as a LED or LCD screen to display the model data and a user input 910 in the form of, for example, a mouse, keyboard or touchscreen to input data. The PCD 900 further includes a position indicator module 912 configured to determine the location or position of the PCD 900 relative to the model generated by the BIM model module 814 of the construction building/site. In one exemplary embodiment, the position indicator module PCD 912 requires installation of a proprietary application downloaded by a user to the memory 906 of the PCD 900, for example, on a subscription basis. In certain embodiments, access to the application may be tiered, i.e., certain tiers may have higher functionality than other tiers resulting in a higher subscription price for the higher function tiers. Alternatively, or additionally, an existing web browser hosting the application may be available. The position indicator module 912 can include any type of software capable of receiving input from various sensors or components associated with the PCD 900 to determine the location of the PCD 900 relative to the construction or building site model.

Any conventional outdoor and/or indoor positioning systems as components of the position indicator module 912 are contemplated, and can be incorporated into the position indicator module 912 to determine the precise location of the PCD 802.

The PCD 900 further includes a plurality of sensors or components which may be utilized individually, or in combination as positioning systems, to track the location of the PCD 900 relative to the generated building model and to provide data relevant to the anchor installation process back to the server. These sensors include, but are not limited to WIFI 914, Bluetooth 916, a camera 918, a Global Position System (GPS) sensor 920, a gyroscope 922, a magnetometer 924, an accelerometer 926, a proximity sensor 928 and a radio frequency identifier device or sensor (RFID) 930. These sensors are incorporated in most commercially available smartphones, tablets, portable computers.

In certain embodiments, to track the PCD 900 relative to the generated model of the building, the GPS sensor 920 is utilized in a conventional manner. The GPS sensor 920 is effective in open construction where a direct line of sight to the PCD 900 is available. Cellular-based triangulation methodologies with GPS are also envisioned. In other embodiments, a WIFI positioning methodology such as WPS or Wipes/WFPS may be utilized with the WIFI 914, individually, or in combination with the GPS capabilities, by tracking the location of the PCD 900 relative to nearby known Wi-Fi hotspot(s), one or more of which may be installed at the commercial site. Bluetooth Low Energy (BLE) technology may be utilized where signals from reference beacons disposed at the commercial site are at the core of the indoor location technology. The PCD 900 detects the signal from the beacon with the Bluetooth 916 and can calculate roughly the distance to the beacon and hence estimate the location of the PCD 900. This data is sent along with the location signal to the reader. Active RFID location tracking systems utilizing active or passive RFID tags positioned as known reference points detectable by the RFID or module 930 are also envisioned.

In other exemplary embodiments, the magnetometer 924 of the PCD 900 may be utilized individually or to augment the other methodologies where a "fingerprinting" technology is used to map the magnetic fields at the construction site and then the magnetometer 924 can use that map to find the location of the PCD 900 relative to the generated map. In other embodiments, an inertial navigation methodology may be utilized that incorporates the accelerometer 926 and the gyroscope 922 of the PCD 900 to continuously calculate the position, the orientation, and the velocity (direction and speed of movement) of the PCD 900 based on an initial reference or known starting point. A visual positioning methodology including the camera 918 of the PCD 900 can determine the location of a PCD 900 by decoding location coordinates from visual reference markers which are encoded with the marker's location coordinates.

Exemplative location methodologies are disclosed in U.S. Pat. No. 9,539,164 to Sanders and U.S. Pat. No. 9,749,780 to Huang et al., the entire contents of each disclosure being incorporated by reference herein.

In other embodiments, an infrared (IR) sensor station may be mounted to, for example, a tripod and calibrated. Light is emitted from an IR LED reflects off, for example, the PCD 900 or a component to which the PCD is mounted and is captured by a detecting photodiode to produce a signal that is a function of the distance between the sensor and the surface. This technology can be used individually or in concert with the aforementioned GPS and position sensors discussed hereinabove to properly locate one or more subsequent anchor placement positions based on a previously stored reference anchor apparatus or some other known reference point within the construction site.

In another aspect of the present disclosure, the RFID sensor 930 of the PCD 900 may be utilized to scan RFID tags mounted to, or associated with, the components of the anchor apparatuses 100 such as tag or code 109 mounted to the cover 108 (FIGS. 5A-5C) or RFID tag 708 of the locking plate 700. Scanning of the RFID tags with the RFID sensor enables the system 900 to gather information and data concerning the anchor apparatuses that are installed or need to be installed. The data may include, but is not limited to, manufacturer of the components of the anchor apparatuses, lot numbers, manufacture date, installer, installation date and any other metadata which may be useful to track and forward installation and product details back to the server 802 or the PCD 900. This information would be invaluable for record keeping purposes, progression of anchor installation, etc.

Figure 32:
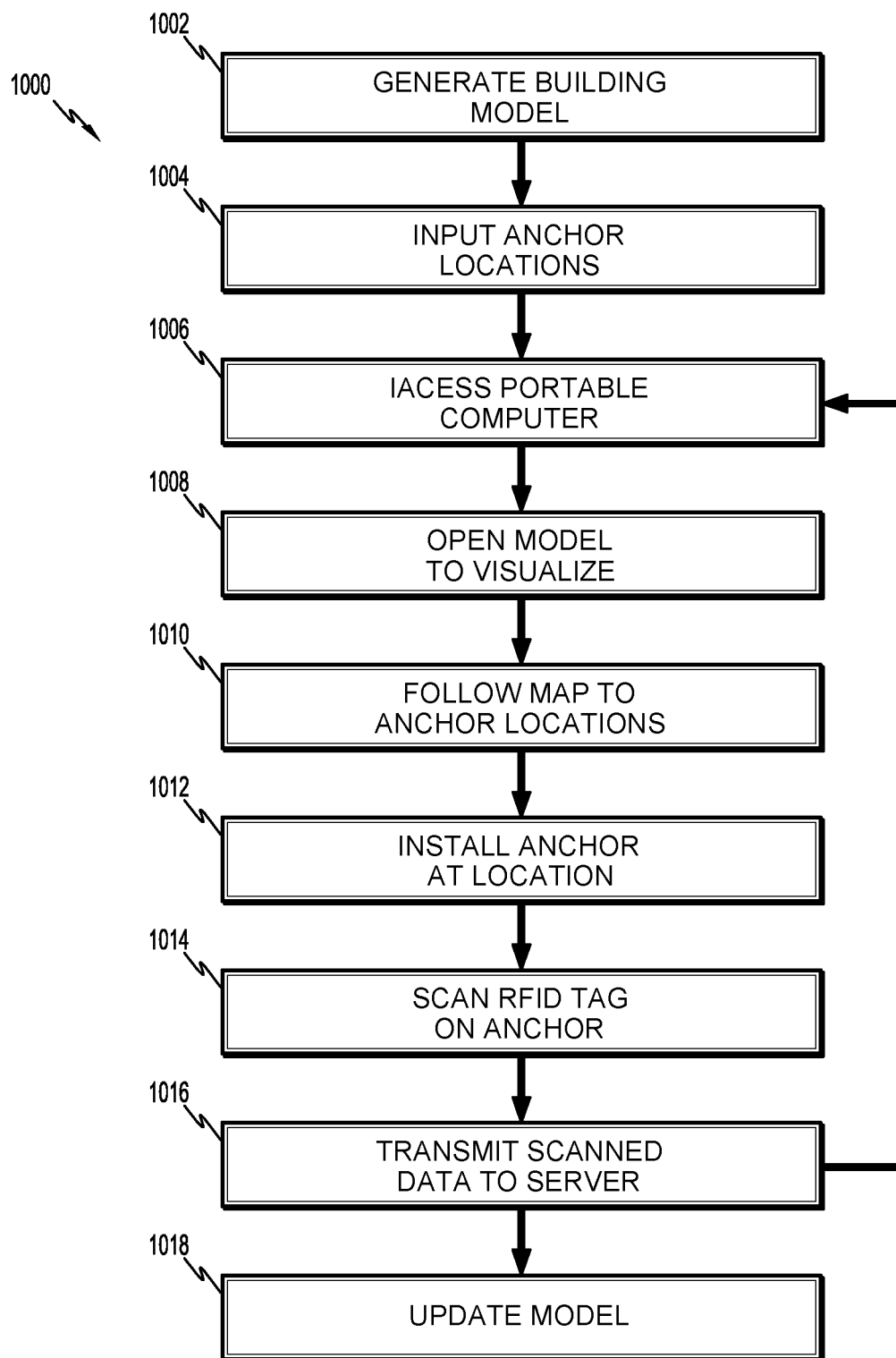
FIG. 32 is a flow chart illustrating a system and methodology for use in conjunction with the computing system for installation of the anchor apparatuses.

Referring now to FIG. 32 a basic flow chart 1000 illustrating a method for installation of the anchoring apparatuses in accordance with an exemplary embodiment of the present disclosure is illustrated. In STEP 1002, a building model, for example, a 3-D model, of the building is developed by the BIM Module 814 utilizing conventional building model techniques. In STEP 1004, data is input into the building model to indicate the locations of the sets of anchoring apparatuses to be installed in the building. As mentioned above, each set of anchoring apparatuses may be assigned to a variety of construction equipment including, but not limited to heating, ventilating, HVAC, electrical, plumbing, safety fences, etc. In certain embodiments, the position indicators for the anchoring apparatuses may appear as an overlay on the map. In other embodiments, the anchor position indicators may be built into the map in STEP 1002. It is further envisioned that STEP 1004 may be combined and data concerning anchor position indicators incorporated into the original model. Each set of anchoring apparatuses 100 may be located within the model of the building site, e.g., the structural concrete columns and supports, at any predefined locations thereby providing a mechanism to eventually install the equipment in an orderly manner without any concerns of misalignment, interference, etc. of the equipment. Moreover, the layout of the equipment to be installed is readily visible via the generated model to personnel at the server 802 end and at the PCD 900 end. In addition, if any adjustments are needed with respect to the location of any of the anchor apparatuses 100, this may be accomplished via the input at the server 802 end or alternatively at the PCA 900 end.

Figure 33:
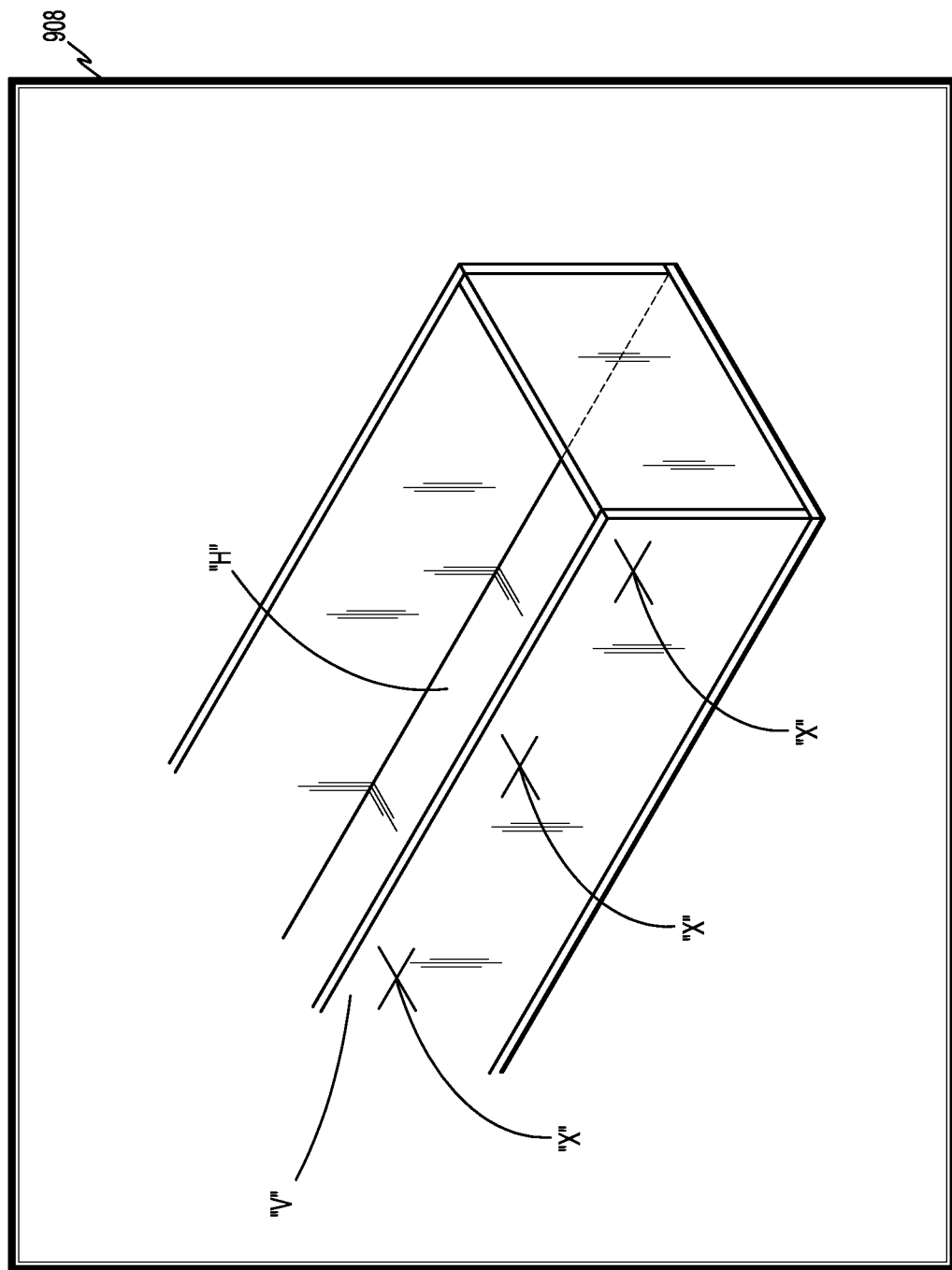
FIG. 33 illustrates a visual display of the portable computing device identifying locations for installation of the anchor apparatuses.

In STEP 1006 the user accesses the PCD and opens the model on the PCD 900 (STEP 1008) and visualizes the locations of the anchor apparatuses 100 the operator is responsible to install. Following the model or map, the operator proceeds to the set of anchoring apparatuses guided by any of the positioning systems discussed hereinabove. (STEP 1010). For example, with reference to FIG. 33, which is similar to FIG. 12, the visual display 908 of the PDA may present a 3-D model at least inclusive of the vertical boards "v" and the horizontal form board "h", and the surrounding environment to the user. The visual display may be indexed, for example, with display cross-hairs "x" corresponding to the positional locations where anchor apparatuses are to be installed. In embodiments, it is envisioned that the PCD 900 may provide in addition to visual indicia of the location of the visual indicators, an audible indicator (e.g., a beep, a voice indicator), vibrate, activate the light within the PCD 900 or any other means inclusive, but not limited to tactile or visual indicators when the PCD 900 is at the proper location at which the anchor apparatus needs to installed. The installer then installs the anchoring apparatuses in the concrete form board as discussed hereinabove at least in connection with FIGS. 6-16. (STEP 1012).

In addition, operator scans with the RFID scanner 930 of the PCD the RFID tags associated with the various components of the anchoring apparatus. (STEP 1014) The data obtained by the RFID tag or bar code may be stored in the PCD 900 and/or transferred back to the server 802 either through instruction by the operator or automatically. (STEP 1016). The data obtained by the RFID scanner 930 provides at least two benefits: 1) provides the metadata associated with the installed anchor apparatus including manufacture, installer, installation date, lot number etc. for record keeping purposes: and 2) provides an indicator that the anchor apparatus at this location has been installed. In STEP 1018, the model is updated to include the information obtained by the RFID scanner 930. The operator then continues to install additional anchor apparatuses 100 following the original or the updated model to the next anchor position displayed on the model and installs an additional anchor apparatus 100 in the same manner. The operator proceeds to the subsequent position indicators for each of the anchoring apparatuses of the set and repeats at least STEPS 1010-1016 for each anchor apparatus 100.

The procedure set forth in the flow chart of FIG. 32 may be repeated for each set of anchoring apparatuses 100. For example, the first set may be installed to support electrical cable. The second set may be installed to support plumbing equipment, etc. The third set for installing HVAC equipment etc. It is envisioned that the model may incorporate different colors as anchor position indicators to correspond with respective equipment to be installed. For example, red to identify electric, blue for plumbing, orange HVAC, etc. Alternatively, or additionally, the model data forwarded from the server end may include only those anchor position indicators associated with installation of a particular equipment.

Thus, as each anchor apparatus or set of anchor apparatuses is installed, this information is conveyed from the PCD 900 to the server 802. The BIM model is updated (STEP 1018) to reflect the installation of the selected anchor apparatuses 100. It is envisioned that the updated model may incorporate indicia distinguishing anchor locations where an anchor apparatus has been installed anchor apparatus 100 and those positions devoid of an installed anchor apparatus 100. For example, an installed anchor apparatus 100 may be indicated as a green circle or dot around the anchor location position on the model and those anchor location positions without an installed anchor apparatus 100 would be labeled with a red circle or dot on the model, or alternatively an installed anchor apparatus 100 would be indicated as a solid circle while an uninstalled anchor apparatus 1000 would be an open circle. Other visual indicators are also envisioned. Thus, the operator can view the status of the anchor installation process and identify those anchors positions needing installation of an anchor apparatus 100.

It is to be appreciated that the flow chart of FIG. 32 includes STEPS that may be combined, may be performed in a different order than as outlined in the chart, and/or some of the STEPS may be omitted.

Figure 34:
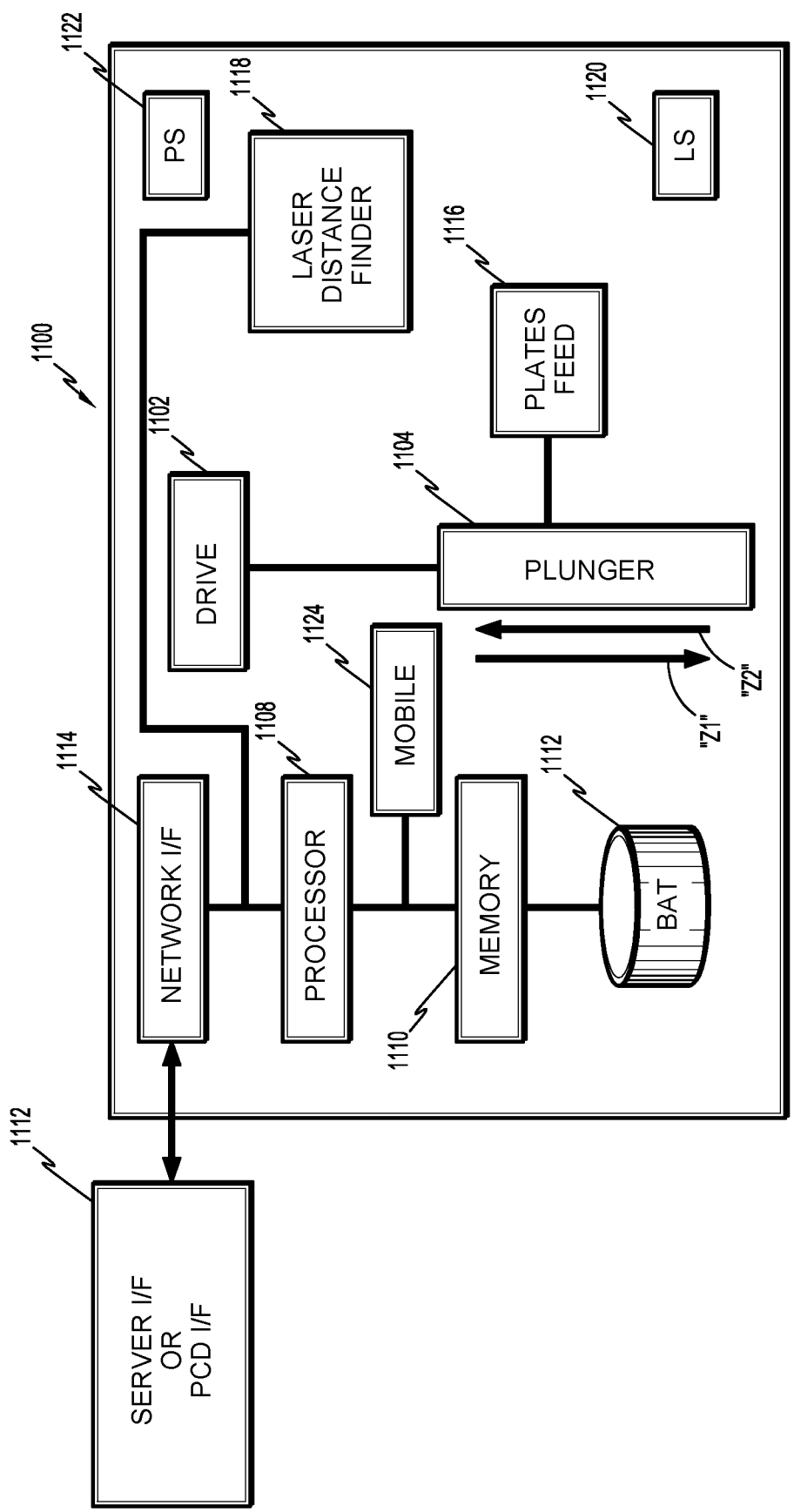
FIG. 34 illustrates an exemplary embodiment of an actuator used in installation of the anchor apparatuses.

As a further aspect of the present disclosure, an actuator 1100 is provided to automatically install the fasteners of the lock plate into the form work. FIG. 34 schematically illustrates one exemplary actuator 1100 in accordance with the present disclosure. This actuator 1100 may include any power drive mechanism 1102 coupled to a plunger 1104 adapted for reciprocal movement in the direction of directional arrows z1, z2. The drive mechanism 1100 may include, hydraulic, electric pneumatic, magnetic, mechanical, spring-based mechanisms. In certain embodiments, the PCD may be directly mounted to the actuator 1100. The actuator 1100 may have a self-feeding mechanism 1106 where locking plates 104, 700 with mounted fasteners are loaded into a chamber of the actuator 1100 and sequentially positioned on the form work at the desired anchor location position. The actuator 1100 may be initiated whereby the plunger 1104 coupled to the drive 1002 of the actuator 1100 advances in the direction "Z1" to deposit the locking plate 104, 700 at the anchor location and drives the fasteners through the fastener receiving apertures and into the form work. One apparatus which may be adapted to self-feed the locking plate and nails or fasteners is disclosed in U.S. Pat. No. 6,302,310 to Lamb, the entire contents of which are incorporated by reference herein.

The actuator 1100 may include a processor 1108 coupled with memory 1110 and a battery 1112 for operating the actuator. In addition to controlling movement of the plunger 1104, the processor 1108 may monitor storage life of the battery 1012, number of anchor installations and control operation of an indicator such as a visual indicator apprising the operator of the state of the battery. The actuator 1000 includes an interface 1114 to transfer collected data to the server 802 or to the portable computer device 900. In certain embodiments, the actuator 1100 includes a laser depth or distance finder system 1118 adapted to assist the operator in properly locating the actuator apparatus 1100 relative to the anchor installation position. The laser distance system 1118 can properly identify the location between an installed anchor which is used as a reference and an anchor apparatus 100 to be installed knowing the desired distance between anchor apparatuses. Thus, the laser distance system 1016 may complement the aforementioned positioning systems in ensuring the anchor apparatus 100 is installed at the proper anchor location. In certain embodiments, the laser distance finder 1016 may be the only methodology used to determine the location of the next anchor location position by utilizing one or more prior installed anchors as a reference(s) and working off the reference anchor for subsequent placement of additional anchor apparatuses. The laser distance finder 1118 may include an alarm, for example, an audio or visual alarm when the actuator is at the appropriate installation location. An audible alarm may become progressively louder, for example, a beeping sound, when the actuator approaches the proper anchor insertion position, and then may provide a steady sound when the actuator is positioned precisely at the anchor insertion location. The actuator 1100 may further include a light source (LS) 1120 such as an incandescent or arc lamp, lamps based on discharge of gas, and light-emitting diodes. The light source 1120 may be utilized when the actuator 1100 is being used in dark conditions, at night, or when a loss of power occurs at the construction site, etc. It is envisioned that the light source could assist the operator in locating and illuminating the areas for anchor installation. In one embodiment, the light source is an LED. A power source (PS) 1122 either external to the actuator or an internal battery (e.g., rechargeable) is also provided to power the components of the actuator 1000.

In further embodiments, the actuator 1100 may be mobile, for example, a robot, a telerobot, a partially manned-robot, totable unmanned robot, etc. The movement module (schematically identified as mobile 1124 in FIG. 34) provides self-navigation capabilities to the actuator as controlled by the server 802 or the PCD 900 or a combination of both, memory loaded within the actuator 1100. The movement module 1124 would be controlled via signals sent by the server 802 or PCD 900. One skilled in the art could readily envision methodologies to control movement of the actuator based on the generated positional signals discussed hereinabove.

Figure 35:
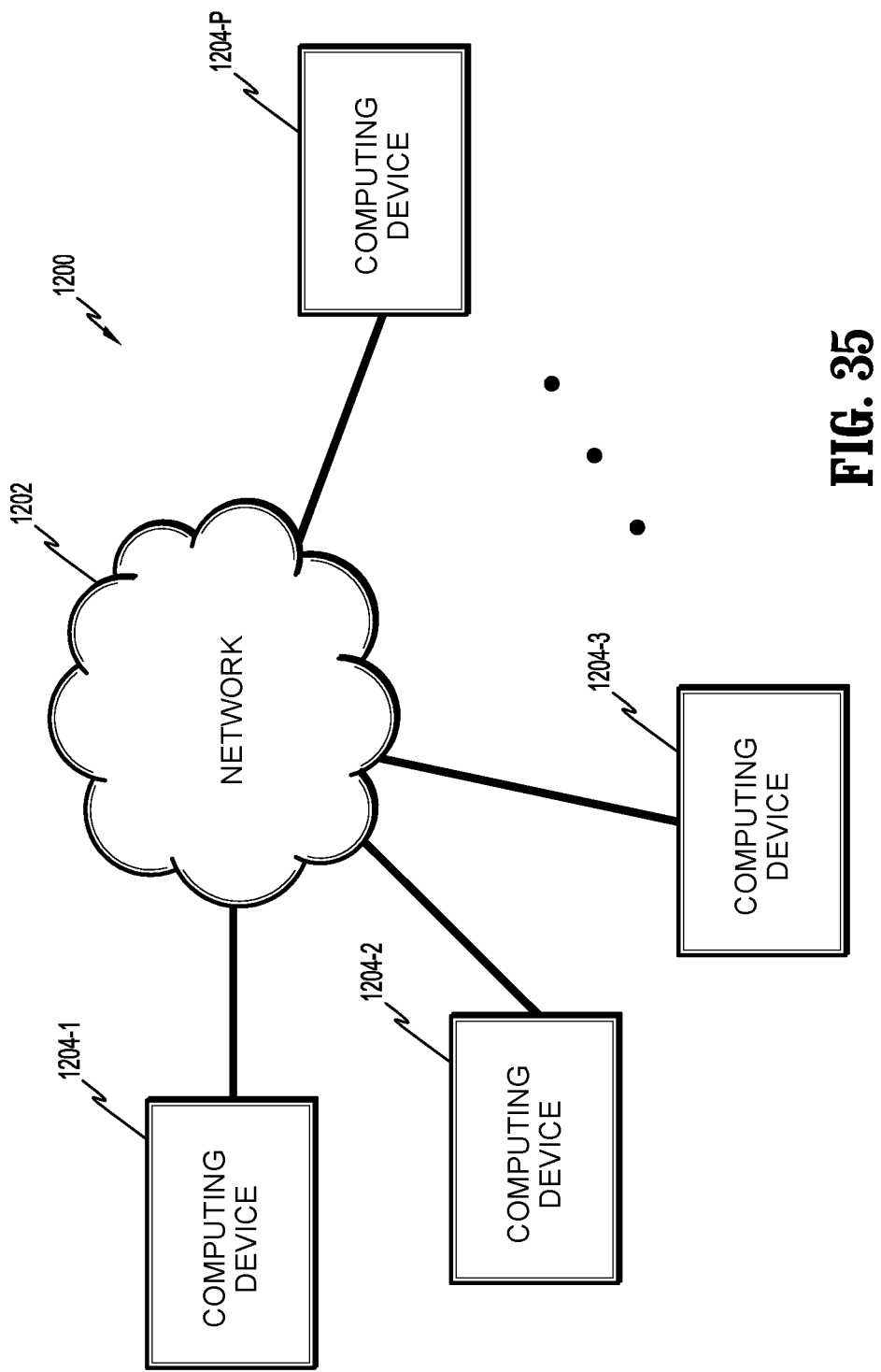
FIG. 35 illustrates a distributed communications/computing network in accordance with which one or more embodiments of the present disclosure can be implemented.

FIG. 35 illustrates a distributed communications/computing network (processing platform) in accordance with which one or more embodiments of the invention can be implemented. By way of illustration, FIG. 34 depicts a communication system 1200 that includes a plurality of computing devices 1204-1 through 1204-P (herein collectively referred to as computing devices 1204) configured to communicate with one another over a network 1202.

The network 1202 may include, for example, a global computer network such as the Internet, a wide area network (WAN), a local area network (LAN), a satellite network, a telephone or cable network, or various portions or combinations of these and other types of networks (including wired and/or wireless networks).

As described herein, the computing devices 1204 may represent a large variety of devices. For example, the computing devices 1204 can include the PDA 900 described hereinabove, a portable device such as a mobile telephone, a smart phone, tablet, computer, a client device, etc. The computing devices 1204 may alternatively include a desktop or laptop personal computer (PC), a server, a microcomputer, a workstation, a kiosk, a mainframe computer, or any other information processing device which can implement any or all of the techniques detailed in accordance with one or more embodiments of the invention. In other exemplary embodiments, the server 802 and the PDA 900 may be incorporated as a single unit, and located at the construction site.

One or more of the computing devices 1204 may also be considered a "user." The term "user," as used in this context, should be understood to encompass, by way of example and without limitation, a user device, a person utilizing or otherwise associated with the device, or a combination of both. An operation described herein as being performed by a user may therefore, for example, be performed by a user device, a person utilizing or otherwise associated with the device, or by a combination of both the person and the device, the context of which is apparent from the description.

Additionally, as noted herein, one or more modules, elements or components described in connection with embodiments of the invention can be located geographically-remote from one or more other modules, elements or components. That is, for example, the modules, elements or components shown and described in the context of FIGS. 30 through and 34 can be distributed in an Internet-based environment, a mobile telephony-based environment, a kiosk-based environment and/or a local area network environment. The system and methodology are not limited to any particular one of these implementation environments.

By way of example, in an Internet-based and/or telephony-based environment, the system is configured to enable a user to identify the proper installation for anchor installation at the PCD end (one of the computing devices 1204 in FIG. 35), and the image is transmitted to a remote server (another one of the computing devices 1204 in FIG. 35) for processing and analysis such as detailed herein. At least a portion of the processing and analysis may be performed at the user end.

Additionally, for example, in a kiosk-based environment, a device (one of the computing devices 1204 in FIG. 35) such as PCD 900 captures an image or enables a user to select an image, and the image is transmitted through either a wired or wireless connection to a server (another one of the computing devices 1204 in FIG. 35) for processing and analysis as described herein. Again, at least a portion of the processing and analysis may be performed at the user end.

In a LAN-based environment, all image capture, processing and analysis can be performed by one or more computing devices (1204 in FIG. 35) that are locally coupled to the LAN.

In one or more embodiments, the computing system environment shown in FIG. 35 employs a cloud computing platform, where "cloud" refers to a collective computing infrastructure that implements a cloud computing paradigm. For example, as per the National Institute of Standards and Technology Publication No. 800-145, cloud computing is a model for enabling ubiquitous, convenient, on-demand network access to a shared pool of configurable computing resources (e.g., networks, servers, storage, applications, and services) that can be rapidly provisioned and released with minimal management effort or service provider interaction. Cloud-based computing platforms (also sometimes referred to as data centers) are deployed and managed by cloud service providers, who provide a computing environment for customers (tenants) to run their application programs (e.g. business applications or otherwise). The applications are typically run on one or more computing devices (i.e., host devices or hosts), and write data to and read data from one or more storage devices (e.g., hard disk drives, flash drives, etc.). The storage devices may be remote from the host devices such that they are connected via a communication network. However, some or all of the storage devices may be part of the same computing devices that implement the hosts.

In one or more embodiments, the computing system environment shown in FIG. 35 employs blockchain/distributed ledger technology. The terms "blockchain," "ledger" and "distributed ledger" may be used interchangeably. As is known, the blockchain or distributed ledger protocol is implemented via a distributed, decentralized computer network of compute nodes. A given one of the blockchain compute nodes (ledger nodes) resides on a client or the client otherwise has access to a blockchain compute node. The compute nodes are operatively coupled in a peer-to-peer communications protocol. In the computer network, each compute node is configured to maintain a blockchain which is a cryptographically secured record or ledger of data blocks that represent respective transactions within a given computational environment. The blockchain is secured through use of a cryptographic hash function. Each blockchain is thus a growing list of data records hardened against tampering and revision, and typically includes a timestamp, current transaction data, and information linking it to a previous block. More particularly, each subsequent block in the blockchain is a data block that includes a given transaction(s) and a hash value of the previous block in the chain, i.e., the previous transaction. That is, each block is typically a group of transactions. Thus, advantageously, each data block in the blockchain represents a given set of transaction data plus a set of all previous transaction data. In the case of a "bitcoin" type implementation of a blockchain distributed ledger, the blockchain contains a record of all previous transactions that have occurred in the bitcoin network. The bitcoin system was first described in S. Nakamoto, "Bitcoin: A Peer to Peer Electronic Cash System," 2008, the disclosure of which is incorporated by reference herein in its entirety.

In another alternate embodiment, the locking plate may be magnetically secured at desired locations via use of a metallic locking plate and high strength magnets which may be positioned beneath the plywood form of the concrete form to be cured. This would remove the need to drive fasteners through the locking plate in that the locking plate will be held in the desired position by the respective magnet. The high strength magnets and/or the locking plates may be positioned relative to the concrete form by any of the positioning mechanisms discussed hereinabove.

In addition, the use of the high strength magnets enables use of the system in construction methodologies utilizing steel beams in lieu of or in addition to the concrete columns, structures etc. More specifically, either the metallic locking plates or the magnets may be positioned relative to a steel or magnetic beam via any of the aforedescribed positioning systems. Once at their proper locations, either the magnets or the locking plates may be arranged adjacent their designated components. The magnetic forces between the components will maintain the components at the desired calculated locations without the use of fasteners. Thereafter, a drill is passed through the anchor plate to create an opening in the beam. The cover is slid down the anchor rod and the anchor rod is screwed into the cover in a similar manner as previously described.

Figure 36C:
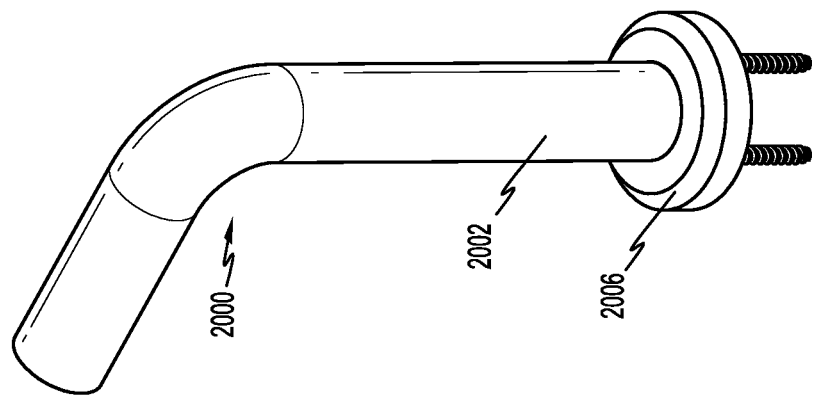
FIGS. 36A-C illustrate another anchor apparatus in accordance with the principles of the present disclosure illustrating the anchor rod, lock plate and the cover.
Figure 36B:
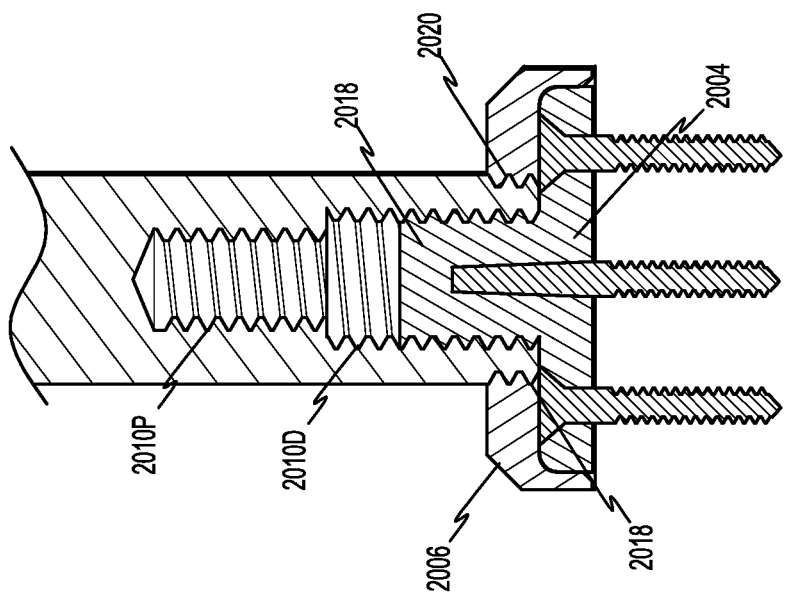
Figure 36A:
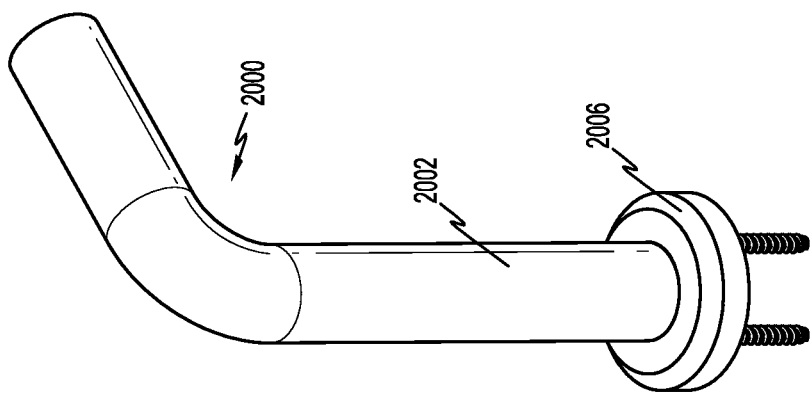
Figure 37C:
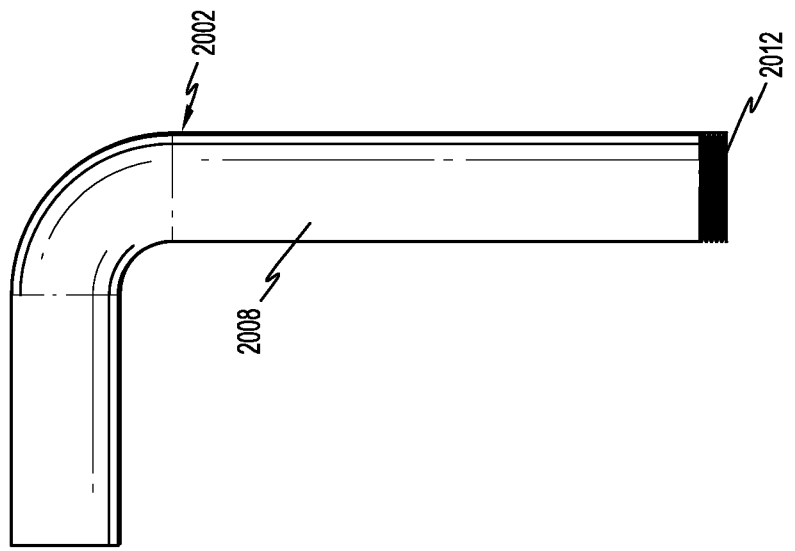
FIGS. 37A-C illustrate the anchor rod of the anchor apparatus of FIGS. 36A-36C.
Figure 37B:
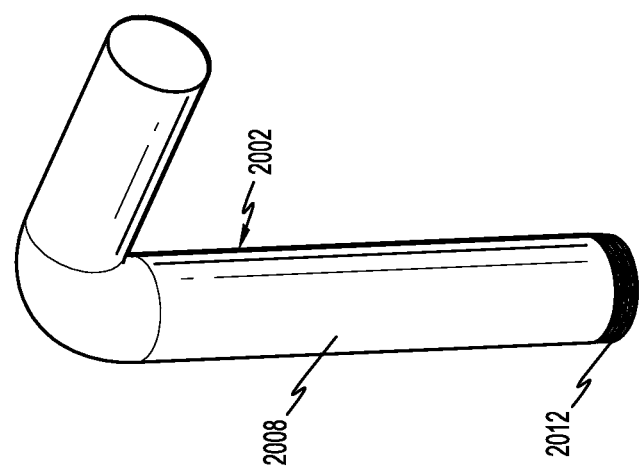
Figure 37A:
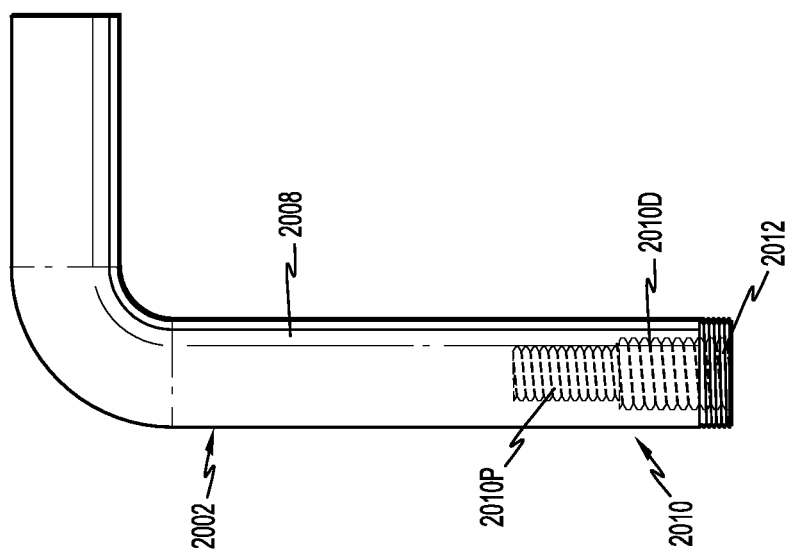
Figure 38B:
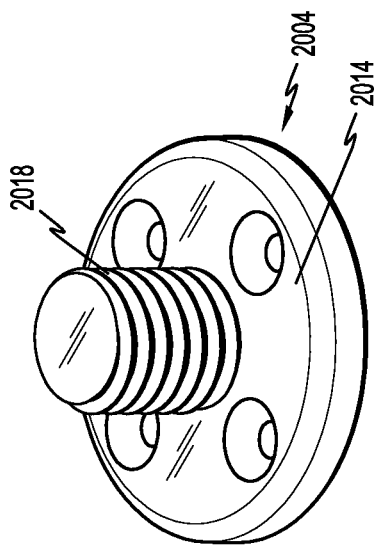
FIGS. 38A-D illustrate the lock plate of the anchor apparatus of FIGS. 36A-36C.
Figure 38D:
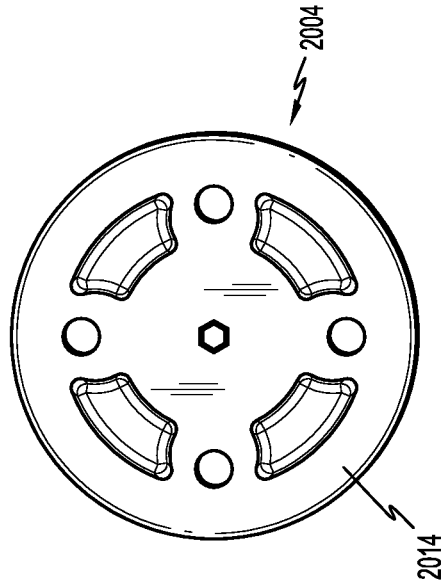
Figure 38A:
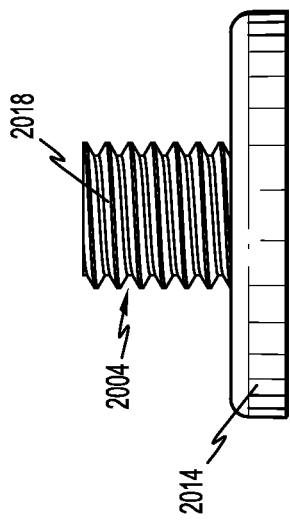
Figure 38C:
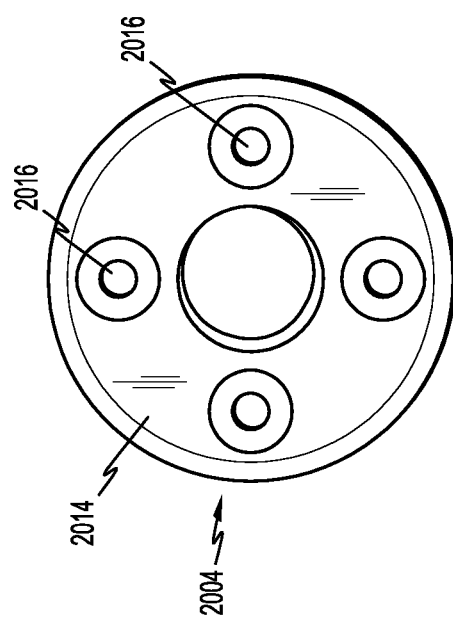
Figure 39D:
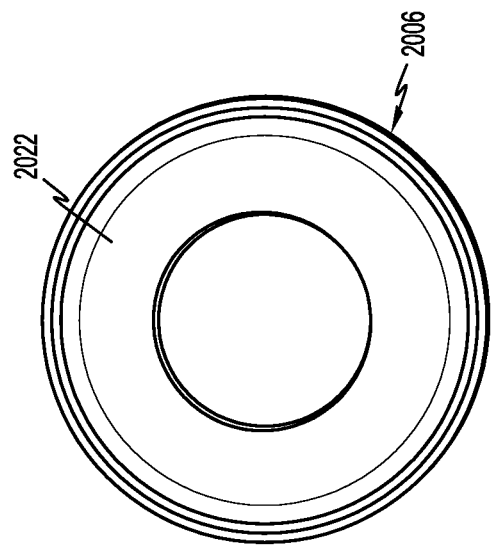
FIGS. 39 A-D illustrate the escutcheon of the anchor apparatus of FIGS. 36A-36C.
Figure 39B:
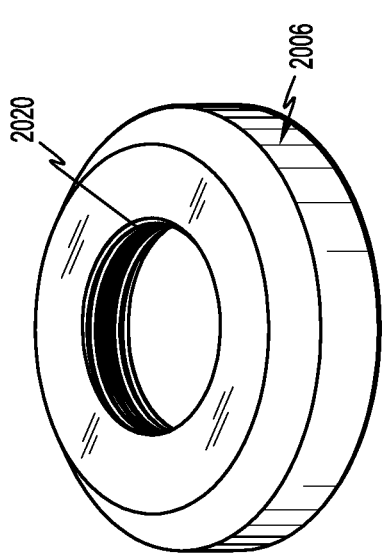
Figure 39C:
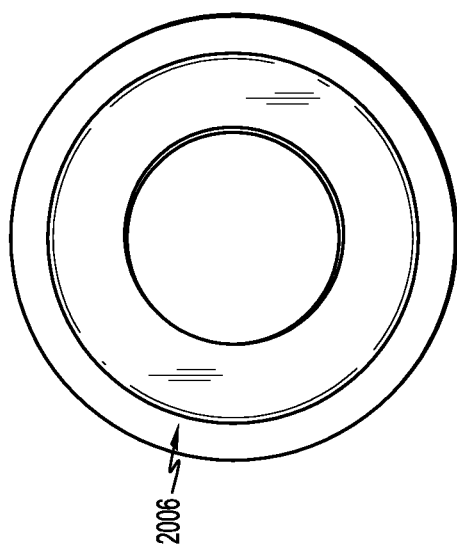
Figure 39A:
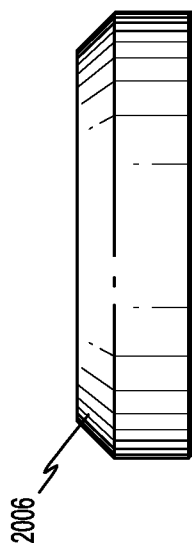
Figure 40A:
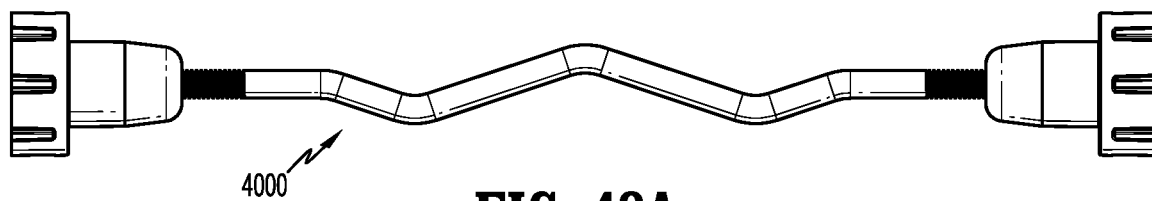
FIGS. 40A-C illustrate another embodiment of an anchor apparatus according to the principles of the present disclosure.
Figure 40B:
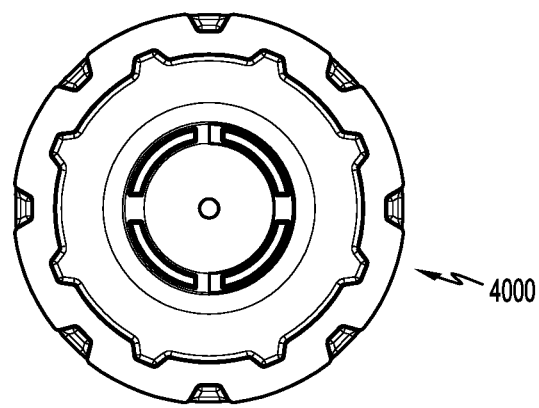
Figure 40C:
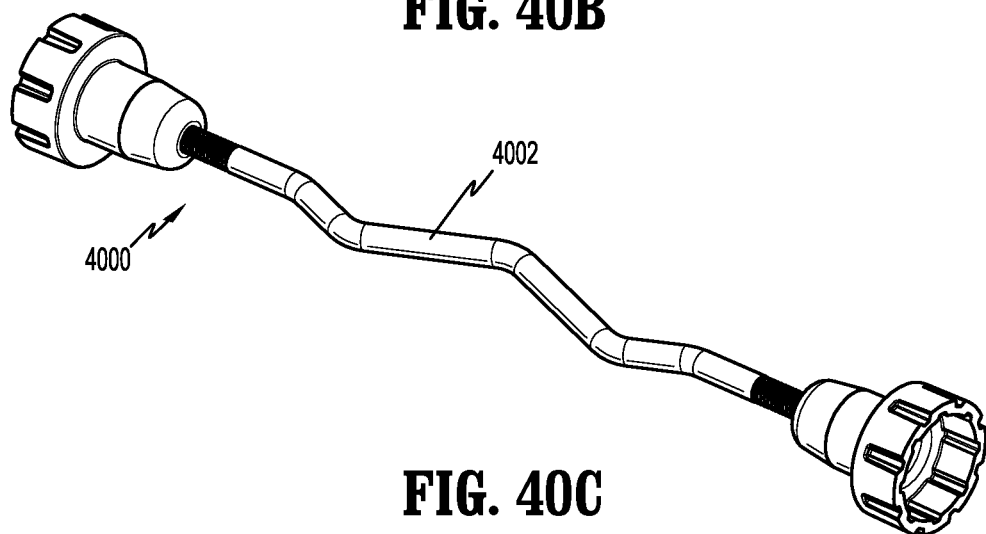
Figure 41A:
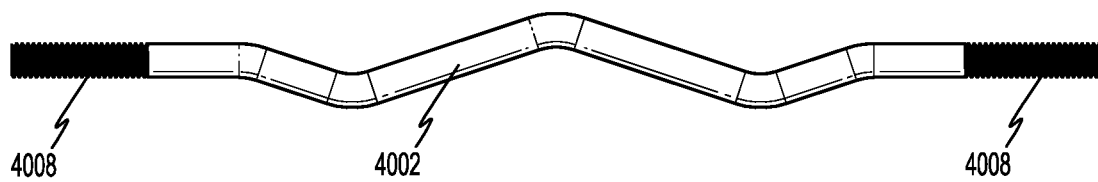
FIGS. 41A-C illustrate the anchor rod of the anchor apparatus of FIGS. 40A-40C.
Figure 41B:
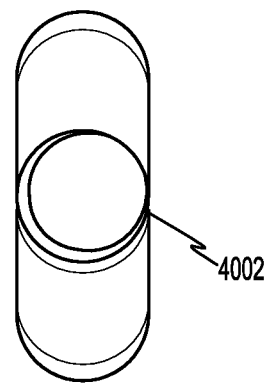
Figure 41C:
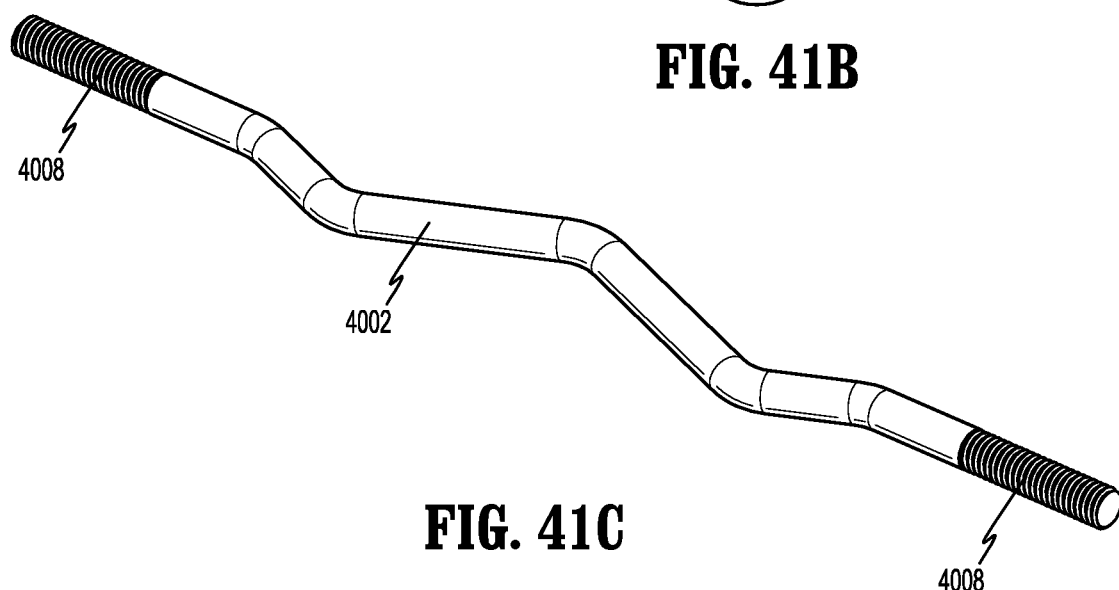

Referring now to FIGS. 36A-C, there is illustrated another exemplary embodiment of an anchor apparatus of the present disclosure. The anchor apparatus 2000 includes an anchor rod 2002 (FIGS. 37A-C), a lock plate 2004 (FIGS. 38A-D) and an escutcheon 2006 (FIGS. 39A-D). The anchor rod 2002 defines an L-shape similar to the anchor rod in the earlier embodiments. In accordance with this embodiment, the anchor leg 2008 includes an internal thread 2010 extending for a portion of its length. The internal thread 2010 may be constant in internal diameter or may vary as shown in FIGS. 37A-C. In one embodiment, the distal end of the internal thread 2010D defines an internal dimension greater than the proximal end 2010P of the internal thread 2010. For example, the distal internal thread 2010D may have a ¾ inch internal dimension while the proximal internal thread 2010P may have a ½ inch internal dimension. Other arrangements are also envisioned. The anchor leg 2008 further includes an outer thread 2012 at its extreme distal end.

Referring to FIGS. 36A-C and 38A-D, the lock plate 2004 includes a round plate segment 2014 although other shapes are envisioned, and one or more fastener openings 2016 to receive fasteners for securement to the form board. The lock plate 2004 further includes an external thread 2018 depending proximally away from the plate segment 2014. The external thread 2018 cooperates with the distal internal thread 2010D of the anchor rod to secure the components to each other via a threaded coupling. Other methodologies are also envisioned including a bayonet coupling or the like.

Referring now to FIGS. 36A-C and 39A-D, the escutcheon 2006 functions in a similar manner to the cover 108 of FIG. 1. The escutcheon 2006 defines an internal thread 2020 which cooperates with the outer thread 2012 of the anchor rod 2002. The escutcheon 2006 prevents concrete from entering the internal area of the escutcheon 2006 and also preserves its inner cavity 2022 for access of the anchor rod 2002.

The anchor apparatus is used in a similar manner to a prior embodiment. For example, the lock plate 2004 is secured to the form board with the use of fasteners. The escutcheon 2006 is secured to the anchor rod 2002 via cooperate engagement of internal thread 2020 of the escutcheon 2006 and the outer thread 2012 of the anchor rod 2002. Thereafter, the anchor rod 2002 is secured to the lock plate 2004 through the threaded engagement of the external thread 2018 of the lock plate and the inner distal thread 2010D of the anchor rod 2002. (See FIGS. 36A-C). The whole assembly is secured relative to the form board. Concrete is formed and the escutcheon 2006 defines a cavity in the concreter to provide access to the anchor rod 2002. Externally threaded coupling devices, tool, mounts, safety devices, mounts for mechanical, electrical lines etc. may be secured to the anchor rod 2002. In embodiments, the tools include external threads dimensioned to cooperate with the proximal internal thread 2010P of the anchor rod 2002. Alternatively, the coupling tool may threadably engage the distal internal thread 2010D of the anchor rod 2002.

Referring now to FIGS. 40A-43D, there is illustrated another exemplary embodiment of the present disclosure. Anchor apparatus 4000 includes anchor rod 4002, first and second end pieces 4004 and anchor tool 4006. This system may be used in preparation of curved concrete forms, e.g., in a Sonotube™ form although the apparatus has application in straight support structures as well.

With reference to FIGS. 40A-41C, the anchor rod 4002 is generally arcuate or sinusoidal in configuration to resist migration within the cured concrete. The anchor rod 4002 includes opposed external threads 4008 at opposite ends of the anchor rod 4002.

With reference to FIGS. 40A-C and 42A-D, the end pieces 4004 include a collar 4010 and a nose 4012. The nose 4012 defines a cylindrical segment 4014 and a generally tapered or conical section 4016. The internal passage of at least the nose is threaded 4015 illustrated schematically in one view of FIGS. 42A-D to threadably cooperate with the external threads 4008 of the anchor rod 4002 to couple the two components. The internal cavity 4018 of the end piece 4004 defines a circular surface 4020 which is interrupted by generally polygonal segments 4022.

With reference to FIGS. 40A-C and 43A-D, the anchor tool 4006 secures the end pieces 4004 onto the external threads 4008 of the anchor rod. The anchor tool includes an internal structure 4024 corresponding in dimension and configuration to the internal cavity of the end pieces 4004. For example, the internal structure 4024 includes an inner peripheral circle 4026 interrupted by polygonal projections 4028 which precisely fit within the respective circular surface 4020 and polygonal segments 4022 of the end pieces 4004. Thus, when engaged the anchor tool can be rotated to cause corresponding rotation of the end pieces 4004. Other dimensional and structural arrangements are envisioned as well. The anchor tool 4006 also includes a handle 4028 and an inner socket 4030 remote from the internal structure (i.e., on the other side of the tool) to receive a socket wrench.

As indicated hereinabove, the anchor apparatus 4000 may be utilized with a circular or column concrete form such as the commercially available Sonotube™ form used to make concrete circular columns. In use, opposing holes are drilled in the circular concrete form and one nose of an end piece, e.g., is secured onto the external thread 4008 of the anchor rod 4002. The free end of the anchor rod 4002 is passed through a first hole in the circular concrete form and advanced toward the second hole. Once adjacent the second hole the second end piece is introduced into the opposing hole in the circular concrete form and threaded onto the other threaded end 4008 of the anchor rod 4002. Both end pieces 4004 are secured against the circular concrete form busing the anchor tool 4006 in the aforedescribed manner, i.e., by engaging the internal structure 4024 including the inner peripheral circle 4026 and the polygonal projections 4028 with the internal cavity 4018 of the end piece 4004 including the circular surface 4020 and the polygonal segments 4022. The end pieces 4006 are secured relative to the circular concrete form whereby the conical nose is within the interior of the concrete form and the cylindrical section spans the thickness of the concrete form. The collar 4010 is external of the concrete form. Thereafter the concrete is poured into the formed and permitted to cure. Once cured, the end pieces 4006 may be removed with the anchor tool via engagement of the anchor tool with the end pieces and screwed off the external thread of the anchor rod 4002. In certain exemplary embodiments, a wrench may also be utilized and introduced within the socket recess 4030 to facilitate removal of the end pieces. Once the end pieces 4006 are removed, the external threads 4008 of the anchor rod 4002 are exposed to be coupled with, or to support, construction supplies or equipment such as ductwork, electrical cables, plumbing, sprinklers, safety lines or fences, etc. within a construction site. etc. It is noted that the conical noses 4012 each provides a cavity similar to that described above in connection with the prior embodiments to permit access to the external threads. The external threads 4010 will be disposed within the cavity formed by the conical of the nose of the end pieces confined within the outer boundary of the concrete column.

Figure 44:
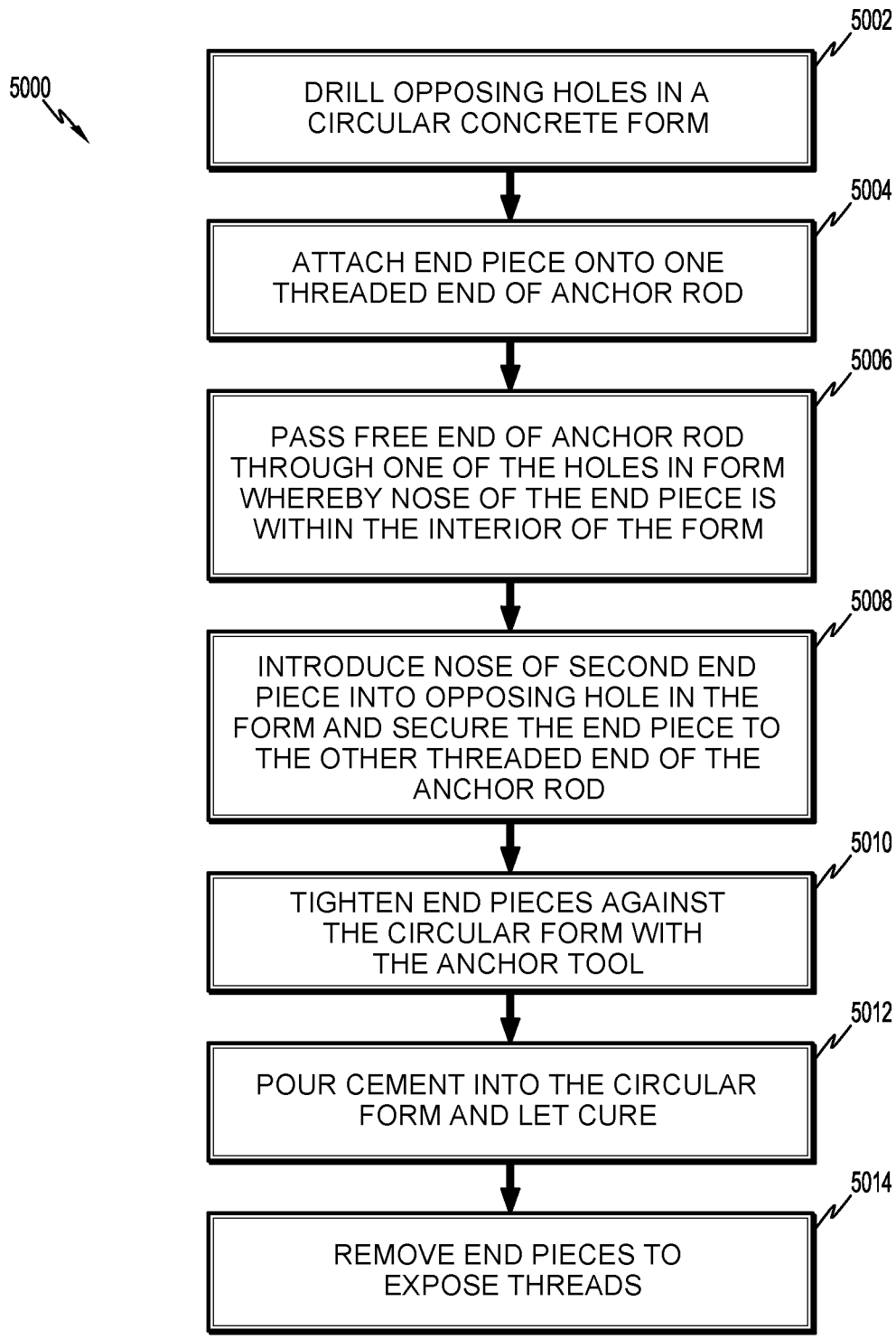
FIG. 44 is a flow chart depicting illustrative use of the anchor apparatus.

FIG. 44 is a flow chart 5000 depicting the use of the anchor apparatus 4000. In STEP 5002, opposing holes are drilled into a concrete form, of, for example wood or plastic, and being circular, square etc. or any configuration. In STEP 5004, an end piece is attached to one threaded end of the anchor rod. In STEP 506, the free end of the anchor rod is advanced within a first hole and advanced toward the opposing hole whereby the nose of the mount end piece enters the first hole and is disposed within the interior of the cement form. In STEP 508, the nose of the other end piece is advanced within the opposing hole in the concrete form and coupled to the thread of the free end of the anchor rod. In STEP 510, each end piece is tightened against the cement form. In STEP 512, cement is poured into the form and let to cure. In STEP 514 the end pieces are removed with the anchor tool to expose the threads. It is to be appreciated that some of these STEPS may be combined or performed out of sequence as presented herein. In addition, it is also possible that the end pieces may be secured to the anchor rod while the anchor rod is positioned within the cement form. Other variations are also envisioned.

Figure 45:
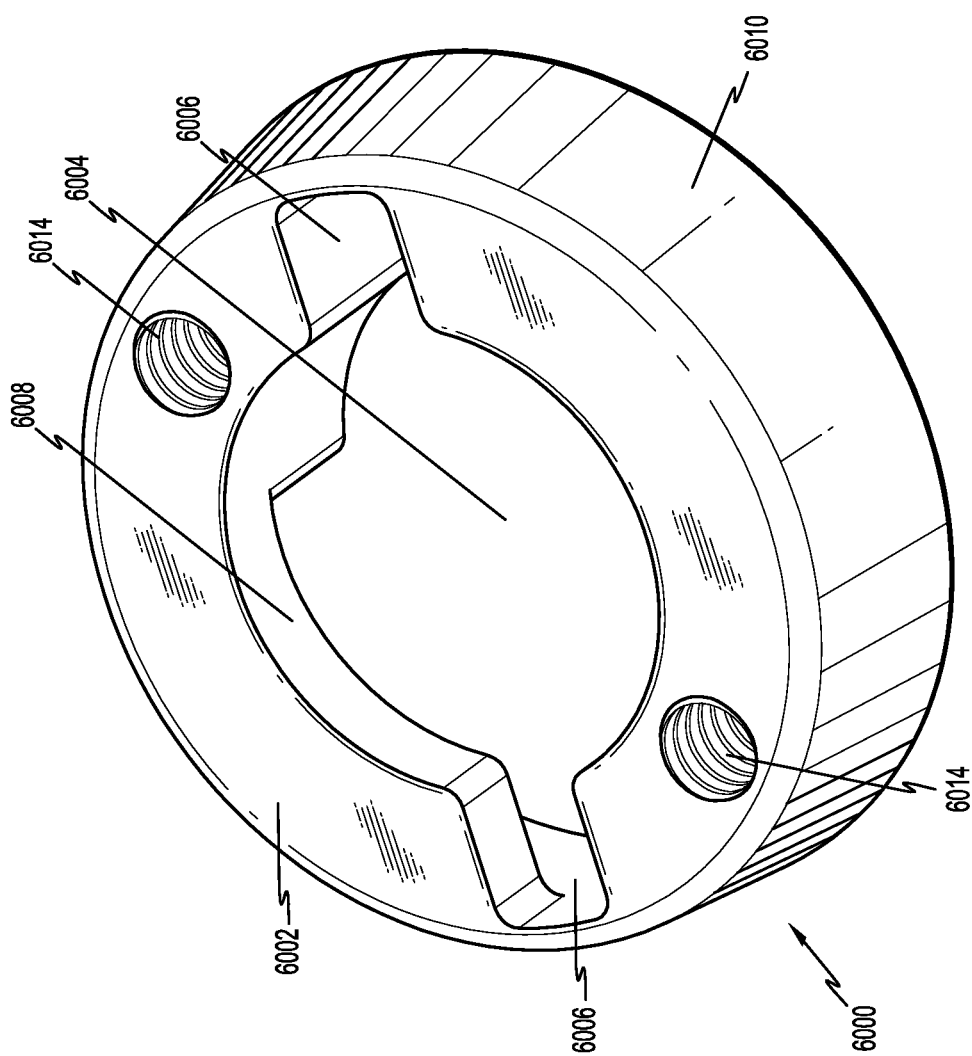
FIG. 45 is a perspective view of another illustrative embodiment of a locking plate.
Figure 46:
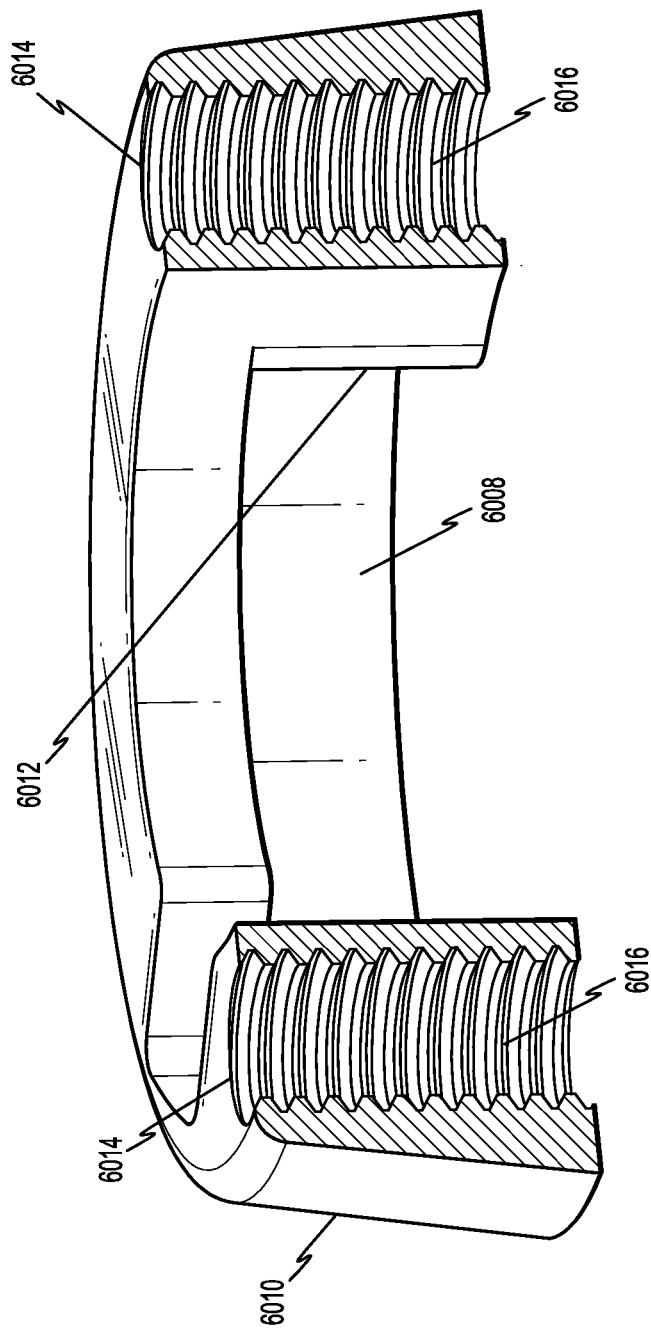
FIG. 46 is a perspective view in cross-section of the locking plate of FIG. 45.

Referring now to FIGS. 45-46, there is illustrated yet another illustrative embodiment of a locking plate 6000 in accordance with the present disclosure. The locking plate 6000 is substantially similar to the locking plate 104 described in connection with the illustrative embodiment of FIG. 1. The locking plate 6000 may assume a variety of shapes or configurations. Although referred to as a "plate," the locking plate 6000 does not necessarily require a plate like appearance, but could be any three-dimensional unit including a box, a dome, a bowl etc. The locking plate 6000 defines a plate segment 6002 having a central plate aperture 6004 and at least one keyed slot 6006, e.g., two keyed slots 6006 disposed in diametrical opposed relation, each communicating with the central plate aperture 6004. As described hereinabove in connection with FIG. 3C, the locking plate 6000 defines an interior space 6008 at least partially confined within the outer wall 6010 or boundary of the locking plate 6000 beneath the plate segment 6002. The locking plate 6000 may include opposed vertical walls or stops 612 within the interior space 6008 similar to the vertical stops 128 shown in FIG. 3C. As noted hereinabove, the vertical stops, if present, limit rotational movement of a coupler, such as the coupler 106, within the locking plate 6000. In the alternative, the locking plate 6000 may be devoid of the stops. The central plate aperture 6004 may be threaded or not threaded. At least one fastener opening 6014, e.g., two fastener openings 6014, extend(s) through the locking plate 6002. The fastener openings 6014 define internal threaded segment 6016 (e.g., a female thread) (FIG. 46) to receive a threaded fastener utilized to secure the locking plate 6000 relative to a form board of wood, steel or any other material contemplated for use as a form board or a column. The threaded segments 6016 may extend throughout the length of the fastener openings 6014 or only a portion of the length thereof.

In illustrative embodiments, the locking plate 6000 is used in a similar manner to the locking plate of 104 of FIGS. 1-17; however, when securing the plate segment 6002 to the board, threaded fasteners or screws are threadably advanced into the threaded segments 6016 of the fastener openings 6014 and into the form board. As mentioned, the form board may be formed of wood or steel, and may be a horizontal or a vertical component of a form board. If fabricated from wood, the threaded fasteners will penetrate the wood to secure the locking plate 6000 to the wood. The threaded fasteners may or may not extend completely through the form bord. Alternatively, if the form is fabricated from steel, the threaded fasteners are advanced through the threaded segments 6016 of the plate segment 6002, and completely through the board, i.e., to the other side of the board whereby a portion of the threaded fastener extends outwardly from the board. Thereafter, a threaded bolt or nut (similar to the device 750 of FIGS. 27-29) can be screwed onto the exposed fastener portion and advanced to secure the plate segment 6002 to the other side of the board, thereby securing the locking plate 6000 relative to the form board. In the event the board or column is fabricated from steel, opposing apertures may need to be formed through the steel utilizing, for example, the plate segment 6002 and the fastener openings 6014 as a template to drill or form the openings in the steel form.

Once secured to the form, the coupler 106 is threaded onto the remote end 116 of the anchor rod 112 and the cover passage 140 of the cover 108 is positioned over the handle 110 of the anchor 102 and slid down the anchor rod 112, and each component is advanced toward the locking plate 6000 as described in connection with the methodology FIGS. 6-11. For example, the coupler 106 is introduced within the plate segment 6002 of the locking plate 6000 by aligning the central coupler segment 132 and the coupler wings 138 with the central plate aperture 6004 and keyed slots 6006 respectively of the plate segment 6002 of the locking plate 6000 and rotated, thereby coupling the coupler 106 and the anchor 102 to the locking plate 6000. In other illustrative embodiments, the central plate aperture 6004 is internally threaded whereby the external thread 114 of the anchor rod 102 is secured to the locking plate 6000 through the threaded coupling of the components similar to the manner described in connection with the embodiment of FIGS. 23-29A. Once the anchor rod 102 is secured relative to the locking plate 6000, the cover 108 is advanced along the anchor rod 112 until it engages the form board. A plurality of anchor apparatuses 100 may be installed to the form board the form at predetermined locations as selected by the contractor. The concrete is poured, and then cured leaving the apparatuses in 100 in the concrete with the external threads 114 of the anchors 102 exposed for reception of a tool as described in detail hereinabove.

Figure 47:
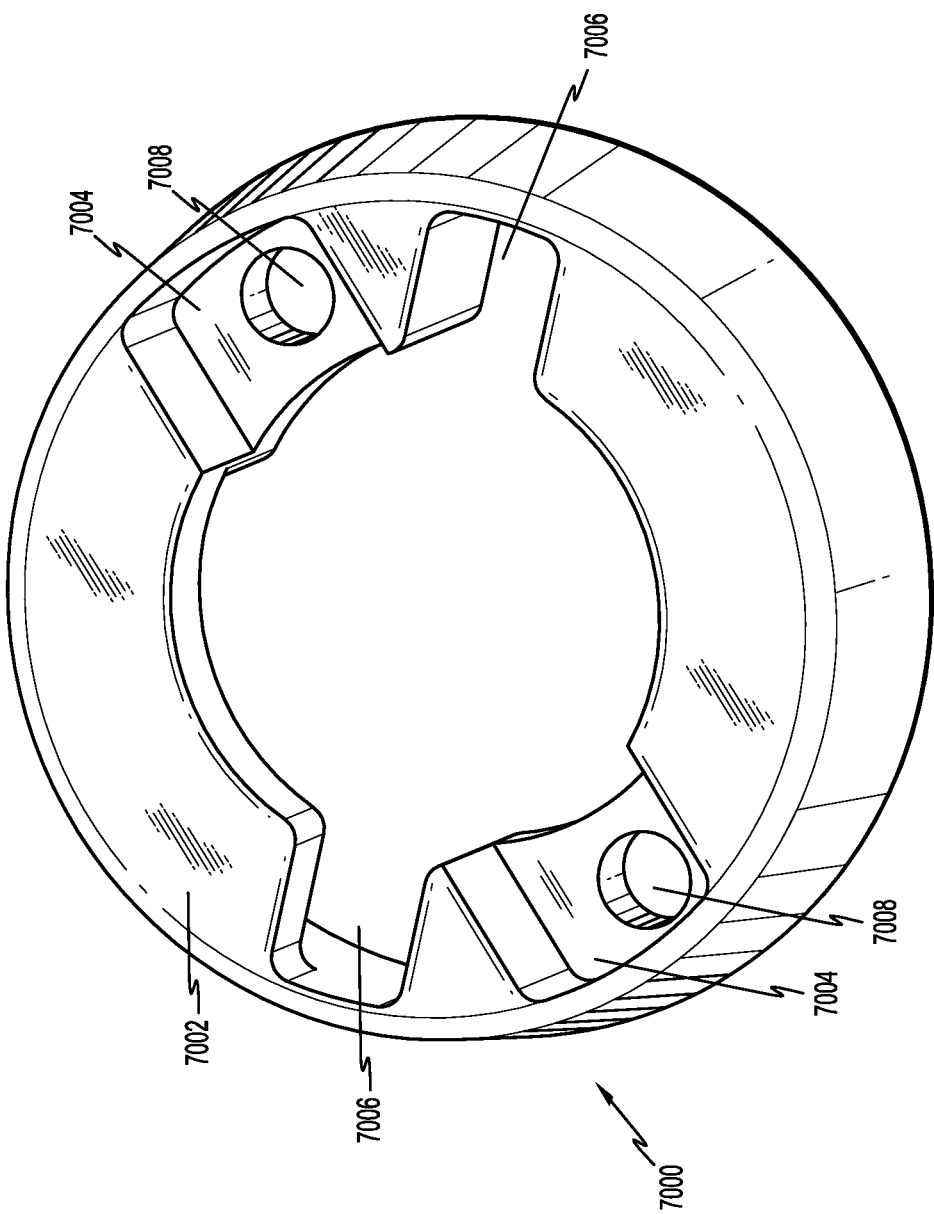
FIG. 47 is a top perspective view of the locking plate of FIGS. 45-46.
Figure 48:
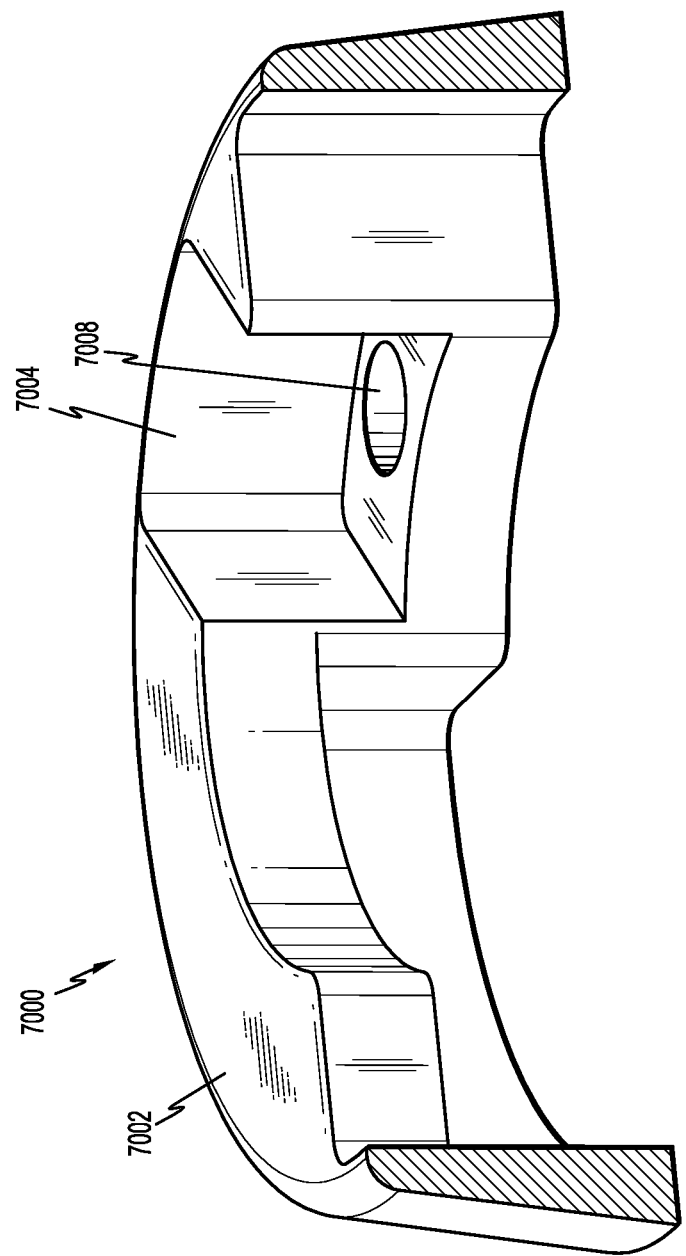
FIG. 48 is a second perspective view in cross-section of the locking plate of FIGS. 45-47.
Figure 49:
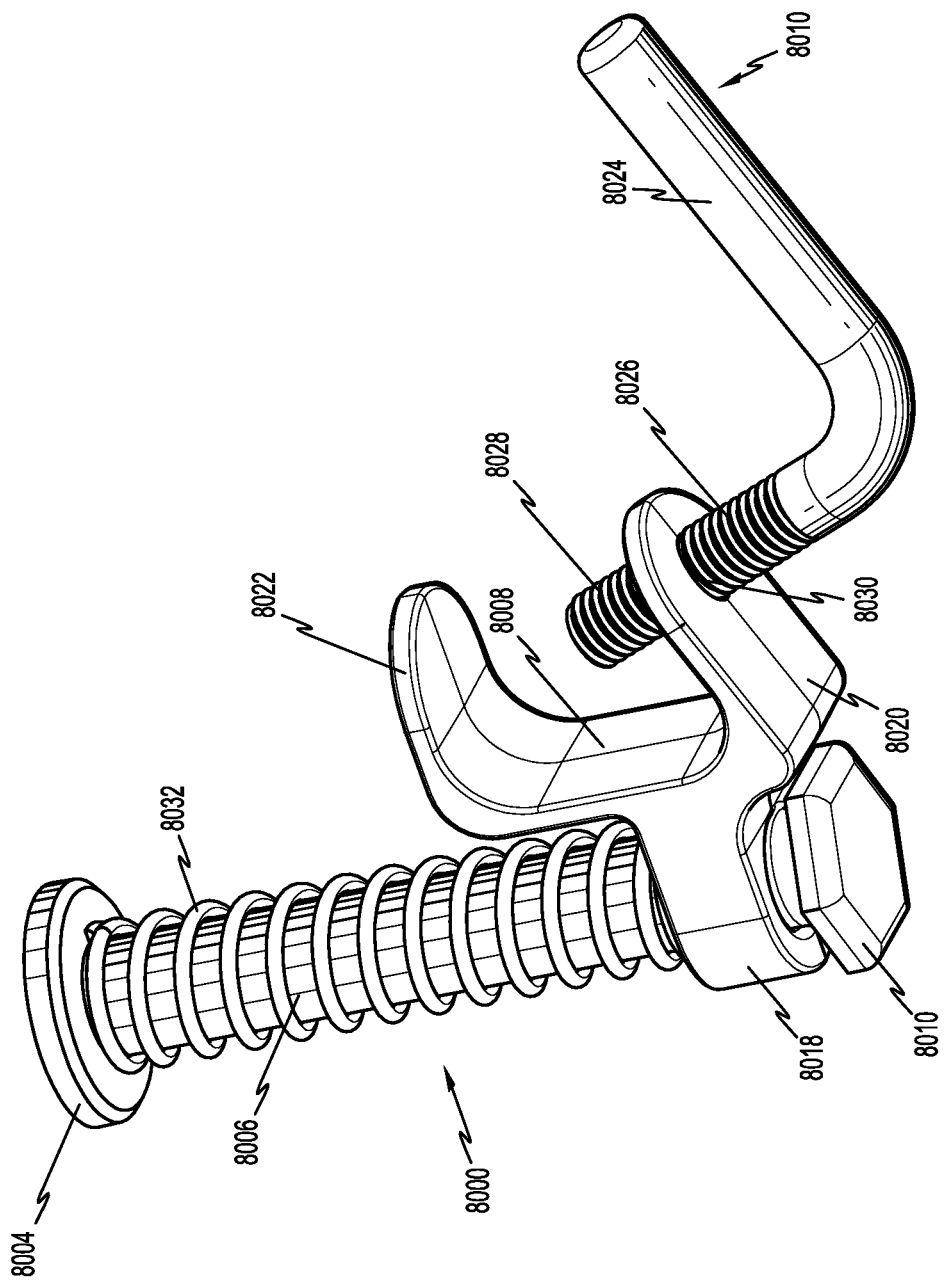
FIG. 49 is a perspective view of another illustrative embodiment of the anchor apparatus including a locking plate, an anchor, a saddle positioned over the anchor and a saddle clamp engaged with the saddle.

FIGS. 47-48 illustrate another illustrative embodiment of the locking plate of the present disclosure in which the locking plate is secured to the form, e.g., a metal form, via a welding process. The locking plate 7000 is substantially similar to the locking plate 114 of FIG. 1 and the locking plate 6000 of FIGS. 45-46. In accordance with this illustrative embodiment, the plate segment 7002 includes a pair of recesses 7004 in diametrical opposed arrangement and rotatably offset relative to the keyed slots 7006. Openings 7008 are disposed in, or aligned with, the recesses 7004. The openings 7008 and at least portions of the recesses 7004 receive filler material which forms, at least in part, the weld joint between the plate segment 7002 and the metal form. The plate segment is formed of a metal such as stainless steel or the like. Any suitable welding process for securing the locking plate 7000 to a metal form is envisioned including, for example, Mig welding, Arc welding, Gas welding, and Tig welding. With the locking plate 7000 secured to the metallic form, the above-described processes for securing one or more anchor apparatuses is repeated.

FIGS. 49-52 depict another illustrative embodiment of the anchor apparatus of the present disclosure. This anchoring apparatus 8000 may be secured to a form member fabricated from a metal such as a stainless steel, and may be installed in either a horizontal or vertical direction. The anchor apparatus 8000 includes a locking plate 8002 having a plate segment 8004, an anchor 8006, a saddle 8008 positioned over the anchor 8006 and a saddle clamp 8010 engaged with the saddle 8008. The anchor 8006 may be in the form of a rod having an anchor head 8010. The anchor 8006 is unthreaded along its exterior. However, the anchor 8006 includes a dual size internal tap or thread 8012 having an innermost first internal thread 8014 and a second internal thread 8016 adjacent the end of the anchor 8006 remote from the anchor head 8010.

The saddle 8008 is generally U-shaped or C-shaped, including a collar 8018 dimensioned to receive, or be positioned over, the anchor 8006, and two opposed walls, e.g., first and second walls 8020, 8022 depending from the collar 8018 to provide a c-shape or u-shape of the saddle 8008. The saddle 8008 is configured whereby a length of a rod, in illustrative embodiments a length of rebar (FIG. 50), can be received and/or passed between the opposed first and second walls 8020, 8022. The saddle clamp 8010 may be L-shaped defining a handle 8024 and a bolt segment 8026 depending from the handle 8024. The bolt segment 8026 includes an external thread 8028 which is received within a correspondingly dimensioned internally threaded aperture 8030 (e.g., female thread) extending through the first wall 8020. The saddle clamp 8010, particularly, the bolt segment 8026, reciprocally moves in the directions toward and away from the second wall 8022 upon corresponding rotation of the handle 8024 of the saddle clamp 8010 in respective clockwise and counterclockwise directions. The anchor apparatus 8000 further includes a spring 8032 coaxially positioned over the anchor 8006. The spring 8030 engages at one end the locking plate 8002 and at the other end the collar 8018 of the saddle 8008. Thus, once assembled, the spring 8032 normally biases the locking plate 8002 outwardly or downwardly, depending on the orientation of application, away from the saddle 8008 and into engagement with the form.

Figure 52:
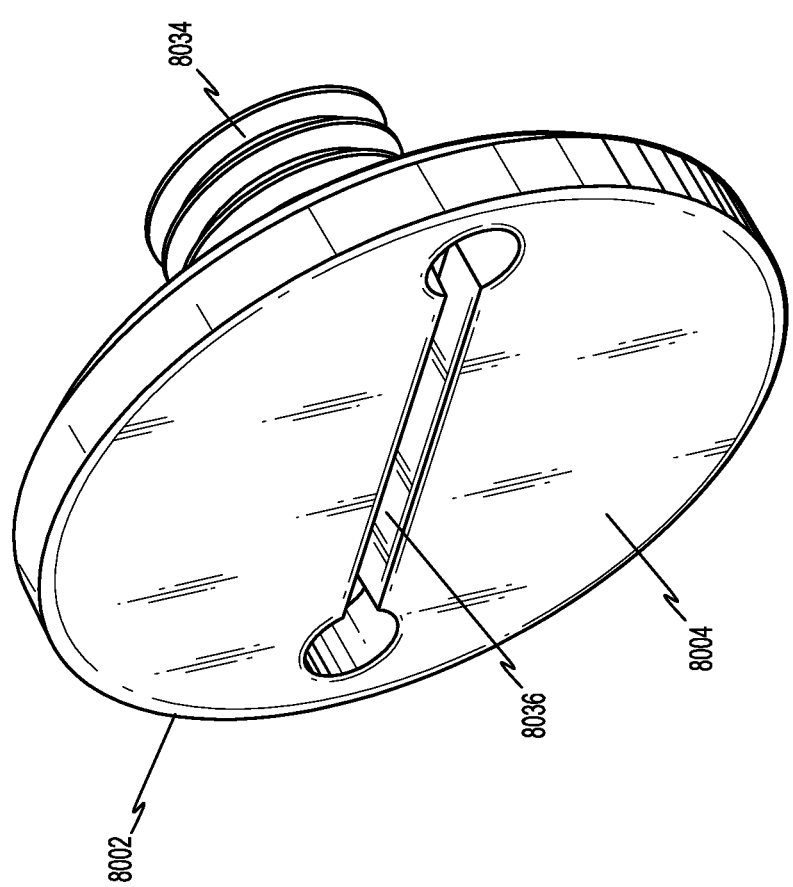
FIG. 52 is a perspective view of the locking plate of the anchor apparatus of FIGS. 49-51.

As best depicted in FIG. 52, the plate segment 8004 includes a central threaded segment 8034 depending therefrom. The threaded segment 8034 is threadably received within the second internal thread 8016 of the anchor 8006 to couple the locking plate 8002 to the anchor 8006. The plate segment 8004 also includes a keyed recess 8036 on its external face which receives a tool to assist in removing the locking plate 8002 subsequent to the curing process.

Figure 53:
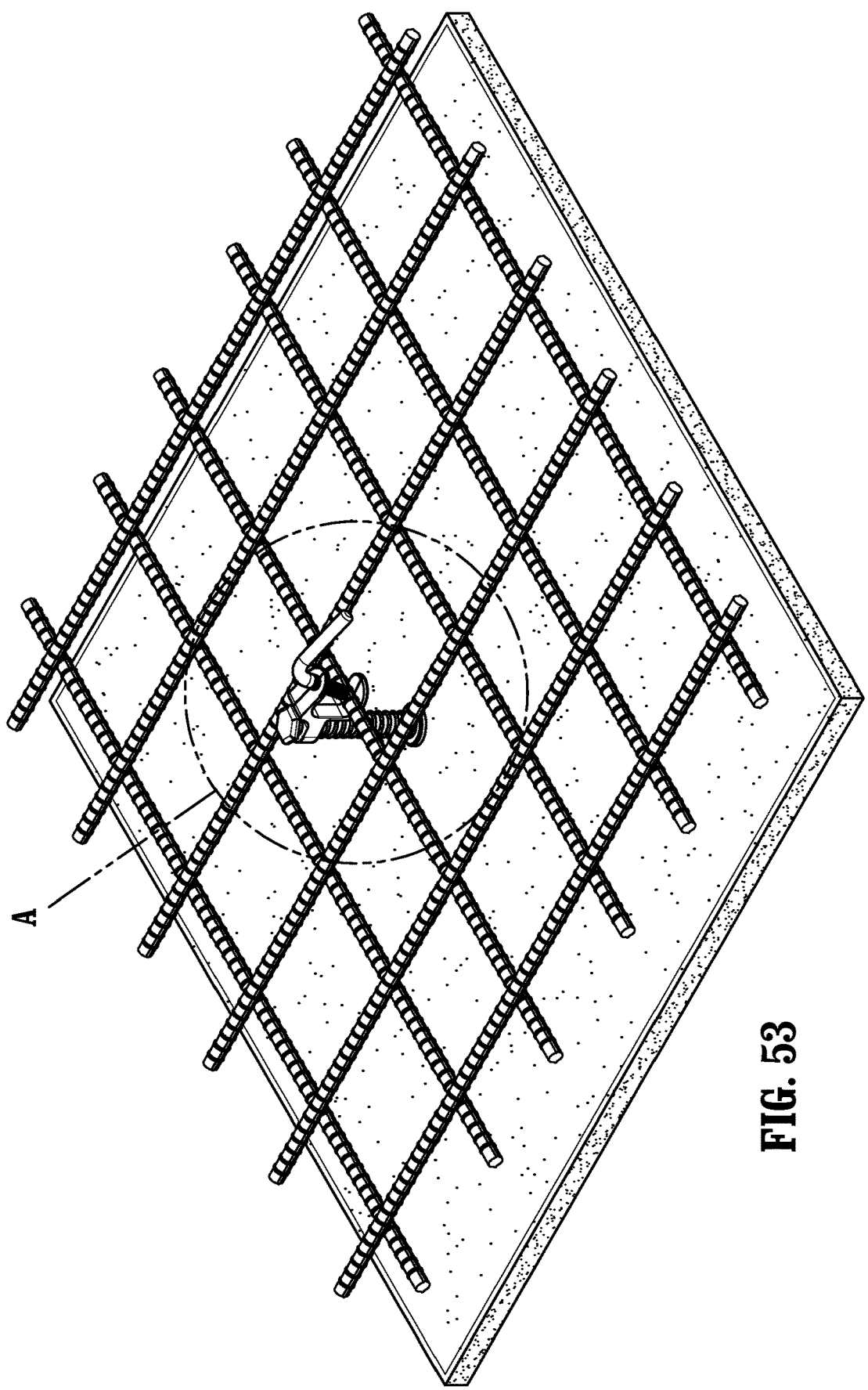
FIG. 53 illustrates application of the anchor apparatus of FIGS. 49-52 a rebar structure and relative to a wall of the form used in forming the concrete support.
Figure 54:
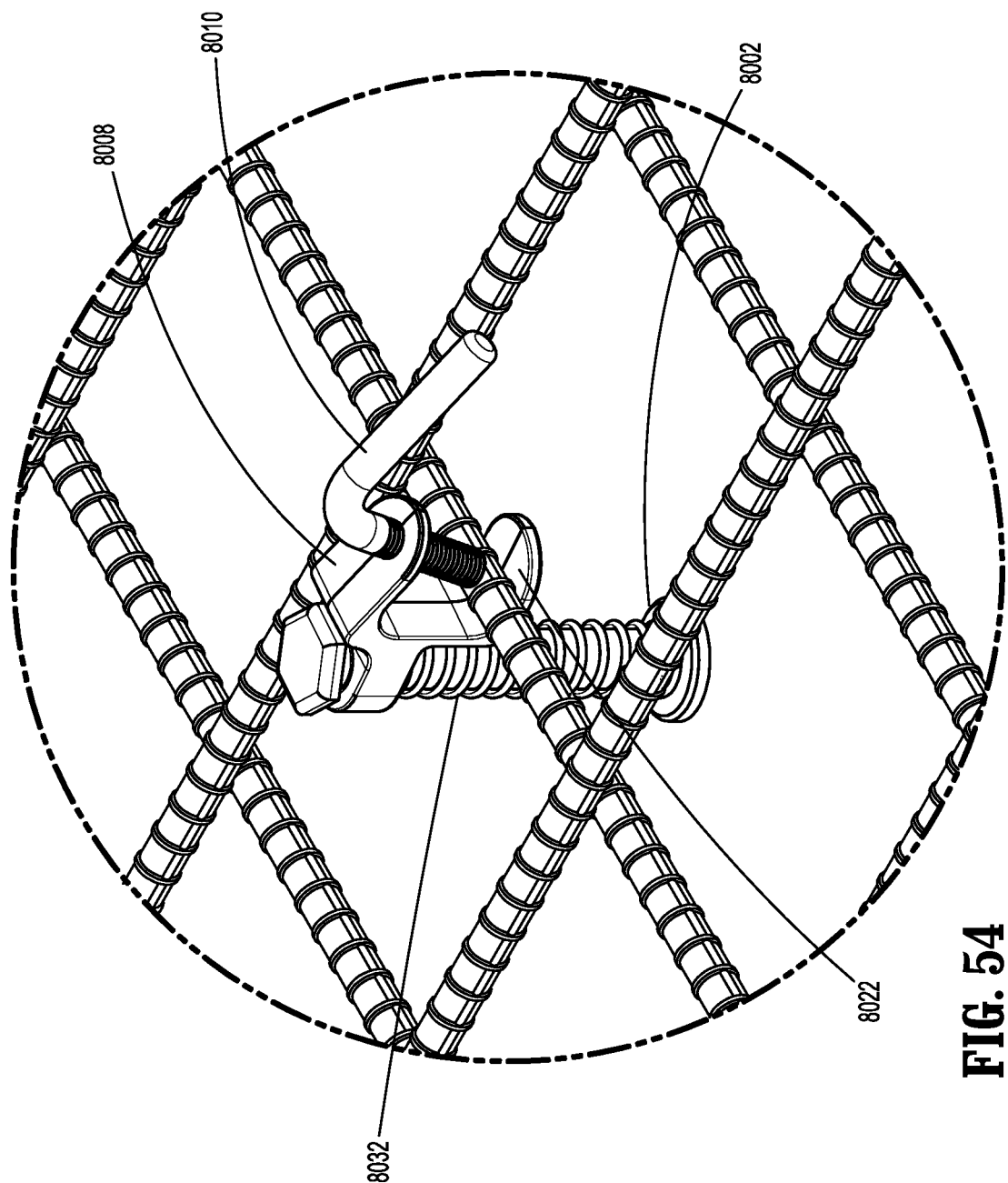
FIG. 54 is a view of the area of isolation depicted in FIG. 53.

FIGS. 53-54 illustrate application of the anchor apparatus 8000 to a rebar structure and relative to a wall of the form used in forming the concrete (e.g., vertical or horizontal support) e.g., column). As shown, a length of rebar is positioned within the first and second walls 8022, 8024 of the saddle 8008. Thereafter, the saddle clamp 8010 is rotated until the bolt segment 8026 engages the rebar. The saddle clamp 8010 is tightened to secure the rebar against the second wall 8022 of the saddle 8008. In this position, the spring 8032 disposed about the anchor 8006 biases the locking plate 8002 against the wall of the form. More specifically, the rebar is sufficiently rigid to support the saddle 8008 in a fixed position thereby transferring force via the coil spring 8032 to the locking plate 8002 and against the form.

Figure 55:
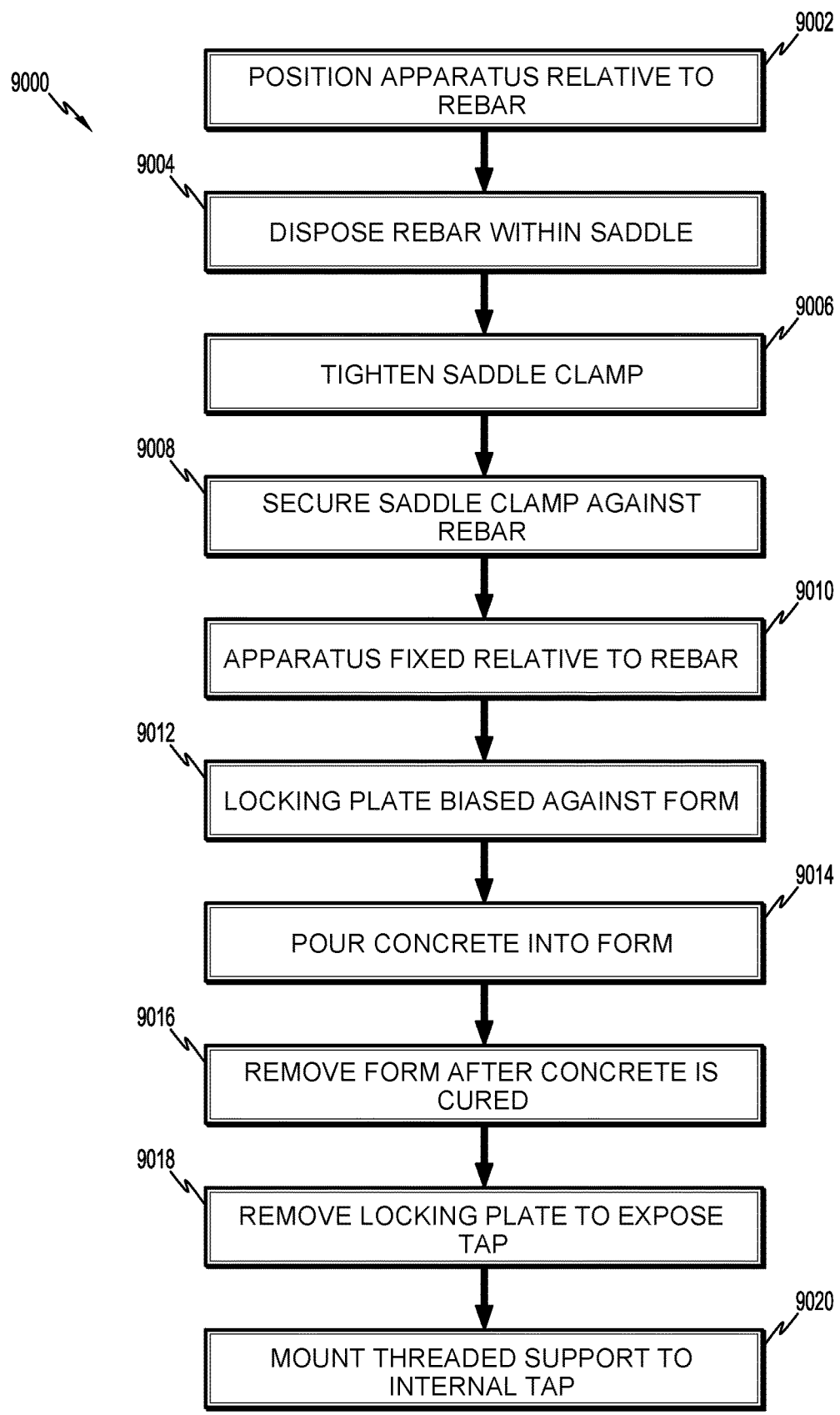
FIG. 55 is a flow chart illustrating one exemplative methodology of installation of the anchor apparatus FIGS. 49-54 relative to a form.

FIG. 55 is a flow chart illustrating the methodology 9000 of installation of the anchor apparatus 8000 relative to a steel form, board, reinforcing member etc. (hereinafter "form"). In the following discussion, the methodology 9000 will be described as including various steps. However, these steps may be performed in any order and/or multiple steps may be combined into one or more steps. The assembled apparatus 8000 is positioned relative to a length of rebar which will form part of a concrete column, including vertical and horizontal columns. (STEP 9002). The length of rebar (e.g., a matrix of rebar) is disposed within a form which will receive concrete to form a reinforced row or column. The apparatus 8000 is manipulated to position the length of rebar within the first and second walls 8022, 8024 of the saddle 8008 and in general alignment with the bolt segment 8026 of the saddle clamp 8010. (STEP 9004). In one illustrative embodiment, the locking plate 8002 may be positioned against the formwork and the saddle 8008 is subjected to a force toward the locking plate 8002. In response thereto, the spring 8032 compresses permitting translation of the saddle 8002 along the anchor 8006 toward the locking plate 8002. In conjunction with this movement, the lip or handle 8024 of the saddle 8008 is positioned beneath the length of rebar. The saddle 8008 is released to engage the length of rebar. The handle 8024 is rotated, e.g., in a clockwise direction to advance the bolt segment 8026 towards the length of rebar (STEP 9006). Rotation of the handle 8024 is continued such that the bolt segment 8026 secures the length of rebar against the inner surface of the second wall 8024 of the saddle 8008. (STEP 9008). The saddle clamp 8010 may be further tightened to ensure the rebar is secured. Securing the saddle 8008 to the rebar, fixes the apparatus 8000 relative to the rebar. (STEP 9010). In this position, the coil spring 8032 normally biases the locking plate 8002 away from the saddle 8008 and against the form wall such that the locking plate 8002 is flush against the form wall. (STEP 9012). The coil spring defines a spring constant to effectively bias and maintain the locking plate 8002 against the form wall.

Figure 51:
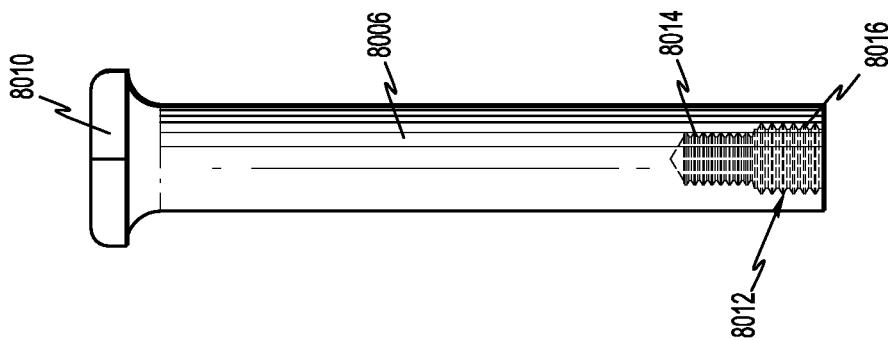
FIG. 51 is a side elevation view of the anchor of the anchor apparatus of FIGS. 49-50.
Figure 50:
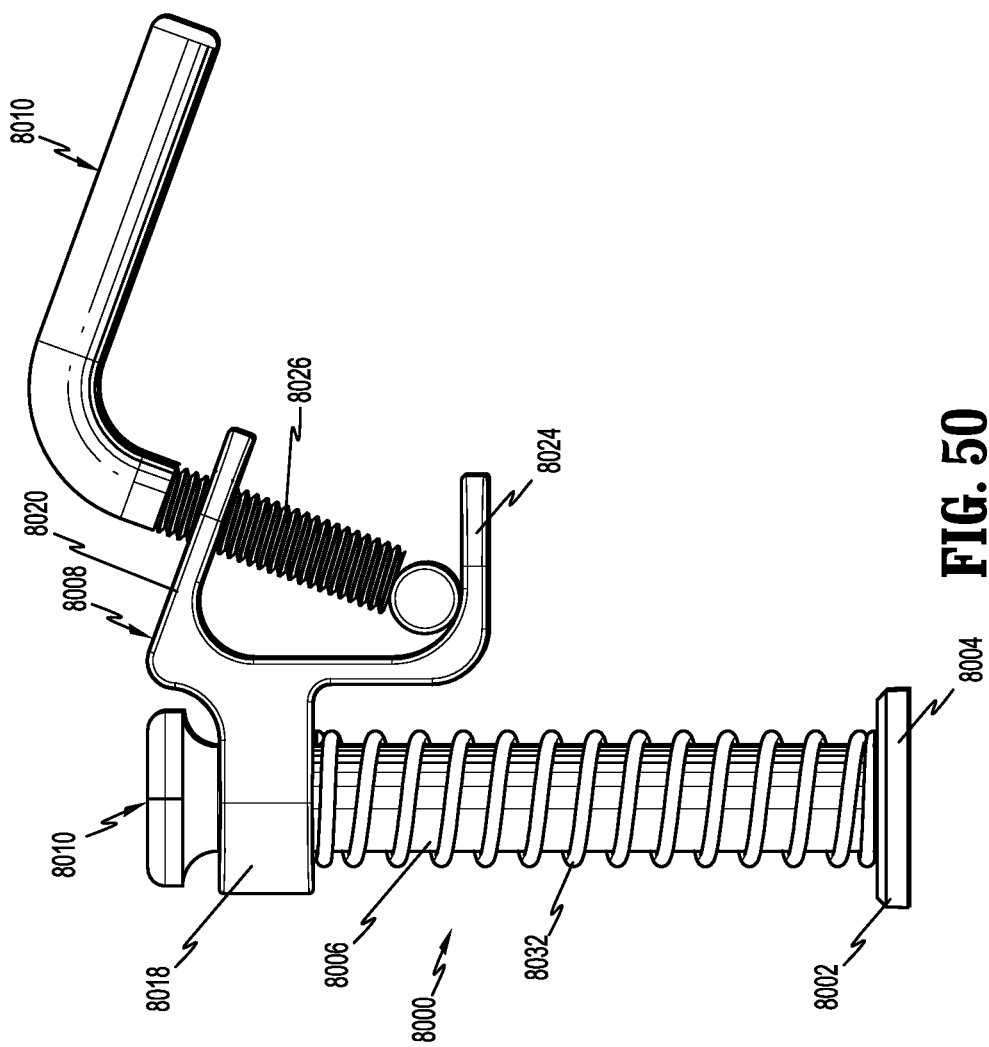
FIG. 50 is a side plan view of the anchor apparatus of FIG. 49.

The process is continued by pouring the concrete into the form and letting it cure to form a column or support (STEP 9014). Once cured, the form is removed (STEP 9016). The locking plate 8002, which is exposed relative to the concrete support, is removed with a suitable tool which couples with the keyed recess 8036 (FIG. 52) of the locking plate 8002. (STEP 9018). Removal of the locking plate 8002 exposes the dual size internal tap or thread 8012 (FIG. 51). In illustrative embodiments, the locking plate 8002 forms a cavity which prevents ingress of cement into the area surrounding the tap or thread 8012. Thereafter, a threaded mount such as the safety hook 300 (described hereinabove), or any other functional element, is threaded to the innermost first internal thread 8014 providing a support or mount to retain any of the construction items discussed hereinabove or a safety hook to facilitate movement of personnel about the construction site. (STEP 9020). As appreciated, many of the safety apparatuses 8000 may be installed about the construction site.

Figure 56:
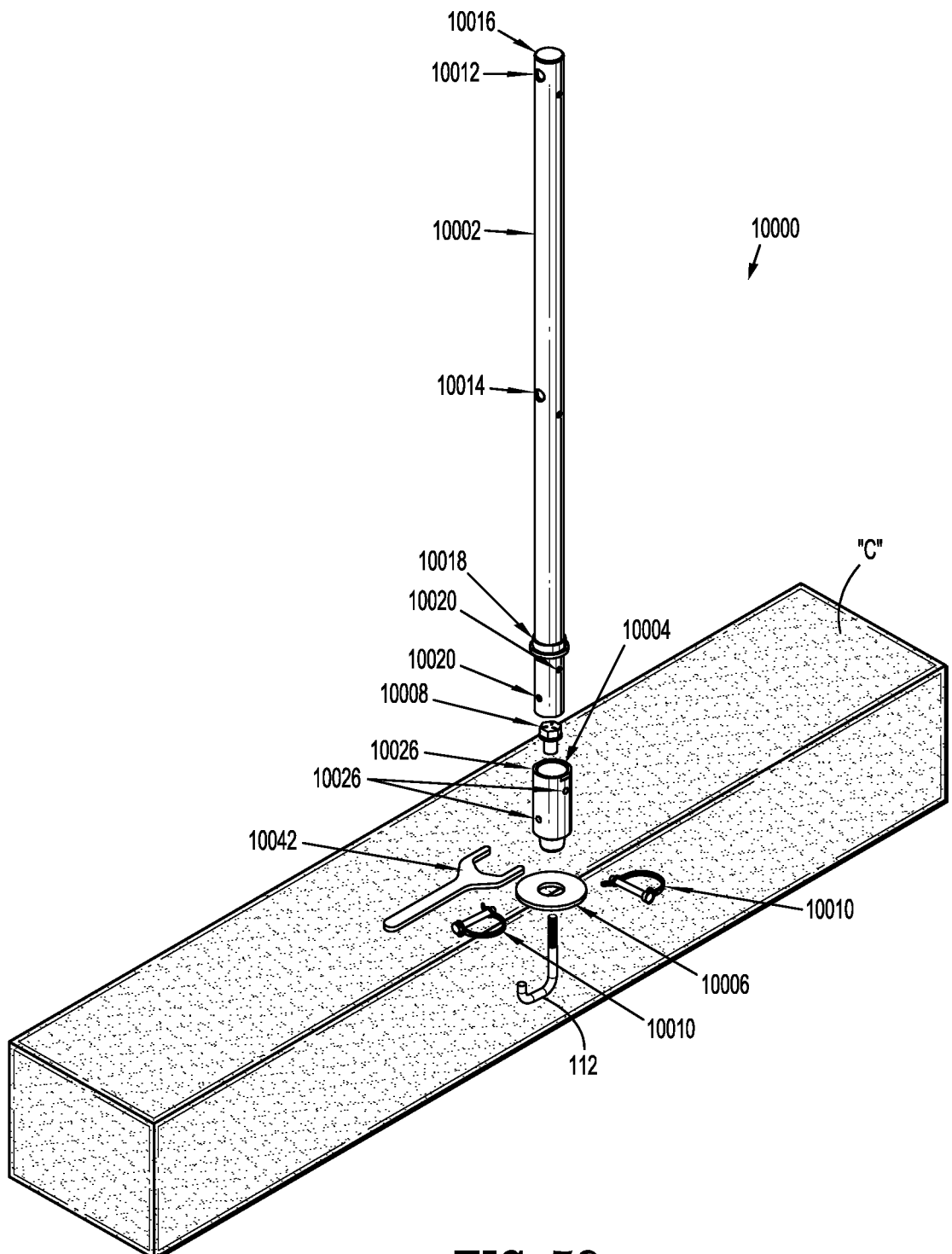
FIG. 56 is a perspective view of another illustrative embodiment of the present disclosure including a safety post apparatus for securement to an anchor apparatus.

Referring no to FIG. 56, there is illustrated another embodiment of the present disclosure. The safety post apparatus 10000 is intended to be secured to the anchor 102 embedded in the cured concrete, specifically, the external thread 114 of the anchor rod 112 accessible inside the cover 104 as described in connection with FIGS. 14-15 hereinabove. The safety post apparatus, in illustrative embodiments, extends upwardly from a support column "c" or member. The safety post apparatus 10000 generally includes an elongated post 10002, a post base 10004, a base plate 10006, a collar nut 10008 for securing the base 10004 to the embedded anchor rod 112 and one or more clevis pins 10010 for securing the post 10002 to the post base 10004.

Figure 57C:
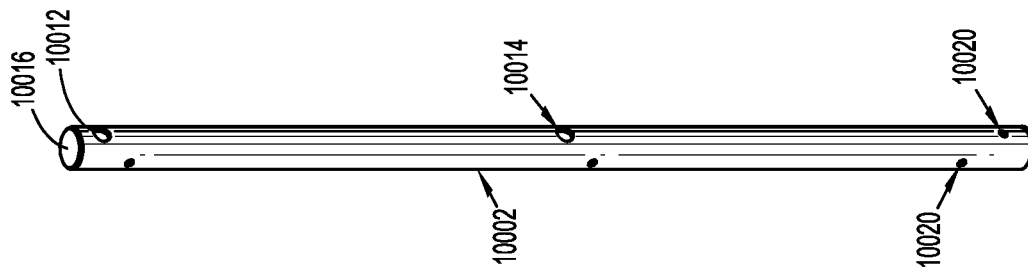
FIGS. 57A-57C are first and second side elevation views and a perspective view respectively of the post of the safety post apparatus of FIG. 56.
Figure 57B:
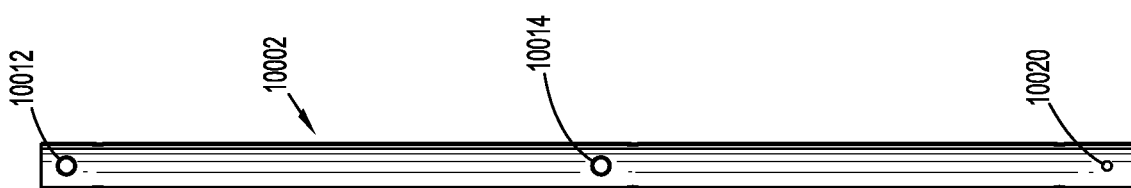
Figure 57A:
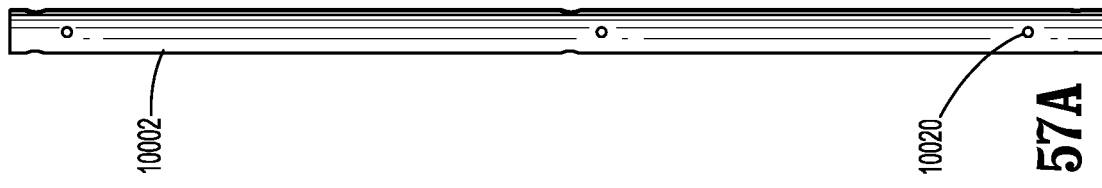
Figure 58B:
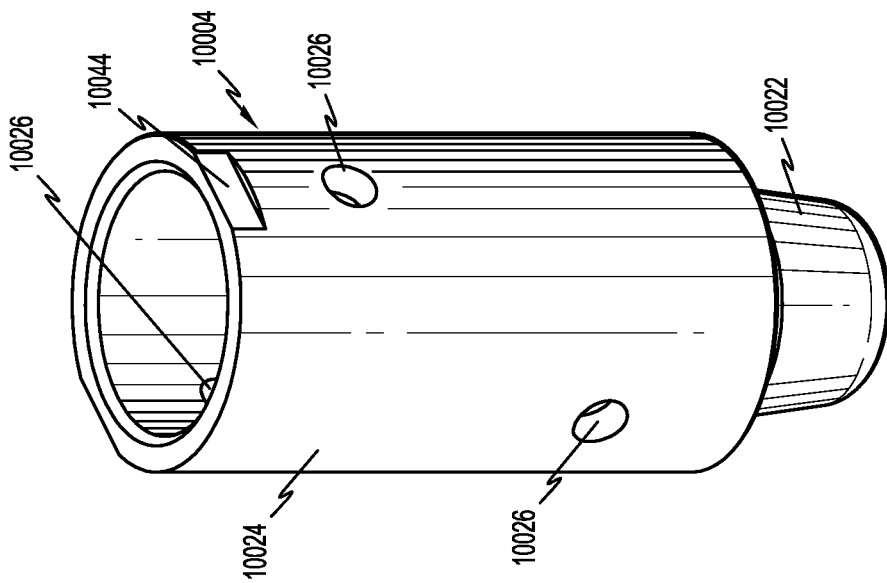
FIGS. 58A-58B are side elevation and perspective views of the post base of the safety post apparatus of FIGS. 56-57C.
Figure 58A:
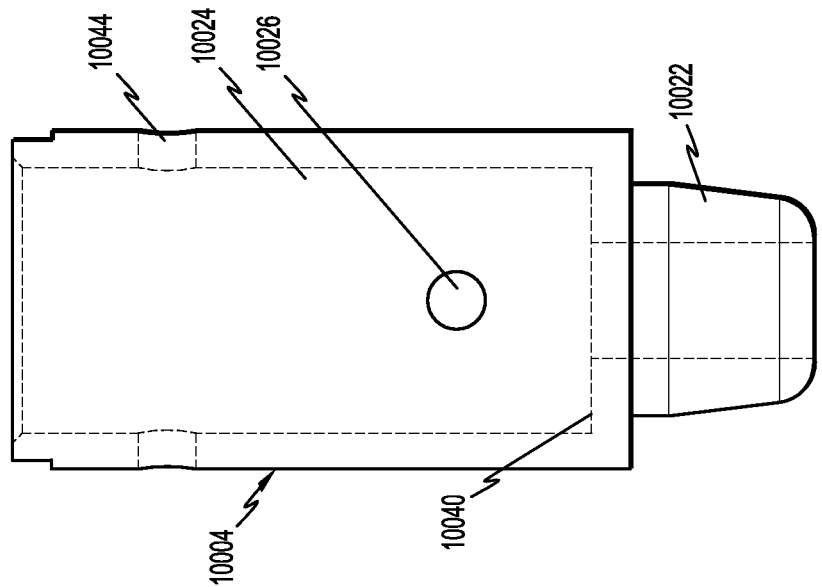
Figure 59C:
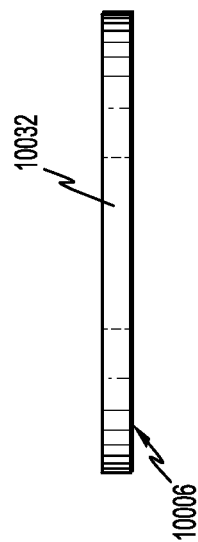
FIGS. 59A-59C are top, perspective and side cross-sectional views of the base plate of the safety post apparatus of FIGS. 56-58B.
Figure 59A:
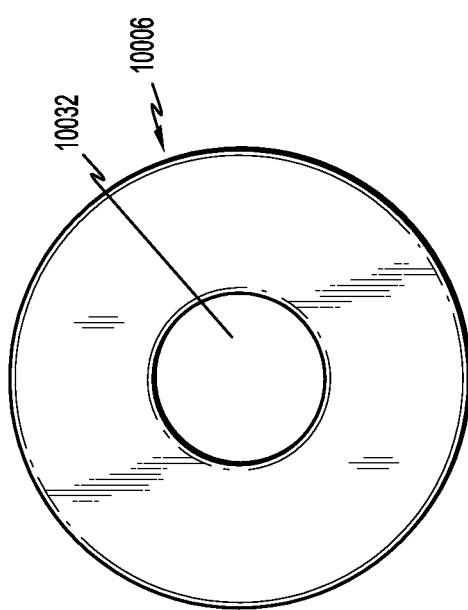
Figure 59B:
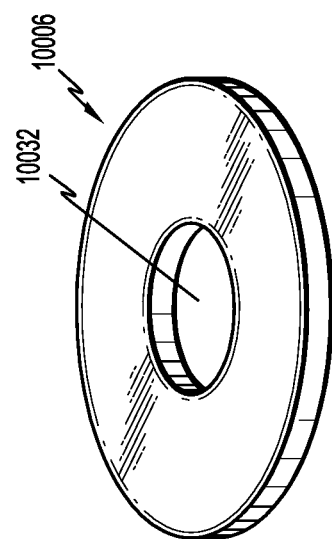

With reference to FIGS. 57A-57C, in conjunction with FIG. 56, the post 10002 includes a pair of holes 10012, 10014 adjacent the top and midsection respectively of the post 10002 for reception of a safety wire, cable or rope which will form part of a safety fence between adjacent posts 10002. The post 10002 may include a post cap 10016 and a post seal 10018 as depicted in FIG. 56. The post 10002 also includes first and second pairs of clevis holes 10020. Referring now to FIGS. 58A-58B, in view of FIG. 56, the post base 10004 includes a narrow insertion section 10022 configured for at least partial insertion into the exposed cover 104 (FIGS. 14-15) and a main section 10024 for reception of the lower end of the post 10002. The post base 10004 includes first and second pairs of clevis holes 10026 which can be aligned with the clevis holes 10020 of the post 10002 for reception of the clevis pins 10010 shown in FIG. 56 to couple the post 10002 to the post base 10004. FIGS. 59A-59C illustrate the base plate 10006. The base plate 10006 is configured for positioning against the cured concrete support or column for stabilization and defines an opening 10032 for reception of the insertion section 10022 of the post base 10004.

FIGS. 60A-60B illustrate the collar nut 10008. The collar nut 10008 is positionable within the post base 10004 and defines a nut head 10034 and a nut shaft 10036. The nut shaft 10036 defines an internal thread 10038 for engaging the external thread 114 of the embedded anchor rod 112 (FIGS. 14-15). The nut head 10034 engages the internal shelf 10040 (FIG. 58A) of the post base 10004 to secure the post base 10004 relative to the anchor rod 112.

With reference again to FIG. 56, the safety post apparatus 10000 is secured relative to the anchor 102 as follows: The base plate 10006 is mated to the post base 10004 by reception of the insertion section 10022 within the opening 10032 of the base plate 10006. The insertion section 10022 of the post base 1004 is introduced within the exposed cover 104 and positioned relative to the external thread 114 of the anchor 102 (FIGS. 14-15). A wrench 10042 depicted in FIG. 56 is positioned within wrench slots 10044 of the post base 10004 (FIGS. 58A-58B) to stabilize the post base 10004. The collar nut 10008 is advanced within the post base 10004, and the collar nut 10008 is threaded onto the exposed external thread 114 of the anchor 102 via threaded engagement of the internal thread 10038 of the collar nut 10008. The lower end of the post 10002 is introduced within the post base 10004, the clevis holes 10020, 10026 of the post 10002 and the post base 1004 are aligned and the clevis pins 10010 are secured within the clevis holes 10020, 10026 thereby securing the post 1002 to the post base 10004 and relative to the embedded anchor 102. The seal 10018 on the post 10002 may engage the post base 10004 to prevent ingress of materials such as liquids, etc. into the post base 10004. The post apparatus 10000 may be a single pole used for securing equipment or as a safety pole to facilitate movement of a worker about a construction site. In illustrative embodiments, the post apparatus 1000 is a component of a safety fence positioned about select portions of the construction site.

Figure 61A:
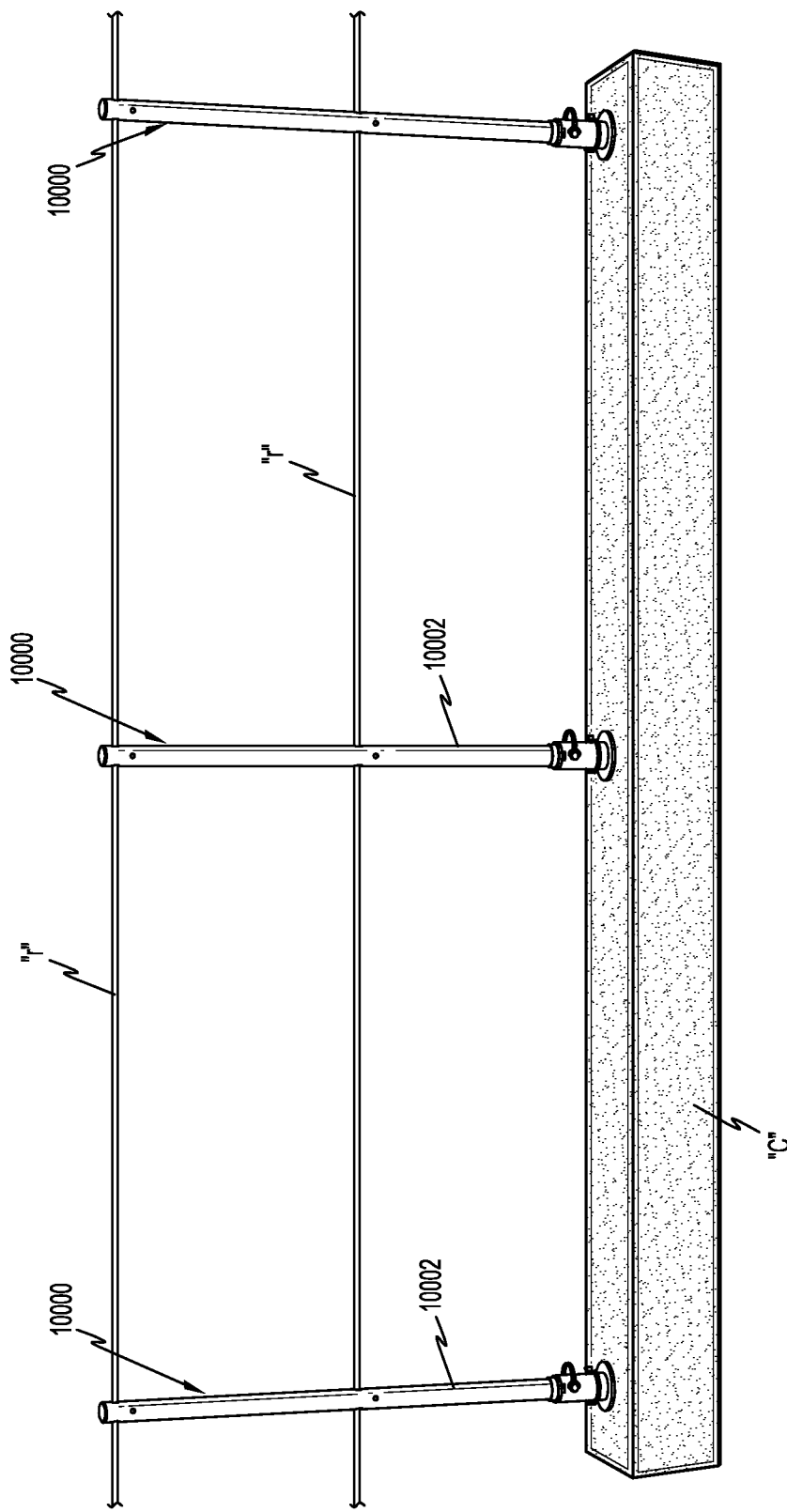

FIG. 61 illustrates use of a plurality of post apparatuses 10000 as a component of a safety fence. In this application, several post apparatuses are mounted to a row of anchor rods embedded in a column or beam "c" in a similar manner to that described hereinabove in connection with FIG. 17 with the exception that the posts 10002 extend upwardly from the beam "c." Rope, for example, metallic wire roper cable "r" is introduced into, and passed through, the pair of holes 10012, 10014 within the top and midsection of the post 10002 thereby forming a wire fence section between adjacent post apparatuses 10000.

Figure 63:
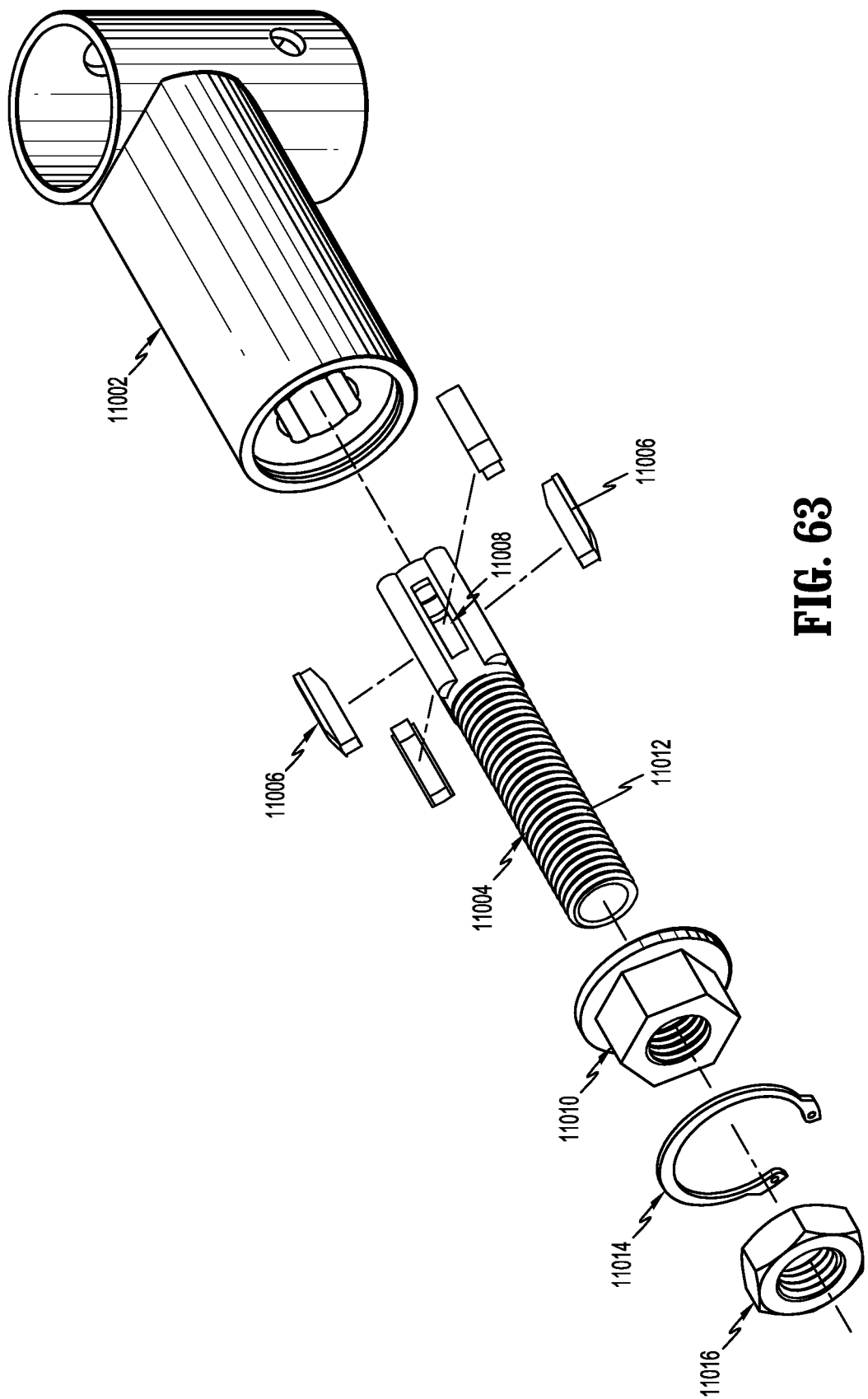
FIG. 63 is an exploded perspective view of the cable tensioner of FIG. 62.

FIGS. 62-63 illustrate an optional accessory for use with the safety fence. In this illustrative embodiment, the rope section may be tensioned via a post tensioner associated with select post apparatuses. In general, the optional wire rope clamping and tensioning device mounts to a vertical post at the wire rope location by a clevis pin at each extreme end of the length of wire rope being used. The wire rope passes through the tensioning mechanism and is simultaneously clamped and tensioned by turning the tensioning nut clockwise until the target tension is achieved. When the wire rope is tensioned, the locknut is then tightened up against the tensioning nut. More specifically, and without limitation, every other aligned post apparatus 10000 may include a post tensioner. The post tensioner receives the ends of the ropes, and has the ability to tension the rope to a targeted level.

FIGS. 62-63 depict an illustrative embodiment of a rope tensioner 11000. The rope tensioner 11000 includes a tensioner housing 11002 which can be secured to a post 10002 of the anchor apparatus through any conventional methodologies. For example, the tensioner housing 11002 may be positioned over the top of the post 10002 and secured with a clevis pin 10010 or the like. A crimp housing 11004 having a pair of crimp tabs 11006 is at least partially disposed in the tensioner housing 11002. The crimp tabs 11006 are positioned within crimp slots 11008 of the crimp housing 11004, and may move radially inwardly to engage the wire rope end "w." In illustrative embodiments, the crimp tabs 11006 may be tapered and engage cooperating structure adjacent the crimp tab slot 11008 or the interior of the tensioner housing 11002 to move radially inwardly in response to, for example, axial movement of the crimp housing 11004 within the tensioner housing 11002. Alternatively, the crimp tabs 11006 can be crimped about the wire rope end "w" with a pair of pliers or the like. The rope tensioner 11000 further includes a tensioner nut 11010 which threadably engages the external thread 11012 of the crimp housing 11004. A retaining ring 11014 and a lock nut 11016 are also provided. In use, multiple post apparatuses are installed to extend upwardly from a support column "c." Wire rope may be passed, for example, through the holes 10012, 10014 of a central post assembly 10000.

After inserting the wire rope "w" through the tensioner housing 11002 and the crimp housing 11004, the tensioner nut 11010 is then turned clockwise. This movement drives the crimp housing 11004 through the tensioner housing 11002 which forces the tapered crimp tabs 11006 to tighten against the wire rope end "w." This simultaneously crimps and applies tension to the wire rope. Further rotation of the tensioner nut 11010 increases the tension on the wire rope "w." Once the desired tension is achieved the retainer ring 11014 is applied and the lock nut 11016 is tightened against the tensioner nut 11010 to secure the assembly.

Figure 65:
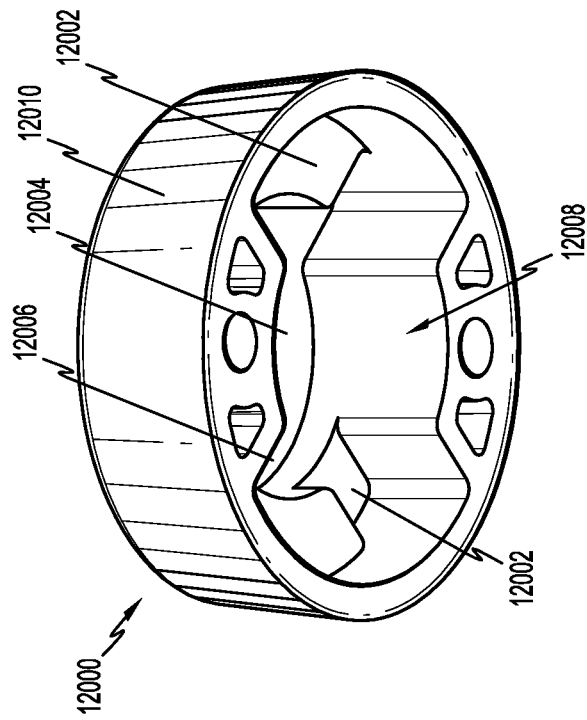
FIGS. 64-65 are bottom plan and perspective views respectively of another illustrative embodiment of a locking plate for use with the anchor apparatus.
Figure 64:
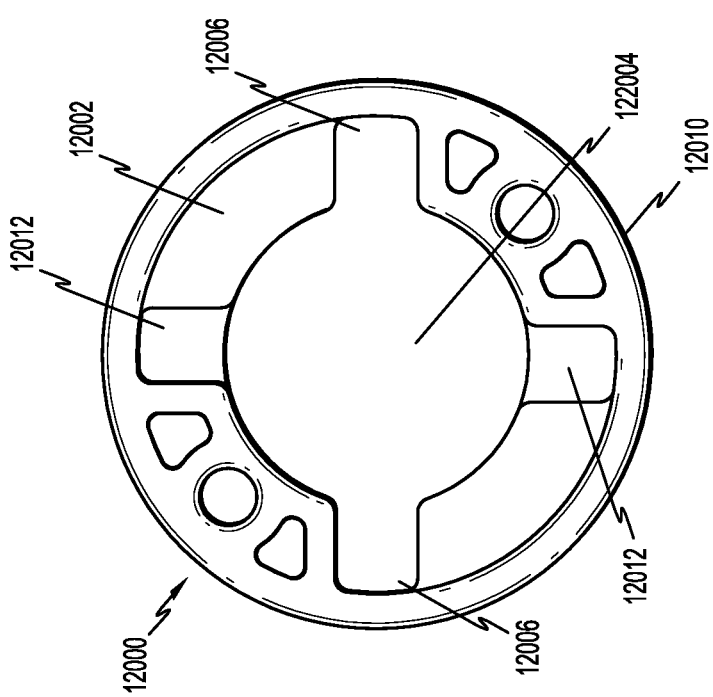

FIGS. 64-65 illustrate another embodiment of an alternate locking plate 12000 for use with the apparatus of the present disclosure. The locking plate 12000 is similar to the locking plate 104 described in connection with the embodiment of FIGS. 1-17, and reference is made to the discussion hereinabove for a discussion of common features. The locking plate 12000 defines a plate segment 12002 having a central plate aperture 12004 and at least one keyed slot 12006, e.g., two diametrically opposed keyed slots 12006, each communicating with the central plate aperture 12004. The locking plate 12000 defines an underlying interior space 12008 at least partially confined within the outer wall 12010 or boundary of the locking plate 12000 beneath the plate segment 12002. Opposed positioning notches 12012 are disposed within the interior space and extend into the underside of the locking plate 12000. The positioning notches 12012 are disposed in general opposed relation, e.g., diametrical opposed relation. The positioning notches 12012 are radially or angularly offset relative to the keyed slots 12006. In one illustrative embodiment, the positioning notches 12012 are offset relative to the keyed slots 12006 at an angle ranging from 30° to about 90°. In illustrative embodiments, a 90° offset is selected. The positioning notches 12012 are dimensioned to receive the diametrically opposed wings 138 of the coupler 106 upon rotation of the coupler 106 relative to the locking plate 12000 in the manner discussed hereinabove in connection with the embodiment of FIGS. 1-17.

Figure 67:
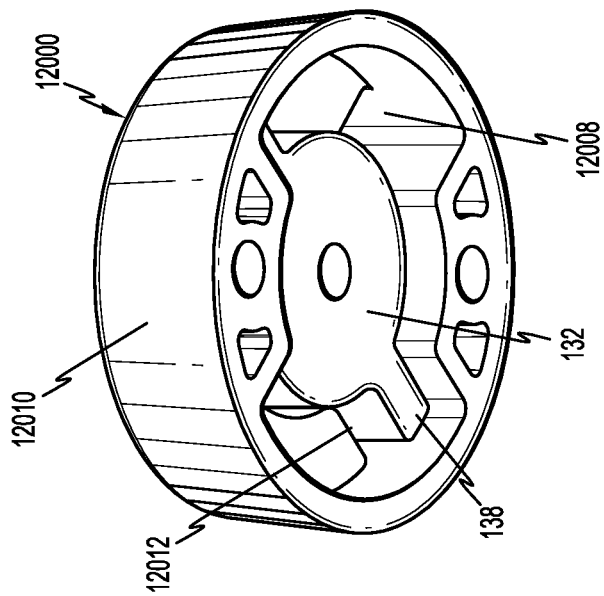
FIGS. 66-67 are bottom plan and perspective views illustrating a coupler secured relative to the locking plate of FIGS. 64-65.
Figure 66:
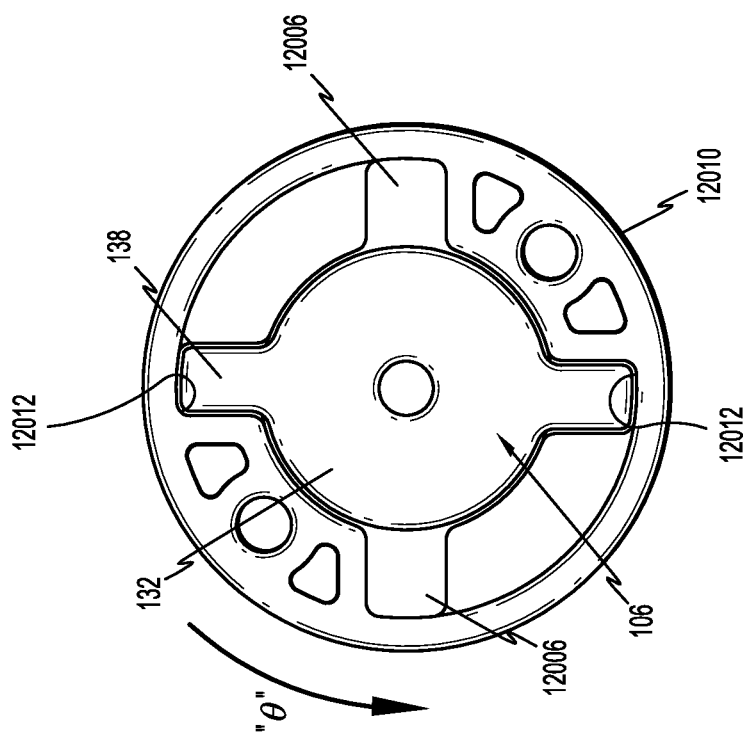

More specifically, with reference to FIGS. 66-67, in conjunction with FIGS. 8, 8A and 9, the central coupler segment 132 of the coupler 106 and the wings 138 are cooperatively dimensioned to be respectively received within the central plate aperture 12004 and the keyed slots 12006 of the locking plate 12000 corresponding to a first relative rotational orientation of the coupler 106 and the locking plate 104. Thereafter, the coupler 106 is rotated through a predetermined angular sector of rotation via rotation of the handle 110 of the anchor 102 in the direction of directional arrows "o" to a second relative rotational orientation of the coupler 106 and the locking plate 1200 whereby the wings 138 of the coupler 106 are displaced from the keyed slots 12006 and are received within the positioning notches 12012 within the underside of the plate segment 12002 as depicted in FIGS. 66-67. The positioning notches 12012 maintain the wings 138 of the coupler 106 secured in the second relative rotational orientation. In illustrative embodiments, the wings of the coupler 138 and the positioning notches 12012 are correspondingly dimensioned such that the wings 138 snap into the positioning notches 12012. Moreover, this arrangement facilitates retention of the coupler 138 and, thus, the mounted anchor 102 relative to the locking plate 12000 and the form board before, during and subsequent to pouring of the concrete within the formwork.

In illustrative embodiments, the present disclosure is directed to a method comprising generating a building model of a building to be constructed at a construction site, identifying within the building model positional locations for installation of one or more anchor apparatuses within structural elements of the building model, transmitting the building model to a portable computing device at the construction site and identifying the location of the portable computing device to a given positional location. At least the generating, identifying, transmitting and identifying steps are implemented via at least one processing device comprising a processor and a memory. The method may include installing one anchor apparatus at the given positional location. The method may further include identifying the location of a second given positional location and further including installing one anchor apparatus at the given positional location. The structural elements may include at least one of beams, columns, girders, floors and ceilings. The structural elements may include concrete or cement, e.g., initially poured concrete. Generating a model may include utilizing a building information modeling module of a server. The method may further include utilizing a portable computing device at the construction site to assist an operator to identify the corresponding positional locations of the building. Identifying within the building model positional locations may include utilizing a positional indicator module within the portable computing device to indicate a location of the portable computing device relative to a given positional location on the model. Utilizing the positional indicator may include utilizing at least one component or sensor of the portable computing device to assist in identifying the location of the portable computing device relative to the given positional location. Utilizing at least one component or sensor of the portable computing device may include receiving feedback from one or more of WIFI, Bluetooth, a camera, a GPS sensor, a gyroscope, a magnetometer, an accelerometer, a proximity sensor or an RFID sensor of the personal computing device. The method may further include scanning visual indicia data on the one or more anchoring apparatuses to ascertain information pertaining to an attribute of manufacture of the one or more anchoring apparatuses or an attribute of installation of the one or more anchoring apparatuses. The method may further include transmitting the visual indicia data to one of the portable computing device or a server associated with the portable computing device. The attribute of manufacture may include at least one of manufacture, distributer, lot or model of the one or more anchoring apparatuses. The attribute of installation may include at least one of installer, installation date or supervisor. Scanning visual indicia data may include utilizing the RFID sensor of the personal computing device to can RFID tags on components of the one or more anchor apparatuses.

In other illustrative embodiments, a computer program product including a non-transitory computer-readable storage medium encoded with computer program code that, when executed on a processor of a computer, causes the computer to implement the steps of the present disclosure.

In other illustrative embodiments, a system comprises one or more processors operatively coupled to one or more memories configured to: generate a building model of a building to be constructed at a construction site; identify within the building model positional locations for installation of one or more anchor apparatuses within structural elements of the building model; transmit the building model to a portable computing device at the construction site; and identify the location of the portable computing device to a given positional location.

In other illustrative embodiments, an anchoring system for installation in a concrete support, comprises at least one anchoring apparatus, including a locking plate configured for securement relative to a form board used to form a concrete support, an elongate anchor including a connector segment at one end for connecting with a construction tool, a coupler mounted to the elongate anchor, the coupler manipulable to be coupled to the locking plate to at least partially secure the elongate anchor to the locking plate and a cover mounted about the elongate anchor and movable for positioning over the coupler and the locking plate. The coupler may define a central opening configured to at least partially receive the connector segment of the elongate anchor, and wherein the coupler and the connecting segment include cooperating structure to releasably secure the coupler and the elongate anchor. The coupler may define an internal thread at least partially circumscribing the opening and wherein the connector segment of the anchor includes an external thread configured to threadably engage with the internal thread of the couple to releasably secure the coupler and the elongate anchor. The locking plate and the coupler may include cooperating structure configured to secure the coupler to the locking plate. The locking plate may define a plate aperture and at least one keyed slot adjacent the plate aperture and the coupler may include a central segment defining the coupler opening and at least one wing depending from the central segment, whereby the central segment and the at least one wing respectively receivable within the plate aperture and the at least one keyed slot of the locking plate when in a first rotational orientation of the coupler and the locking plate, and whereby relative rotational movement of the coupler and the locking plate to a second rotational orientation thereof at least partially secures the coupler to the locking plate. The locking plate may define two opposed keyed slots and wherein the coupler includes two opposed wings correspondingly dimensioned to be received within the two opposed keyed slots when in the first rotational orientation of the coupler and the locking plate. The cover may define a cover passage for reception of the elongate anchor. The cover may further define an inner thread circumscribing the cover passage, the inner thread configured to cooperate with the external thread of the elongate anchor to advance the cover relative to the elongate anchor. The locking plate may include at least on fastener opening configured to receive a fastener for securing the locking plate to the form board. The anchoring system may include a plurality of anchor apparatuses.

In other illustrative embodiments, a method of construction, comprises anchoring at least one anchor apparatus to a form utilized to create a concrete support structure, including: securing a locking plate of the at least one anchor apparatus to a board of the form; coupling an elongate anchor of the at least one anchor apparatus to the locking plate, the elongate anchor including an external thread; advancing a cover of the at least one anchor apparatus along the elongate anchor for positioning against the board; depositing concrete within the form to create the concrete support structure whereby the cover isolates at least a portion of the external thread of the elongate anchor from the concrete and removing the board to at least partially expose the cover and the at least the portion of the external thread of the elongate anchor. Depositing concrete may include establishing an isolated internal cavity within the cover with the at least the portion of the external thread of the anchor extending within the internal cavity. Coupling the elongate anchor may include mounting a coupler of the at least one anchor apparatus about the external thread of the elongate anchor and connecting the coupler to the locking plate. The coupler may include an internal thread and wherein mounting the coupler includes threadably engaging the coupler with the external thread of the anchor. The locking plate may define a plate aperture and at least one keyed slot adjacent the plate aperture and the coupler may include a central segment defining the coupler opening and at least one wing depending from the central segment and further including positioning the central segment and the at least one wing respectively within the plate aperture and the at least one keyed slot of the locking plate and rotating the coupler to secure the coupler and the anchor relative to the locking plate. The cover may define a cover passage with an internal thread and wherein advancing the cover includes threadably coupling the internal thread of the cover with the external thread of the elongate anchor. The method may further include attaching a tool relative to the at least a portion of the external thread of the anchor subsequent to removing the board. The tool may include a threaded segment and wherein attaching the tool includes threadably coupling the tool with the portion of the external thread of the anchor. The method may further include supporting construction equipment with the tool. The method may also include anchoring a plurality of anchor apparatuses to the form. The tool may be an anchor clamp.

In other illustrative embodiments, an anchoring system for installation in a concrete support, which comprises at least one anchoring apparatus, including a locking plate configured for securement relative to a form board used to form a concrete support, an elongate anchor including a connector segment at one end for connecting with a construction tool, a coupler mounted to the elongate anchor and being manipulable to be coupled to the locking plate to at least partially secure the elongate anchor to the locking plate, a cover mounted about the elongate anchor and movable for positioning over the coupler and the locking plate and an anchor clamp engageable with the connector segment of the elongate anchor.

It is to be appreciated that combinations of the different implementation environments are contemplated as being within the scope of embodiments of the invention. One of ordinary skill in the art will realize alternative implementations given the illustrative teachings provided herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. Additionally, the terms "comprises" and/or "comprising," as used herein, specify the presence of stated values, features, steps, operations, modules, elements, and/or components, but do not preclude the presence or addition of another value, feature, step, operation, module, element, component, and/or group thereof.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments.

The term construction site is not limited to commercial and residential buildings but includes all sites subject to buildings, repair, maintenance, etc. Such sites include but are not limited to commercial and residential buildings, tunnels, bridges, stadiums, schools, exterior façade systems, all precast concrete products and rigging points. The anchor apparatus may be installed horizontally, vertically and/or any other orientation encountered during construction at a construction site, and all wet cast applications.

Although the illustrative embodiments of the present disclosure have been described herein with reference to the accompanying drawings, the above description, disclosure, and figures should not be construed as limiting, but merely as exemplifications of particular embodiments. It is to be understood, therefore, that the disclosure is not limited to those precise embodiments, and that various other changes and modifications may be effected therein by one skilled in the art without departing from the scope or spirit of the disclosure. For example, although threaded couplings are illustrated for connecting or coupling some of the components, it is envisioned that any corresponding structure may be substituted such as bayonet couplings, snap fits, tongue-groove arrangements etc.

What is claimed is:

1. A method, comprising:
    utilizing at least one anchor apparatus with a form configured to create a concrete support structure, including:
        securing a locking component to a board of the form, the locking component defining a locking aperture and at least one keyed slot adjacent the locking aperture;
        positioning a coupler about an elongate anchor, the coupler including a central segment defining a threaded coupler opening and at least one wing depending from the central segment;
        coupling the elongate anchor with the coupler by threadably engaging the threaded coupler opening of the coupler with an external thread of the elongate anchor;
        connecting the coupler to the locking component by positioning the central segment and the at least one wing respectively within the locking aperture and the at least one keyed slot of the locking component and rotating the coupler to secure the coupler and the elongate anchor relative to the locking component;
        positioning a cover over the elongate anchor and advancing the cover over the locking component;
        depositing concrete within the form to create the concrete support structure; and
        removing the board to at least partially expose the cover.

2. The method according to claim 1 further including establishing an isolated internal cavity within the cover with at least a portion of the external thread of the elongate anchor extending within the internal cavity.

3. The method according to claim 2 wherein the cover defines a passage with an internal thread and further including:
    advancing the cover along the elongate anchor for positioning against the board by threadably coupling the internal thread of the cover with the external thread of the elongate anchor.

4. The method according to claim 2 further including attaching a tool relative to the external thread of the elongate anchor subsequent to removing the board.

5. The method according to claim 4 wherein the tool includes a threaded segment and wherein attaching the tool includes threadably coupling the tool with the portion of the external thread of the elongate anchor.

6. The method according to claim 5 including supporting construction equipment with the tool.

7. The method according to claim 1 wherein securing the locking component includes advancing a fastener into the board of the form.

8. The method according to claim 7 wherein securing the locking component includes operatively coupling the fastener relative to the locking component.

9. The method according to claim 7 wherein securing the fastener includes advancing the fastener through an aperture of the locking component.

10. The method according to claim 1 including removing the cover from the concrete support structure.

11. The method according to claim 1 wherein the locking component defines two opposed keyed slots and the coupler includes two opposed wings wherein connecting the coupler to the locking component includes positioning the central segment and the two opposed wings respectively within the locking aperture and the two opposed keyed slots and rotating the coupler relative to the locking component to secure the coupler and the elongate anchor relative to the locking component.

12. A method, comprising:
    securing a locking plate to a board of a form utilized to form a concrete support structure, the locking plate defining a plate aperture and at least one keyed slot adjacent the plate aperture;
    coupling a coupler to an elongate anchor, the coupler including a central segment and at least one wing depending from the central segment;
    connecting the coupler to the locking plate by positioning the central segment and the at least one wing respectively within the plate aperture and the at least one keyed slot of the locking plate and rotating the coupler;
    positioning a cover over the elongate anchor and advancing the cover over the locking plate;
    depositing concrete within the form to create the concrete support structure; and
    removing the board to at least partially expose the cover and a portion of the elongate anchor.

13. The method according to claim 12 including attaching a tool to the elongate anchor subsequent to removal of the board.

14. The method according to claim 13 wherein the elongate anchor includes a threaded portion, and wherein attaching the tool includes threadably engaging the tool with the threaded portion of the elongate anchor.

15. The method according to claim 12 wherein the central segment of the coupler includes a threaded portion and wherein the elongate anchor includes a threaded portion, and wherein coupling the coupler to the elongate anchor includes cooperative threading the threaded portion of the coupler with the threaded portion of the elongate anchor.

16. The method according to claim 12 further including establishing an isolated internal cavity within the cover.

17. The method according to claim 12 wherein the cover defines a passage with a threaded portion and the elongate anchor defines a threaded portion and, further including:
- positioning the elongate anchor within the passage and advancing the cover along the elongate anchor through cooperation of the threaded portion of the cover with the threaded portion of the elongate anchor.

18. The method according to claim 12 wherein the locking plate defines two opposed keyed slots and the coupler includes two opposed wings wherein connecting the coupler to the locking plate includes positioning the central segment and the two opposed wings respectively within the plate aperture and the two opposed keyed slots, and rotating the coupler relative to the locking plate to secure the coupler and the elongate anchor relative to the locking plate.

* * * * *